United States Patent
Emrick et al.

(10) Patent No.: US 10,147,553 B2
(45) Date of Patent: Dec. 4, 2018

(54) HYDROPHILIC CONJUGATED POLYMERS, AND METHODS OF PREPARATION AND USE THEREOF

(71) Applicant: University of Massachusetts, Boston, MA (US)

(72) Inventors: Todd Emrick, South Deerfield, MA (US); Zachariah A. Page, Sunderland, MA (US); Yao Liu, Amherst, MA (US); Thomas P. Russell, Amherst, MA (US)

(73) Assignee: University of Massachusetts, Boston, MA (US)

( * ) Notice: Subject to any disclaimer, the term of this patent is extended or adjusted under 35 U.S.C. 154(b) by 0 days.

(21) Appl. No.: 15/457,971

(22) Filed: Mar. 13, 2017

(65) Prior Publication Data

US 2017/0263385 A1    Sep. 14, 2017

Related U.S. Application Data

(60) Provisional application No. 62/308,147, filed on Mar. 14, 2016.

(51) Int. Cl.
| | |
|---|---|
| *C08G 75/00* | (2006.01) |
| *H01G 9/20* | (2006.01) |
| *H01L 51/00* | (2006.01) |
| *C08G 61/02* | (2006.01) |
| *C08G 61/12* | (2006.01) |

(52) U.S. Cl.
CPC ........... *H01G 9/2009* (2013.01); *C08G 61/02* (2013.01); *C08G 61/123* (2013.01); *H01L 51/0035* (2013.01); *H01L 51/0036* (2013.01); *H01L 51/0037* (2013.01); *H01L 51/0038* (2013.01); *H01L 51/0043* (2013.01); *H01L 51/0046* (2013.01); *H01L 51/0047* (2013.01); *H01L 51/0077* (2013.01); *C08G 2261/124* (2013.01); *C08G 2261/146* (2013.01); *C08G 2261/1424* (2013.01); *C08G 2261/18* (2013.01); *C08G 2261/228* (2013.01); *C08G 2261/312* (2013.01); *C08G 2261/3246* (2013.01); *C08G 2261/3327* (2013.01); *C08G 2261/344* (2013.01); *C08G 2261/3422* (2013.01); *C08G 2261/91* (2013.01)

(58) Field of Classification Search
CPC ..... C08G 75/24; C08G 75/06; H01L 51/0002; H01L 51/0036; H01L 51/0039; H01L 51/0043; H01L 51/4253; H01L 51/0047
See application file for complete search history.

(56) References Cited

PUBLICATIONS

Kim et al. Synthetic Metals 211 (2016) 25-29.*

\* cited by examiner

*Primary Examiner* — Shane Fang
(74) *Attorney, Agent, or Firm* — Milstein Zhang & Wu LLC

(57) ABSTRACT

The invention provides novel hydrophilic conjugated polymers, e.g., hydrophilic poly(arylene vinylenes) or PAVs, and preparation thereof, and methods and devices for their application in photovoltaics, and the resulting improved solar cells.

20 Claims, 36 Drawing Sheets

HYDROPHILIC CONJUGATED POLYMERS, AND METHODS OF PREPARATION AND USE THEREOF

PRIORITY CLAIMS AND RELATED PATENT APPLICATIONS

This application claims the benefit of priority from U.S. Provisional Application Ser. No. 62/308,147, filed on Mar. 14, 2016, the entire content of which is incorporated herein by reference in its entirety.

STATEMENT REGARDING FEDERALLY FUNDED RESEARCH OR DEVELOPMENT

This invention was made with government support under Grant/Contract No. NSF-CHE 1152360 from the National Science Foundation, Grant/Contract No. DMR-0820506 from the NSF-funded MRSEC, Grant/Contract No. DE-SC0001087 from the U.S. Department of Energy, and ONR N00014-15-1-2244 from the Office of Naval Research. The government has certain rights in the invention.

TECHNICAL FIELDS OF THE INVENTION

The invention generally relates to polymeric materials and methods for their preparation and use. More particularly, the invention relates to novel hydrophilic conjugated polymers, e.g., hydrophilic poly(arylene vinylenes), and preparation thereof, and methods and devices for their applications in photovoltaics (e.g., solar cells).

BACKGROUND OF THE INVENTION

Hydrophilic conjugated polymers are of growing interest as organic field effect transistors (OFETs), light-emitting diodes (OLEDs), photovoltaics (OPVs) and sensors. For example, conjugated polyelectrolytes (CPEs) and conjugated polyzwitterions (CPZs) integrate polar functionality pendent to conjugated aromatic backbones. Researchers have identified the utility of CPEs in optoelectronic and sensing applications and recent syntheses of CPZs show promise for producing polar, charge-neutral (counterion-free) electronically active materials for devices. (Hu, et al. *Chem. Commun.* 2015, 51, 5572-5585; Duarte, et al. *Chem. Mater.* 2011, 23 (3), 501-515; Jiang, et al. *Angew. Chem. Int. Ed.* 2009, 48 (24), 4300-4316; Duan, et al. *Adv. Mater.* 2011, 23, 1665-1669; Duan, et al. *Chem. Sci.* 2013, 4 (3), 1298-1307; Fang, et al. *J. Am. Chem. Soc.* 2011, 133 (4), 683-685; Kumar, et al. *Energy Environ. Sci.* 2013, 6 (5), 1589-1596; Page, et al. *Macromolecules* 2013, 46 (2), 344-351; Liu, et al. *Adv. Mater.* 2013, 25, 6868-6873; Page, et al. *Chem. Sci.* 2014, 5, 2368-2373; Page, et al. *J. Polym. Sci., Part A Polym. Chem.* 2015, 53 (2), 327-336.)

In poly(arylene-vinylene)s (PAVs), the vinylene linkages planarize the polymer backbone by removing torsional interactions between aryl rings, thus extending conjugation and tuning the band gap. Rotational flexibility about the vinyl group imparts solubility and solution processing. (Burroughes, et al. *Nature* 1990, 347 (11), 539-541; Grimsdale, et al. *Chem. Rev.* 2009, 109 (3), 897-1091; Feng, et al. *Adv. Mater.* 2008, 20 (14), 2684-2689.)

PAVs are currently synthesized from appropriate polymer precursors, or directly by polymerization of suitable monomers. The precursor routes begin by polymerization of quinodimethane monomers, followed by post-polymerization elimination to generate the conjugated structure. (Junkers, et al. *Polym. Chem.* 2012, 3 (2), 275-285.) These routes often generate structural defects, such as triple bonds and products of incomplete elimination. Direct routes to PAVs include transition-metal catalyzed polymerizations (i.e., Heck and Stille couplings), metathesis polymerizations, and transition-metal free polymerizations. (Buchmeiser *Adv. Polym. Sci.* 2005, 176, 89-119; Cho, et al. *Adv. Mater.* 1997, 9 (4), 326-328; Greenham, et al. *Nature* 1993, 365, 628-630; Pfeiffer, et al. *Synt. Met.* 1999, 101, 109-110; Pfeiffer, et al. *Macromol. Chem. Phys.* 1999, 200, 1870-1878; Synthesis and Properties of Poly(arylene vinylene)s, chapter 4. In: *Handbook of Conducting Polymers*. 3rd ed. Skotheim, T. A., Reynolds, J. R., Eds.; Taylor & Francis Group, LLC, 2007; pp 1-6.)

Horner-Wadsworth-Emmons (HWE) coupling represents a simple and effective approach to PAVs, giving reasonably high molecular weight and defect-free polymers, with a high degree of trans-olefins, without the need for metals or catalysts. Current PAV production by HWE coupling is typically performed in organic solvents using electron-rich monomers and strongly basic conditions. (Drury, et al. *J. Mater. Chem.* 2003, 13 (3), 485-490; Anuragudom, et al. *Polym. Int.* 2011, 60 (4), 660-665; Laughlin, et al. *Macromolecules* 2010, 43 (8), 3744-3749; Auragudom, et al. *J. Polym. Res.* 2009, 17 (3), 347-353; Anuragudom, et al. *Macromolecules* 2006, 39, 3494-3499; Davey, et al. *Synt. Met.* 1999, 103, 2478-2479.)

Inverted perovskite solar cells have gained widespread attention for their excellent compatibility with well-developed organic photovoltaic fabrication procedures. Replacing PEDOT:PSS with conjugated polyelectrolytes has afforded improved device performance and stability. (Meng, et al. *Accounts. Chem. Res.* 2015, 10.1021/acs.accounts.5b00404; Wu, et al. *Energy & Environmental Science* 2015, 8, 2725; Zuo, et al. *Adv. Mater.* 2014, 26, 6454; Malinkiewicz, et al. *Nat. Photon.* 2014, 8, 128; Etgar, et al. *J. Am. Chem. Soc.* 2012, 134, 17396; Liu, et al. *Nature* 2013, 501, 395; Jeng, et al. *Adv. Mater.* 2013, 25, 3727.)

In comparison with the fabrication of mesoscopic or titanium dioxide based planar perovskite solar cells that usually require high-temperature (above 450° C.) treatment, inverted perovskite solar cells are more compatible with well-established solution-based, low temperature, roll-to-roll fabrication procedures similarly used for the production of organic solar cells. (Song, et al. *Journal of Materials Chemistry A* 2015, 3, 9032; Docampo, P et al. *Nat. Commun.* 2013, 4; You, et al. *ACS Nano* 2014, 8, 1674.)

Recent progress in the optimization of perovskite film morphology on poly(3,4-ethylenedioxythiophene): poly (styrenesulfonic acid) (PEDOT:PSS) coated substrates has permitted inverted perovskite solar cells to achieve power conversion efficiencies (PCEs) >18%, which is approaching the record PCE of 20.1% obtained by their mesoscopic counterparts. (Heo, et al. *Energy & Environmental Science* 2015, 10.1039/C5EE00120J; Yang, et al. *Science* 2015, 348, 1234; Nie, et al. *Science* 2015, 347, 522.) Particularly, inverted perovskite/fullerene planar heterojunction solar cells have been shown to be effective at eliminating or suppressing the notorious photocurrent hysteresis often associated with perovskite solar cells. (Shao, et al. *Nat. Commun.* 2014, 5; Xu, et al. *Nat. Commun.* 2015, 6.)

In an inverted architecture, the perovskite film was deposited on top of a hole extraction layer (HEL), where PEDOT:PSS has been the primary material used. However, the acidic nature of PEDOT:PSS is detrimental to device performance and stability. Several solution processable inorganic materials, such as vanadium oxide ($V_2O_5$), nickel oxide ($NiO_x$), and copper iodide (CuI), were developed as alternatives to PEDOT:PSS in inverted perovskite solar cells for efficient hole extraction. (Docampo, P et al. *Nat. Commun.* 2013, 4; Jørgensen, et al. *Sol. Energ. Mat. Sol. C.* 2008, 92, 686; Zhu, et al. *Angewandte Chemie* 2014, 126, 12779; Wang, et al. *Scientific Reports* 2014, 4, 4756; Yin, et al. *Journal of Materials Chemistry A* 2015, 10.1039/C5TA08193A; Chen, et al. *Journal of Materials Chemistry A* 2015, 3, 19353.) However, their processing methods are not as straightforward and simple as PEDOT:PSS. For example, $V_2O_5$ needs high temperature annealing, $NiO_X$ requires doping or high temperature annealing to afford high device performance, and organic volatile solvents (e.g., acetonitrile) are used to prepare CuI films.

Organic hole extraction materials have emerged as promising alternatives to PEDOT:PSS. (Malinkiewicz, et al. *Nat. Photon.* 2014, 8, 128; Malinkiewicz, et al. *Adv. Energy Mater.* 2014, 4, n/a; Lin, et al. *Advanced Materials Interfaces* 2015, 10.1002/admi.201500420n/a.) For example, Choi et al. reported a water/methanol-processed polyelectrolyte as a hole extraction material in inverted perovskite solar cells, only affording a maximum PCE of 12.5%. (Choi, et al. *Nat. Commun.* 2015, 6.) Li et al. developed a water-soluble polyelectrolyte for inverted perovskite solar cells, yet thermal annealing at 140° C. was a prerequisite HEL processing step. (Li, et al. *Journal of Materials Chemistry A* 2015, 3, 15024.) Although these organic hole extraction materials afford better device performance than their PEDOT:PSS counterpart, a full understanding of polyelectrolytes for hole extraction in inverted perovskite solar cells is lacking.

Accordingly, there remains an urgent, on-going need for novel hydrophilic conjugated polymers and improved hole-extraction materials, along with practical and efficient synthetic methods, that provide improved design of polymer-based solar cells and superior performances.

SUMMARY OF THE INVENTION

The invention provides novel hydrophilic conjugated polymers, e.g., hydrophilic poly(arylene vinylenes) or PAVs, and methods of preparation thereof, and methods and devices for using the polymers in photovoltaics and solar cells.

The synthesis of hydrophilic conjugated polymers typically relies on organometallic coupling methodologies. Disclosed herein is a novel approach to prepare polar poly(arylene-vinylenes) (PAVs) in water via the HWE reaction. A number of novel PAVs and discrete arylene-vinylenes (AVs) have been synthesized and characterized with UV-Vis absorption and ultraviolet photoelectron spectroscopy.

Utilities of these materials in sensing and photovoltaic applications have also been confirmed, as disclosed herein. A water processable polyelectrolyte (PVBT-$SO_3$) has been shown to be an efficient hole extraction material and a suitable substitute for PEDOT:PSS. The new polyelectrolyte does not require thermal annealing to achieve high performance inverted perovskite solar cells. For example, a maximum PCE of 15.9% was achieved using PVBT-$SO_3$ as the HEL, which is 26% higher than the PEDOT:PSS based devices. Additionally, PVBT-$SO_3$ based devices show improved stability over their PEDOT:PSS counterparts.

In one aspect, the invention generally relates to a polymer comprising the structural formula:

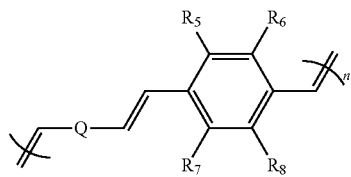

wherein Q is:

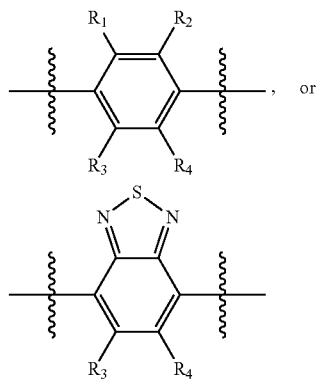

wherein each $R_1$, $R_2$, $R_3$ and $R_4$ is independently H or an electron-withdrawing group; provided that at least two of $R_1$, $R_2$, $R_3$ and $R_4$ are electron-withdrawing groups;

each of $R_5$, $R_6$, $R_7$ and R is independently selected from H, —R, —OR and —SR, provided at least two of $R_5$, $R_6$, $R_7$ and $R_8$ are selected from —R, —OR and —SR, wherein R comprises a group selected from cationic moiety, anionic moiety, zwitterionic moiety and a neutral moiety comprising a moiety selected from ethylene oxide and ethyleneglycol groups; and n is an integer from 2 to 4,000.

In another aspect, the invention generally relates to a polymerization method. The method includes: reacting a first monomer of the structural formula

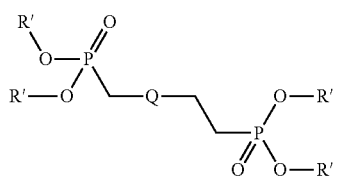

with a second monomer of the structural formula

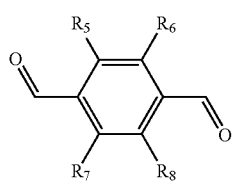

wherein
each R' is independently a $C_1$-$C_3$ alkyl group;
Q is:

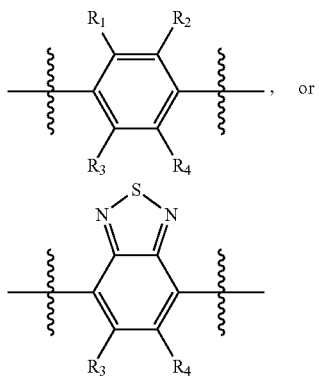

, or wherein
each $R_1$, $R_2$, $R_3$ and $R_4$ is independently H or an electron-withdrawing group selected from F, carboxylic acid, ester, amide, cyano, trifluoromethyl, and nitro; provided that at least two of $R_1$, $R_2$, $R_3$ and $R_4$ are selected from F, carboxylic acid, ester, amide, cyano, trifluoromethyl, and nitro; and
each of $R_5$, $R_6$, $R_7$ and $R_8$ is independently selected from H, —R, —OR and —SR, provided at least two of $R_5$, $R_6$, $R_7$ and $R_8$ are selected from —R, —OR and —SR, wherein R comprises a group selected from cationic moiety, anionic moiety, zwitterionic moiety and a neutral moiety comprising a moiety selected from ethylene oxide and ethyleneglycol groups.

In yet another aspect, the invention generally relates to a polymer prepared by a method of the invention.

In yet another aspect, the invention generally relates to a material comprising a polymer of the invention.

In yet another aspect, the invention generally relates to an article of manufacture comprising a polymer of the invention. In certain preferred embodiments, the article is a solar cell (e.g., inverted Perovskite solar cell).

In yet another aspect, the invention generally relates to an inverted Perovskite solar cell comprising a hole-extraction layer, wherein the hole-extraction layer comprises a polymer or is prepared from a polymer of the structural formula:

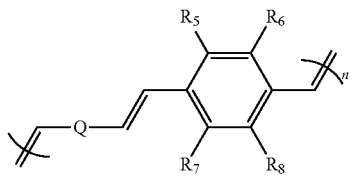

wherein Q is:

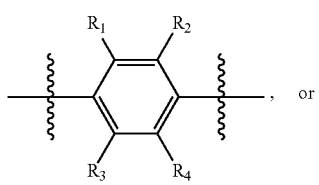

, or

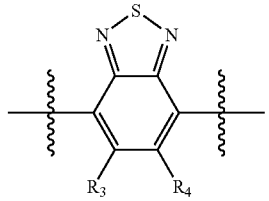

wherein
each $R_1$, $R_2$, $R_3$ and $R_4$ is independently H or an electron-withdrawing group selected from F, carboxylic acid, ester, amide, cyano, trifluoromethyl, and nitro; provided that at least two of $R_1$, $R_2$, $R_3$ and $R_4$ are selected from F, carboxylic acid, ester, amide, cyano, trifluoromethyl, and nitro;
each of $R_5$, $R_6$, $R_7$ and $R_8$ is independently selected from H and —OR, provided at least two of $R_5$, $R_6$, $R_7$ and $R_8$ are selected from —R, —OR and —SR, wherein R comprises a group selected from cationic moiety, anionic moiety, zwitterionic moiety and a neutral moiety comprising a moiety selected from ethylene oxide and ethyleneglycol groups; and
n is an integer from 2 to 4,000.

In certain preferred embodiments, inverted Perovskite solar cell is characterized by a power conversion efficiency (PCE) of about 15% or greater (e.g., about 16%, about 17%, about 18%, about 19%, about 20%, from about 15% to about 20%, from about 15% to about 17%, from about 17% to about 20%, greater than about 20%).

DETAILED DESCRIPTION OF THE INVENTION

Figure 1:
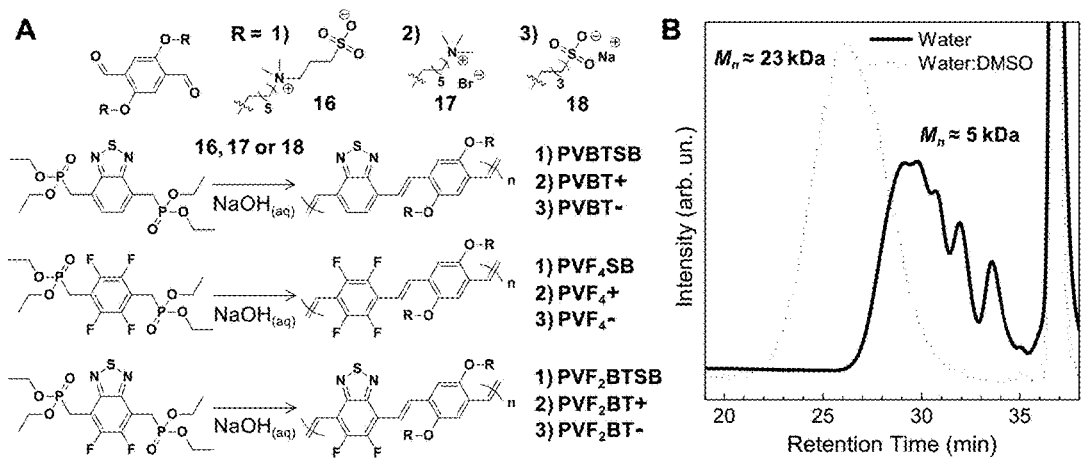
FIG. 1. (A) HWE polymerization of bisphosphonate monomers 5, 8, and 12 with terephthalaldehyde monomers 16-18 in water, or 1:1 water:DMSO, yielding zwitterionic PAVs PVBTSB, $PVF_4SB$, and $PVF_2BTSB$; cationic PAVs PVBT+, $PVF_4$+, and $PVF_2BT$+; and anionic PAVs PVBT−, $PVF_4$−, and $PVF_2BT$−. (B) Representative size exclusion chromatograms of PVBTSB, eluting with 2,2,2-trifluoroethanol (the signal at 37 minutes corresponds to the methanol flow-marker, and poly(methyl methacrylate) calibration standards were employed).

The invention provides an unconventional approach in which an aqueous-based HWE coupling reaction is employed to polymerize electron deficient bisphosphonate monomers to afford hydrophilic PAVs. Various bisphosphonate monomers, for example those containing thiadiazole and/or fluorine substituents, were coupled with anionic, cationic and zwitterionic terephthalaldehydes. In addition, discrete AVs were prepared to better understand the kinetics and regioselectivity of the coupling chemistry. Characterization of these hydrophilic PAVs in devices revealed their potential utility as organic electronic materials and in sensing.

Significantly, PAV-based conjugated polyelectrolytes have been synthesized through the HWE reaction in water without using toxic reagents/catalysts. This new method provides a channel to produce PAVs based polyelectrolytes with reasonably high molecular weight and high degree of trans-bonds. In PAVs, vinylene linkages are interesting due to inherent planarization of the polymer backbone by removing torsional interactions between aryl-rings, which results in extended conjugation and in-turn can afford better charge carrier transport properties. Also, rotational flexibility about the vinyl group increases polymer solubility, an important feature for solution processing of photovoltaic devices. As shown herein, a PAV based conjugated polyelectrolyte (PVBT-SO$_3$) can be effectively used as a water processable and thermal annealing-free hole extraction material for inverted perovskite solar cells.

This water processable and thermal annealing free HEL was developed as an alternative to widely used PEDOT:PSS for the fabrication of high performance inverted perovskite solar cells.

PVBT-SO$_3$ based devices show substantially improved light-soaking stability and long term air stability compared to their PEDOT:PSS counterparts. Electrochemical impedance spectroscopy (EIS), kelvin probe force microscopy (KPFM), and photoluminescence (PL) characterization were used to explore the working mechanism of PVBT-SO$_3$ as a HEL. EIS and PL measurements indicated that PVBT-SO$_3$ based devices have larger recombination resistance and more efficient charge extraction over PEDOT:PSS based devices. KPFM characterization successfully mapped the surface potential of different architectures fabricated on PVBT-SO$_3$ and PEDOT:PSS, which correlates well with the $V_{OC}$ gain seen in actual devices, while time-resolved PL measurements further confirmed the efficient charge extraction of PVBT-SO$_3$ interlayers from perovskite. The understanding presented here on PVBT-SO$_3$ for hole extraction to improve solution processed perovskite solar cells will encourage the design and utility of new polyelectrolytes to advance photovoltaic technology.

In one aspect, the invention generally relates to a polymer comprising the structural formula:

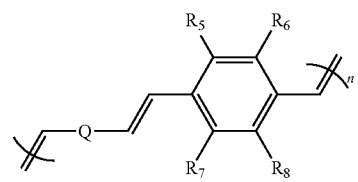

wherein Q is:

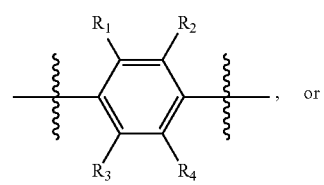, or

-continued

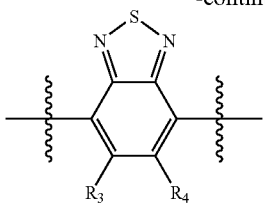

wherein
each $R_1$, $R_2$, $R_3$ and $R_4$ is independently H or an electron-withdrawing group; provided that at least two of $R_1$, $R_2$, $R_3$ and $R_4$ are electron-withdrawing groups;
each of $R_5$, $R_6$, $R_7$ and $R_8$ is independently selected from H, —R, —OR and —SR, provided at least two of $R_5$, $R_6$, $R_7$ and $R_8$ are selected from —R, —OR and —SR, wherein R comprises a group selected from cationic moiety, anionic moiety, zwitterionic moiety and a neutral moiety comprising a moiety selected from ethylene oxide and ethyleneglycol groups; and
n is an integer from 2 to 4,000.

In certain embodiments, at least two of $R_5$, $R_6$, $R_7$ and $R_8$ are selected from —OR and —SR.

In certain embodiments, at least two of $R_5$, $R_6$, $R_7$ and $R_8$ are —OR.

In certain embodiments, the one or more electron-withdrawing groups are selected from F, carboxylic acid, ester, amide, cyano, trifluoromethyl, and nitro groups.

In certain preferred embodiments, the one or more electron-withdrawing groups are selected from F, cyano, trifluoromethyl, and nitro groups.

In certain preferred embodiments, the electron-withdrawing groups are F's.

In certain embodiments, Q is:

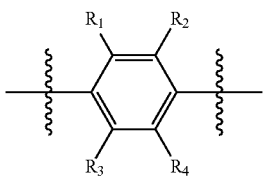

In certain preferred embodiments, each of $R_1$, $R_2$, $R_3$ and $R_4$ is F.

In certain embodiments, Q is:

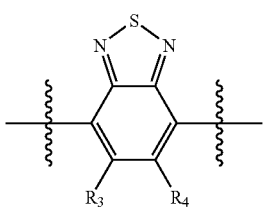

In certain preferred embodiments, each of $R_3$ and $R_4$ is F.

In certain preferred embodiments, each of $R_5$ and $R_8$ is H and each of $R_6$ and $R_7$ is selected from —R, —OR and —SR.

In certain embodiments, each of $R_5$ and $R_8$ is H and each of $R_6$ and $R_7$ is selected from —OR or —SR.

In certain embodiments, each of $R_5$ and $R_8$ is H and each of $R_6$ and $R_7$ is —OR.

In certain preferred embodiments, R is selected from:

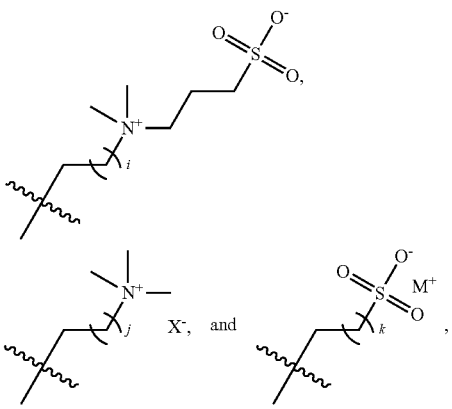

wherein each of i, j, and k is independently an integer from about 1 to about 20 (e.g., from about 1 to about 3, from about 1 to about 6, from about 1 to about 10, from about 1 to about 12, from about 3 to about 6, from about 3 to about 12, from about 6 to about 12). $X^-$ is an anionic counter ion and $M^+$ is a cationic counter ion. $X^-$ can be any suitable anionic counter ion (e.g., $Br^-$, $Cl^-$). $M^+$ can be any suitable cationic counter ion (e.g., $Na^+$, $K^+$).

In certain embodiments, R comprises a zwitterionic moiety. In certain embodiments, R further comprises one or more of a cationic moiety, an anionic moiety and a neutral moiety.

In certain embodiments, the structural unit has the formula:

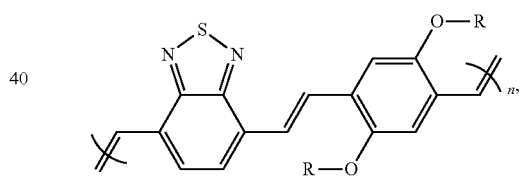

wherein R is selected from

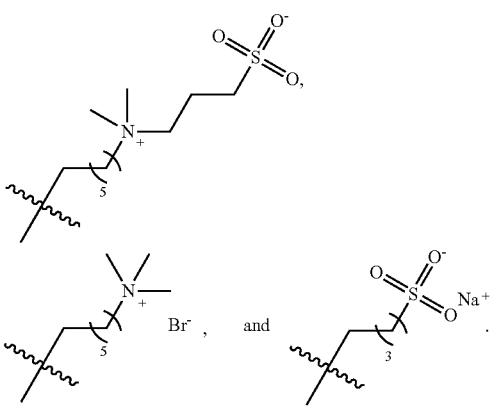

In certain embodiments, the structural unit has the formula:

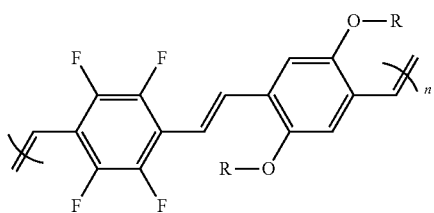

wherein R is selected from

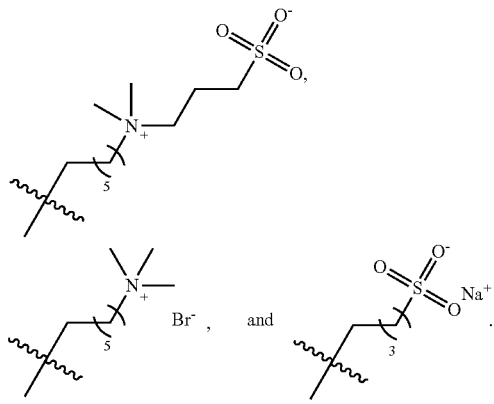

In certain embodiments, the structural unit has the formula:

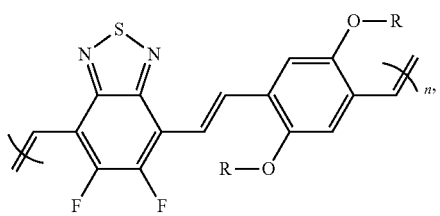

wherein R is selected from

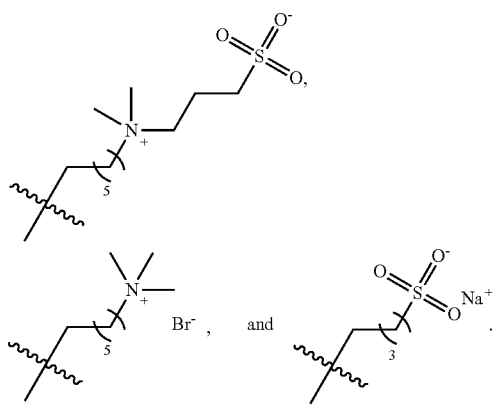

The polymer may have any suitable molecular weight, for example, from about 1 kDa to about 2,000 kDa (e.g., from about 10 kDa to about 2,000 kDa, from about 50 kDa to about 2,000 kDa, from about 100 kDa to about 2,000 kDa, from about 500 kDa to about 2,000 kDa, from about 1 kDa to about 1,000 kDa, from about 1 kDa to about 500 kDa, from about 1 kDa to about 200 kDa, from about 5 kDa to about 500 kDa, from about 10 kDa to about 200 kDa, from about 10 kDa to about 100 kDa, from about 10 kDa to about 50 kDa, about 50 kDa to about 100 kDa,).

In certain embodiments, the polymer has a molecular weight from about 20,000 to about 50,000 (e.g., from about 20,000 to about 40,000, from about 20,000 to about 30,000, from about 30,000 to about 50,000, from about 40,000 to about 50,000).

The variable n may be any suitable number, for example, an integer from about 2 to about 4,000 (e.g., from about 5 to about 4,000, from about 5 to about 2,000, from about 5 to about 1,000, from about 5 to about 500, from about 5 to about 100, from about 5 to about 50, from about 20 to about 4,000, from about 100 to about 4,000, from about 500 to about 4,000, from about 1,000 to about 4,000, from about 10 to about 2,000, from about 20 to about 1,000, from about 20 to about 500, from about 50 to about 200, from about 200 to about 500, from about 500 to about 1,000).

In certain embodiments, n is an integer from about 10 to about 100 (e.g., from about 10 to about 70, from about 10 to about 50, from about 10 to about 30, from about 20 to about 100, from about 20 to about 100, from about 50 to about 100, from about 20 to about 50, from about 50 to about 70).

In another aspect, the invention generally relates to a polymerization method. The method includes: reacting a first monomer of the formula

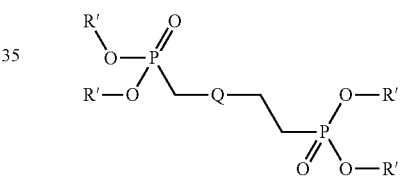

with a second monomer of the formula

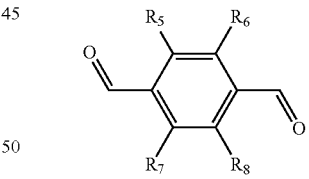

wherein each R' is independently a $C_1$-$C_3$ alkyl group;

Q is:

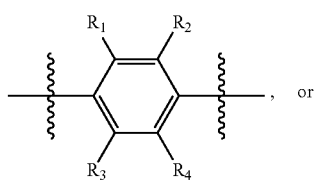, or

-continued

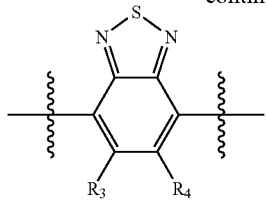

wherein each $R_1$, $R_2$, $R_3$ and $R_4$ is independently H or an electron-withdrawing group selected from F, carboxylic acid, ester, amide, cyano, trifluoromethyl, and nitro; provided that at least two of $R_1$, $R_2$, $R_3$ and $R_4$ are selected from F, carboxylic acid, ester, amide, cyano, trifluoromethyl, and nitro; and each of $R_5$, $R_6$, $R_7$ and $R_8$ is independently selected from H, —R, —OR and —SR, provided at least two of $R_5$, $R_6$, $R_7$ and $R_8$ are selected from —R, —OR and —SR, wherein R comprises a group selected from cationic moiety, anionic moiety, zwitterionic moiety and a neutral moiety comprising a moiety selected from ethylene oxide and ethyleneglycol groups.

In certain embodiments, each R' is an ethyl group and the first monomer has the formula:

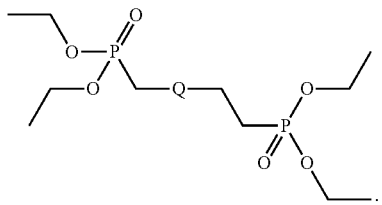

In certain embodiments, each R' is a methyl group and the first monomer has the formula:

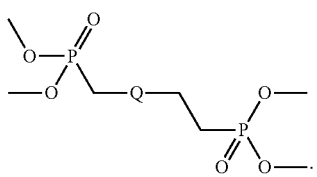

In certain embodiments, at least two of $R_5$, $R_6$, $R_7$ and $R_8$ are selected from —OR and —SR.

In certain embodiments, at least two of $R_5$, $R_6$, $R_7$ and $R_8$ are —OR.

In certain embodiments of the method, Q is:

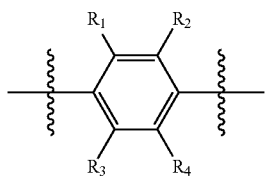

In certain preferred embodiments of the method, each of $R_1$, $R_2$, $R_3$ and $R_4$ is F.

In certain embodiments of the method, Q is:

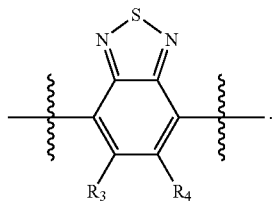

In certain preferred embodiments of the method, each of $R_3$ and $R_4$ is F.

In certain embodiments, each of $R_5$ and $R_8$ is H and each of $R_6$ and $R_7$ is selected from —R, —OR and —SR.

In certain embodiments, each of $R_5$ and $R_8$ is H and each of $R_6$ and $R_7$ is selected from —OR or —SR.

In certain embodiments, each of $R_5$ and $R_8$ is H and each of $R_6$ and $R_7$ is —OR.

In certain embodiments, R is selected from:

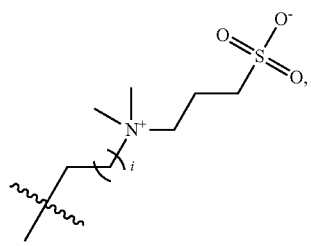

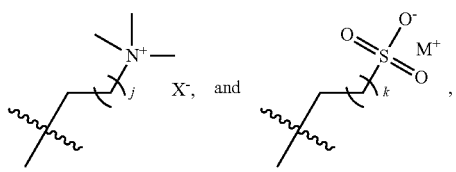

wherein each of i, j, and k is independently an integer from about 1 to about 20 (e.g., from about 1 to about 6, from about 1 to about 10, from about 1 to about 12, from about 3 to about 6, from about 3 to about 12, from about 6 to about 12). $X^-$ is an anionic counter ion and $M^+$ is a cationic counter ion. $X^-$ can be any suitable anionic counter ion (e.g., $Br^-$, $Cl^-$). $M^+$ can be any suitable cationic counter ion (e.g., $Na^+$, $K^+$).

In certain preferred embodiments of the method, the first monomer is:

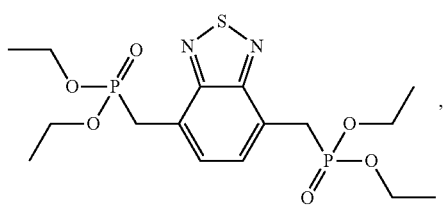 [SMILES: CCOP(=O)(Cc1ccc(CP(=O)(OCC)OCC)c2nsnc12)OCC]

the second monomer is

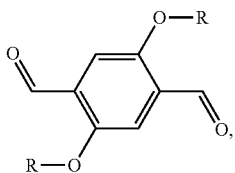

wherein R is selected from

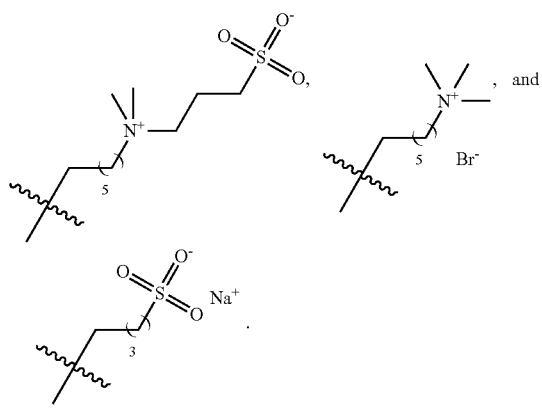

In certain preferred embodiments of the method, the first monomer is:

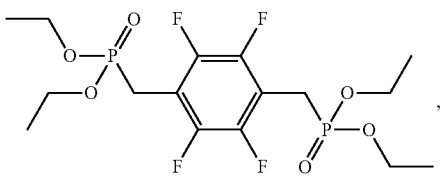

the second monomer is

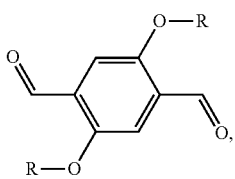

wherein R is selected from

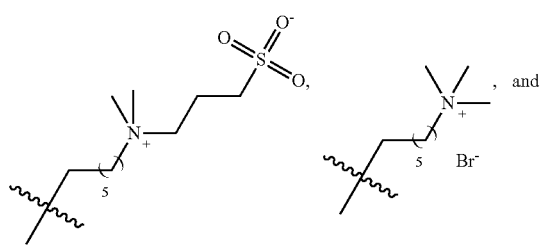

In certain preferred embodiments of the method, the first monomer is:

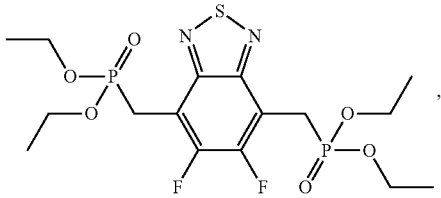 [SMILES: CCOP(=O)(Cc1c(F)c(F)c(CP(=O)(OCC)OCC)c2nsnc12)OCC]

the second monomer is

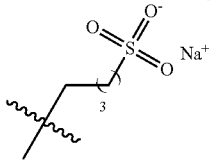

wherein R is selected from

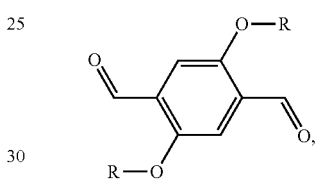

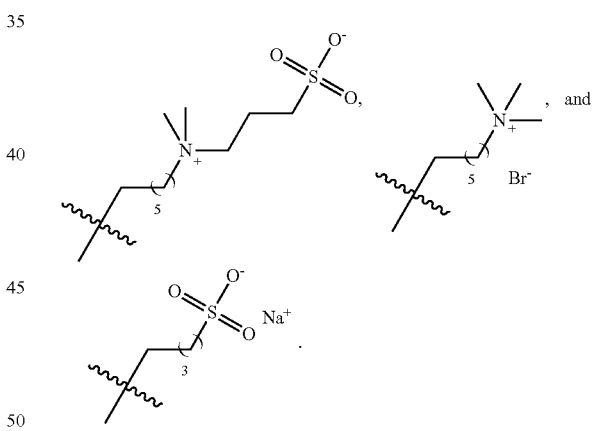

In certain preferred embodiments, the polymerization is carried out in an aqueous environment. In certain preferred embodiments, the polymerization is carried out in water. In certain preferred embodiments, the polymerization is carried out in a water/DMSO mixture.

In certain preferred embodiments, the polymerization is carried out without the presence of a transition metal catalyst.

In certain preferred embodiments, the polymerization is carried out at ambient temperature.

In yet another aspect, the invention generally relates to a polymer prepared by a method of the invention.

In yet another aspect, the invention generally relates to a material comprising a polymer of the invention.

In yet another aspect, the invention generally relates to an article of manufacture comprising a polymer of the invention. In certain preferred embodiments, the article is a solar cell (e.g., inverted Perovskite solar cell).

In yet another aspect, the invention generally relates to an inverted Perovskite solar cell comprising a hole-extraction layer, wherein the hole-extraction layer comprises a polymer or is prepared from a polymer of the structural formula:

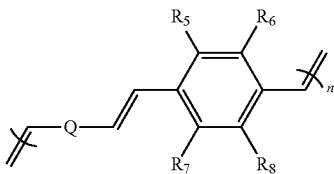

wherein Q is:

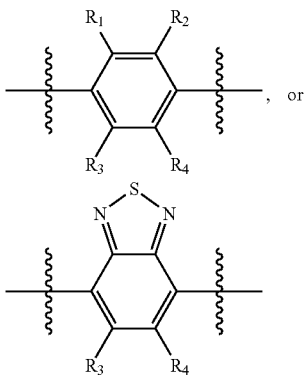

wherein
each $R_1$, $R_2$, $R_3$ and $R_4$ is independently H or an electron-withdrawing group selected from F, carboxylic acid, ester, amide, cyano, trifluoromethyl, and nitro; provided that at least two of $R_1$, $R_2$, $R_3$ and $R_4$ are selected from F, carboxylic acid, ester, amide, cyano, trifluoromethyl, and nitro;
each $R_5$, $R_6$, $R_7$ and $R_8$ is independently selected from H, —R, —OR and —SR, provided at least two of $R_5$, $R_6$, $R_7$ and $R_8$ are selected from —R, —OR and —SR, wherein R comprises a group selected from cationic moiety, anionic moiety, zwitterionic moiety and a neutral moiety comprising a moiety selected from ethylene oxide and ethyleneglycol groups; and
n is an integer from 2 to 4,000.

In certain embodiments, at least two of $R_5$, $R_6$, $R_7$ and $R_8$ are selected from —OR and —SR.

In certain embodiments, at least two of $R_5$, $R_6$, $R_7$ and $R_8$ are —OR.

In certain embodiments of the inverted Perovskite solar cell, Q is:

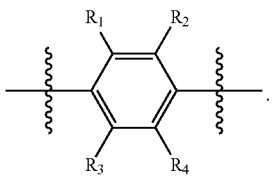

In certain preferred embodiments, each of $R_1$, $R_2$, $R_3$ and $R_4$ is F.

In certain embodiments of the inverted Perovskite solar cell, Q is:

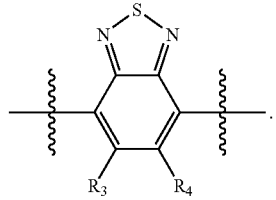

In certain preferred embodiments, each of $R_3$ and $R_4$ is F.

In certain embodiments, each of $R_5$ and $R_8$ is H and each of $R_6$ and $R_7$ is selected from —R, —OR and —SR.

In certain embodiments, each of $R_5$ and $R_8$ is H and each of $R_6$ and $R_7$ is selected from —OR or —SR.

In certain embodiments, each of $R_5$ and $R_8$ is H and each of $R_6$ and $R_7$ is —OR.

In certain embodiments of the inverted Perovskite solar cell, each of $R_5$ and $R_8$ is H and each of $R_6$ and $R_7$ is selected from —R, —OR and —SR. In certain preferred embodiments, R is selected from:

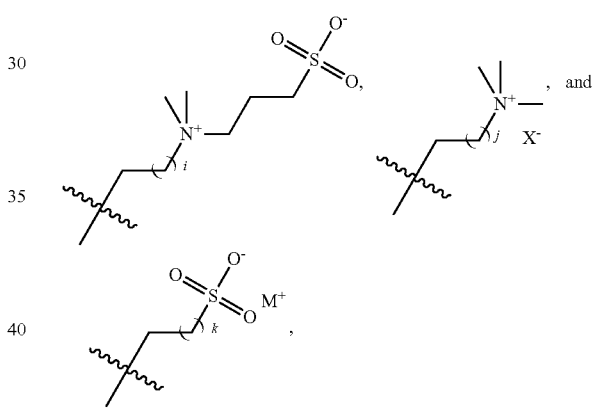

wherein each of i, j, and k is independently an integer from about 1 to about 20 (e.g., from about 1 to about 6, from about 1 to about 10, from about 1 to about 12, from about 3 to about 6, from about 3 to about 12, from about 6 to about 12).

$X^-$ is an anionic counter ion and $M^+$ is a cationic counter ion. $X^-$ can be any suitable anionic counter ion (e.g., $Br^-$, $Cl^-$). M can be any suitable cationic counter ion (e.g., $Na^+$, $K^+$).

In certain preferred embodiments, inverted Perovskite solar cell is characterized by a power conversion efficiency (PCE) of about 15% or greater (e.g., about 16%, about 17%, about 18%, about 19%, about 20%, from about 15% to about 18%, from about 18% to about 20%, greater than about 20%).

EXAMPLES

I. Novel Hydrophilic Conjugated Polymers and Syntheses
Materials
α,α'-Dibromo-p-xylene (1) (97%), hydrobromic acid (ACS reagent, 48%), 1,3,5-trioxane (≥99%), sodium cubes (99.9%), salicylaldehyde (98%), benzophenone (≥99%), acetonitrile (anhydrous, 99.8%), N,N-dimethylformamide (anhydrous, 99.8%), calcium hydride (≥97%), myristyltrimethylammonium bromide (≥99%), paraquat dichloride hydrate (PESTANAL®, analytical standard), thionyl chloride (≥99%), diisopopylamine (99.95%), phosphorus tribromide (99%), triethyl phosphite (98%), triethylamine (>99%), 1,3-propane sultone (99%), 1,4-butane sultone (≥99%), 1,6-dibromohexane (96%), dimethylamine (2.0 M in THF), trimethylamine (anhydrous, ≥99%) and 1,8-diiodooctane (98%) were purchased from Sigma Aldrich and used without further purification. Chloroform-D (99.8%) and 2,2,2-trifluorethanol-D3 (99%) were purchased from Cambridge Isotope Laboratories. 2,2,2-Trifluoroethanol (99+%), n-butyllithium (2.5 M in hexanes) and paraformaldehyde (97%) were purchased from Alfa Aesar. Silica gel (200×400 mesh) was purchased from Sorbent Technologies. RediSep Rf Reversed-phase columns composed of C18-derivatized silica were purchased from Teledyne Isco. 2,1,3-benzothiadiazole (3) (98%) and 1,2-diamino-4,5-difluorobenzene (96%) were purchased from Combi-Blocks. 2,3,5,6-Tetrafluoro-1,4-benzenedimethanol (99%) (6) was purchased from AK Scientific. Spectra/Por dialysis tubing was purchased from Spectrum Labs. Hexamethylphosphoramide (99%, Sigma Alrich) was dried over calcium hydride and distilled before use. Tetrahydrofuran (99%, Fisher Scientific) (THF) was dried over sodium/benzophenone ketyl, and distilled before use. Anhydrous magnesium sulfate, sodium bicarbonate, sodium chloride, sodium carbonate, potassium carbonate, hexanes, ethyl acetate, chloroform, methanol, acetone, acetonitrile, diethyl ether and dichloromethane were purchased from Fisher Scientific. PCE-10 was purchased from 1-Material and PCBM was purchased from Nano-C. Tetraethyl (1,4-phenylenebis(methylene))bis (phosphonate) (2)[S1] and 2,5-dihydroxyterephthalaldehyde (13)[S2] were prepared according to literature.

PAV Syntheses

Novel hydrophilic PAVs containing zwitterionic, cationic and anionic side-chains were synthesized by aqueous HWE coupling. The strongly electron withdrawing fluorine and thiadiazole substituents on the benzylphosphonates proved vital for successful coupling. The reaction rates and regioselectivity of the HWE reaction in water was studied through the preparation of AV trimers, while the addition of DMSO as a cosolvent enhanced reaction rates and enabled the formation of higher molecular weight polymers. The energetics and interfacial behavior of the PAVs were probed using UV-Vis absorption and UPS, finding that zwitterionic and cationic PAVs reduce the Φ of Ag, while anionic PAVs cause a slight increase in metal Φ. Stem-Volmer photoluminescence quenching experiments showed the potential of the anionic PAVs in sensing applications, while the cationic and anionic PAVs were successfully implemented as cathode and anode modification layers, respectively, in PSCs. The described scope of HWE coupling in water provides a platform for the development of new PAVs for numerous applications that benefit from aqueous preparation conditions and processibility.

The hydrophilic PAVs were synthesized by polymerization of the aromatic bisphosphonates shown in Scheme 1. (1,4-Phenylenebis(methylene))bis(phosphonate) (2) was synthesized from dibromo-p-xylene by Michaelis-Arbuzov (M-A) coupling to give the corresponding dialkylphosphate. (Michaelis, et al. *Berichte* 1898, 31, 1048; Arbuzov J. *Russ. Phys. Chem. Soc.* 1906, 38, 687; Arbuzov *Chem. Zentr.* 1906, 11, 1639.) Bisphosphonates 2, 5, 8 and 12 were obtained in this manner, and isolated in pure form and high yield (73-95%) by crystallization.

Figure 66:
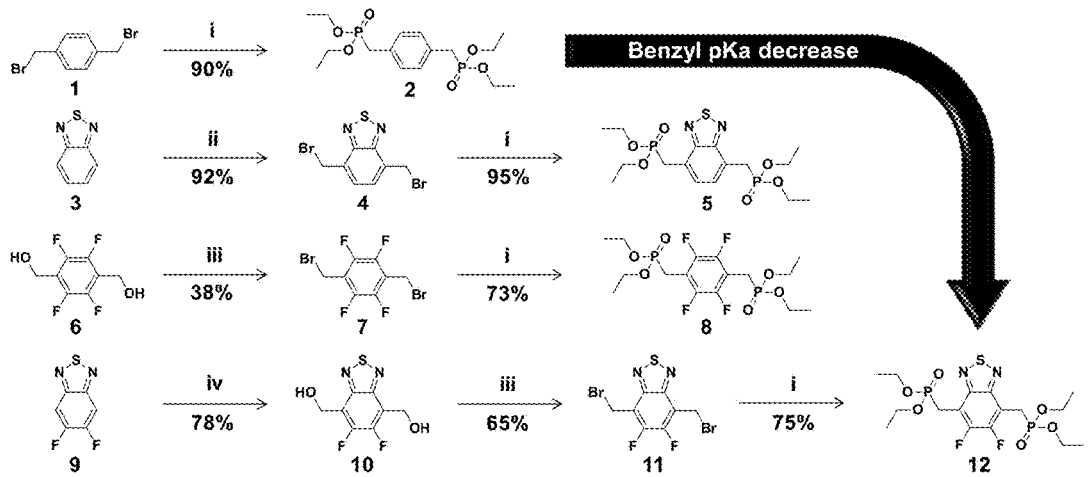
FIG. 66. Aromatic bisphosphonate monomer preparation.

Scheme 1 shows a scheme for aromatic bisphosphonate monomer preparation: (i) P(OEt)$_3$, 73-95%; (ii) trioxane, myristyltrimethylammonium bromide, HBr (48 wt % in water), H$_2$SO$_4$, 92%; (iii) PBr$_3$, CH$_2$Cl$_2$, 38-65%; (iv) LDA, formaldehyde, THF, HMPA, 78%. (FIG. 66.)

Figure 8:
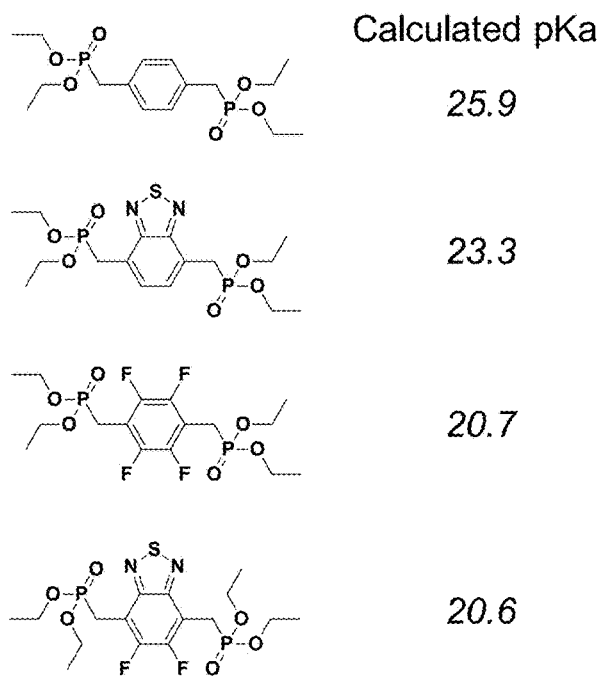
FIG. 8. Theoretical acid dissociation constants were calculator using JChem and ACE online software: <https://epoch.uky.edu/ace/public/pKa.jsp>

Dibenzylbromide 4, the precursor to monomer 5, was synthesized by bromomethylation of benzothiadiazole under phase transfer conditions, using H$_2$SO$_4$ in place of CH$_3$COOH to accelerate the reaction. (Mitchell, et al. *Synlett* 1989, No. 1, 55-57.) Bis(bromomethyl) tetrafluorobenzene 7, the precursor to 8, was synthesized from commercially available tetrafluorobenzenedimethanol (6) with PBr$_3$. Monomer 12 was then prepared by hydroxymethylation of difluorobenzothiadiazole (9), followed by bromination with PBr$_3$, and finally M-A coupling. The hydroxymethylation reaction was best performed (78% yield) using lithium diisopropylamide (LDA) in the presence of hexamethylphosphoramide (HMPA) to stabilize the dianionic benzothiadiazole intermediate, followed by reacting the intermediate with formaldehyde (instead of paraformaldehyde owing to its higher solubility/reactivity in THF at −78° C.). (Zhou, et al. *Angew. Chem. Int. Ed.* 2011, 50 (13), 2995-2998; Kularatne, et al. *J. Mater. Chem. A* 2013, 1 (48), 15535-15543; Schlosser, et al. *Synlett* 1990, 704; Rodriguez, et al. *Synlett* 1990, No. 4, 227-228.) The electron withdrawing benzothiadiazole and fluorine groups increase the acidity of the benzyl protons positioned a to the phosphonate (calculations place the pKa values in the order 2>5>8>12, FIG. 8).

Figure 9:
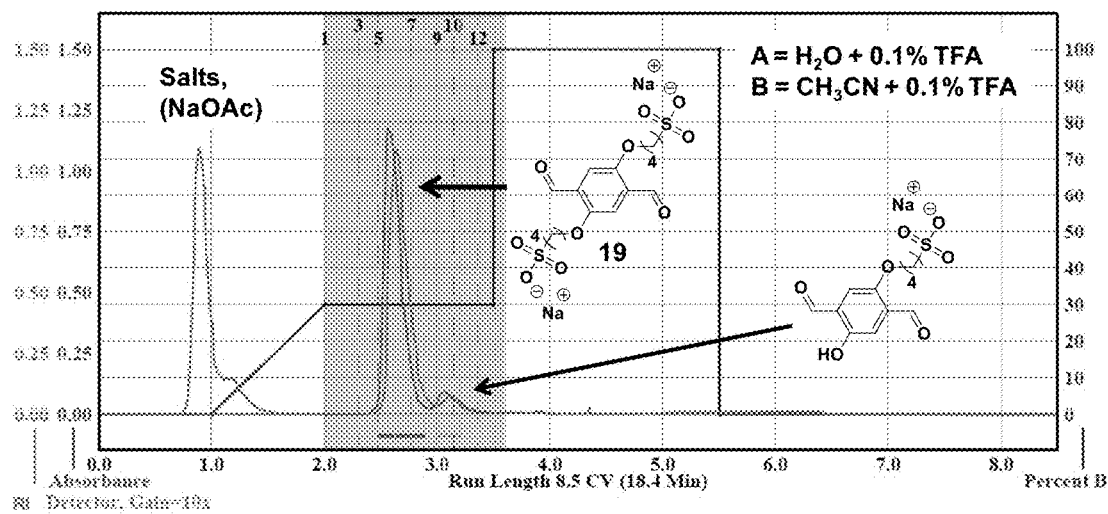
FIG. 9. Representative reverse-phase chromatograph on C18-derivatized silica eluting initially with water (+0.1% TFA) and over-time the percent of acetonitrile (+0.1% TFA) is increased. Clear separation between non-UV active salts, desired product 19 and byproduct, sodium 4-(2,5-diformyl-4-hydroxyphenoxy)butane-1-sulfonate, that arises from incomplete ring-opening is shown.

The terephthalaldehyde monomers were synthesized with zwitterionic (16), cationic (17), and anionic (18) components from diol 13, as shown in Scheme 2. (Hiremath *Tetrahedron Lett.* 2013, 54 (26), 3419-3423.) Zwitterion 16 was synthesized by reacting 13 with excess 1,6-dibromohexane to give 14, which was treated with dimethylamine to give compound 15 that is setup for ring-opening of 1,3-propanesultone to afford zwitterion 16. The cationic derivative shown as 17 was synthesized similarly, but using trimethylamine in place of dimethylamine. The anionic derivative 18 was synthesized in one step from 13, utilizing the sodium phenoxide salt to ring open 1,4-butane sultone and afford the bis-sulfonate product. Monomers 16 and 17 were purified simply by precipitation and filtration; isolation of 18 from residual salts was achieved by reverse phase chromatography (FIG. 9).

Scheme 2. Synthesis of monomers 16-18:

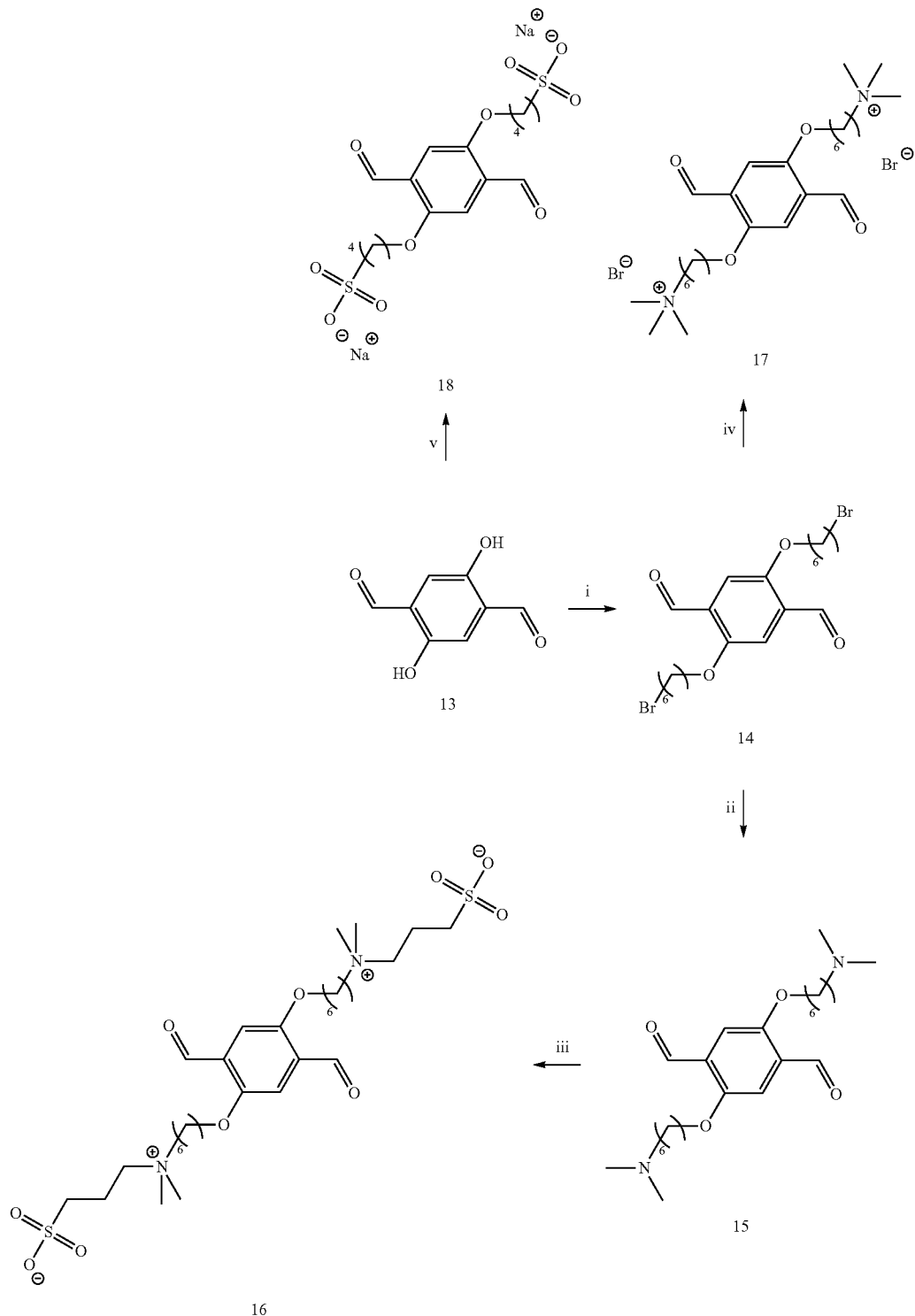

(i) 1,6-dibromohexane, K$_2$CO$_3$, CH$_3$CN, 69%; (ii) dimethylamine, THF, 87%; (iii) 1,3-propane sultone, CH$_3$CN, 98%; (iv) trimethylamine, CH$_3$CN, 96%; (v) 1,4-butane sultone, Na$_2$CO$_3$, DMF, 74%.

Attempted HWE coupling/polymerization of bisphosphonate monomers 2, 5, 8 and 12 with terephthalaldehydes 16-18 (FIG. 1) in the presence of sodium hydroxide proved generally unfavorable. Monomer 2 did not react under these conditions, likely due to its weakly acidic benzyl protons, while monomers 5, 8, and 12 afforded only low molecular weight polymers (M, 2-16 kDa) as estimated by size exclusion chromatography (SEC) in trifluoroethanol (TFE).

Fortunately, HWE polymerizations conducted in 1:1 H$_2$O:DMSO proved more successful. Combining benzothiadiazole-phosphonate 5 with zwitterionic terephthalaldehyde 16 under basic conditions led to a rapid change in the reaction mixture from yellow to blue, with extended polymer conjugation obtained in minutes (as opposed to days for the polymerizations conducted in pure water). Size exclusion chromatography (SEC) of the polymer products confirmed the higher molecular weights achieved (up to 50 kDa) when using DMSO as cosolvent. The benzothiadiazole-based polymers reached higher molecular weights (20-50 kDa) than the fluorinated derivatives (8-25 kDa), the latter precipitating during the course of the polymerization. The compatibility of this HWE method with oxygen and moisture, and the absence of transition-metal catalysts and initiators, are advantageous. The cationic and anionic CPEs displayed good solubility in pure water, while the CPZs were soluble in salt water (~10 mg/mL) and TFE (>30 mg/mL). However, solution aggregation of the PAVs in DMSO, water and TFE resulted in weak fluorescence as well as substantial peak broadening in the $^1$H-NMR spectra that prevented a determination of the degree of cis vs trans vinyl linkages by NMR.

Figure 2:
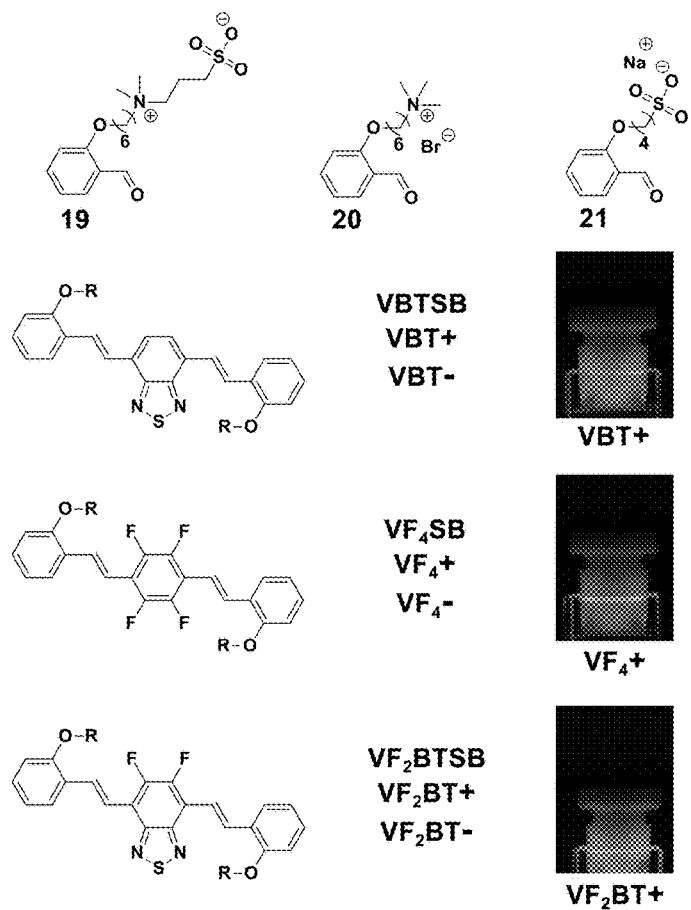
FIG. 2. AV oligomers synthesized by HWE coupling of 5, 8 and 12 with salicylaldehydes 19, 20, and 21, yielding zwitterionic VBTSB, $VF_4SB$, and $VF_2BTSB$, cationic VBT+, $VF_4$+, and $VF_2BT$+ and anionic VBT−, $VF_4$−, and $VF_2BT$−. The photographs are of cuvettes containing the indicated AVs as 0.2 mM DMSO solutions irradiated at 354 nm.
Figure 10:
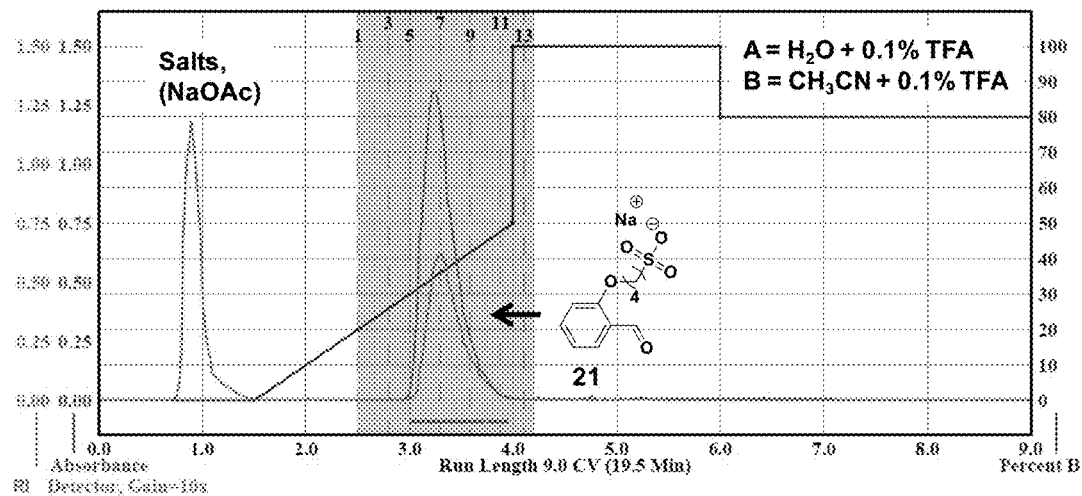
FIG. 10. Representative reverse-phase chromatograph on C18-derivatized silica eluting initially with water (+0.1% TFA) and over-time the percent of acetonitrile (+0.1% TFA) is increased. Clear separation between non-UV active salts and the desired product 21 is shown.
Figure 11:
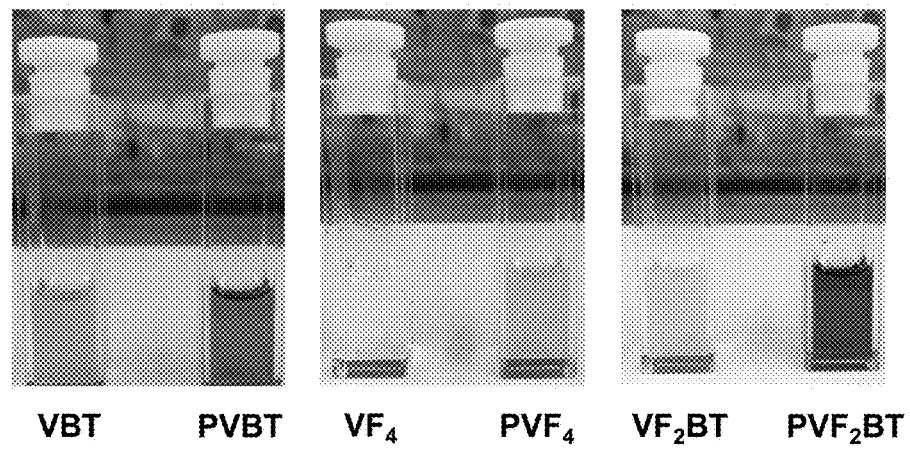
FIG. 11. Images of cationic trimers and PAVs in DMSO, where the change in color from trimer to corresponding polymer indicates a bathochromic shift in absorption due to an increased conjugation length. Trimers are at a concentration of 0.2 mM and PAVs at 0.05 mg/mL.
Figure 12:
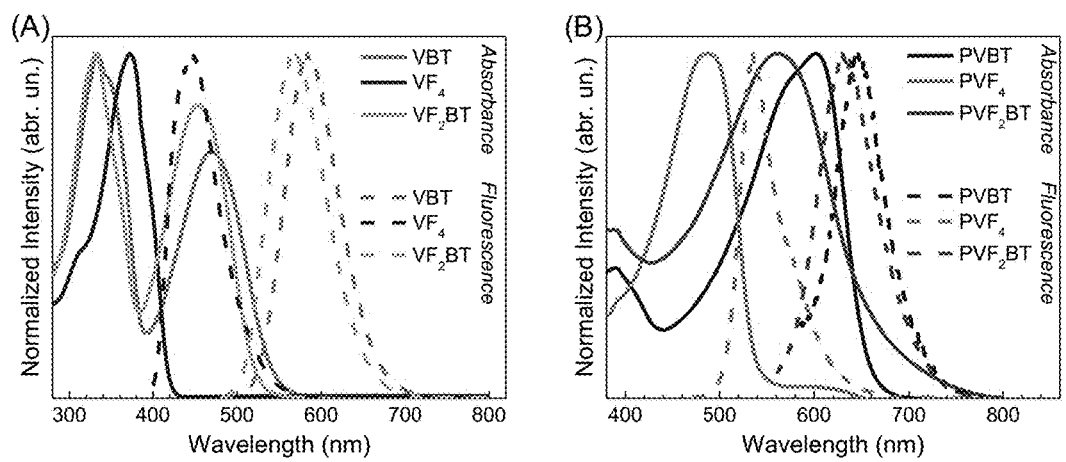
FIG. 12. Normalized absorption and fluorescence spectra of cationic AVs (A) and PAVs (B) in DMSO. Excitation for fluorescence spectra was at peak absorption, $\lambda_{max}$ (second, red-shifted peaks for VBT and $VF_2BT$). The anionic and zwitterionic materials show very similar absorption and fluorescence features to the representative cationic AVs and PAVs.

Benzaldehydes 19-21 (FIGS. 2 and 10) were synthesized in analogous fashion to the terephthalaldehydes described above, and coupled to aromatic bisphosphonates 5, 8, and 12 to afford AV model systems. The nine AVs (three each of cationic, anionic, and zwitterionic examples) prepared are shown in FIG. 2, and their DMSO solutions are brightly fluorescent, suggesting a lack of aggregation relative to the PAVs. Additionally, the utility of different central aromatic units (benzothiadiazole, tetrafluorobenzene and difluorobenzothiadiazole) provides color tunability, as shown in FIGS. 2, 11 and 12.

Figure 3:
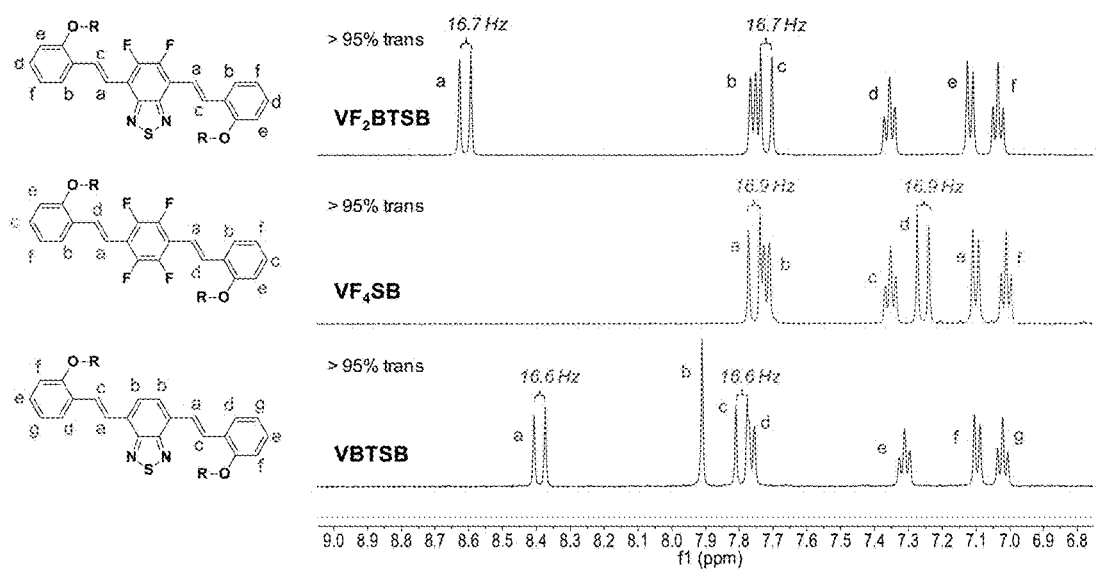
FIG. 3. Partial $^1$H-NMR spectra of VBTSB, $VF_4SB$ and $VF_2BTSB$, with labels indicating coupling constants of the trans alkene protons.

The AV synthesis allowed facile characterization of the HWE products containing charged and zwitterionic side chains. $^1$H-NMR spectroscopy reveals the regioselectivity of the AVs from the vinylene proton coupling constants. The spectra of the zwitterionic AVs (FIG. 3) indicate the presence of trans alkenes, with coupling constants of ~17 Hz in all cases. Smaller coupling constants of 5-10 Hz are expected for cis alkenes. (Organic Chemistry, 5th ed. Brown, W. H.; Foote, C. S.; Iverson, B. L.; Anslyn, E. V. Brooks/Cole Cengage Learning. 2009. pp 495.) The cis/trans ratio in AVs and PAVs significantly impacts optoelectronic properties, where trans linkages typically improve planarity, maximize conjugation, and minimize the energy gap ($E_g$). (Cacialli, et al. *Opt. Mater.* 1999, 12 (2-3), 315-319.)

Figure 4:
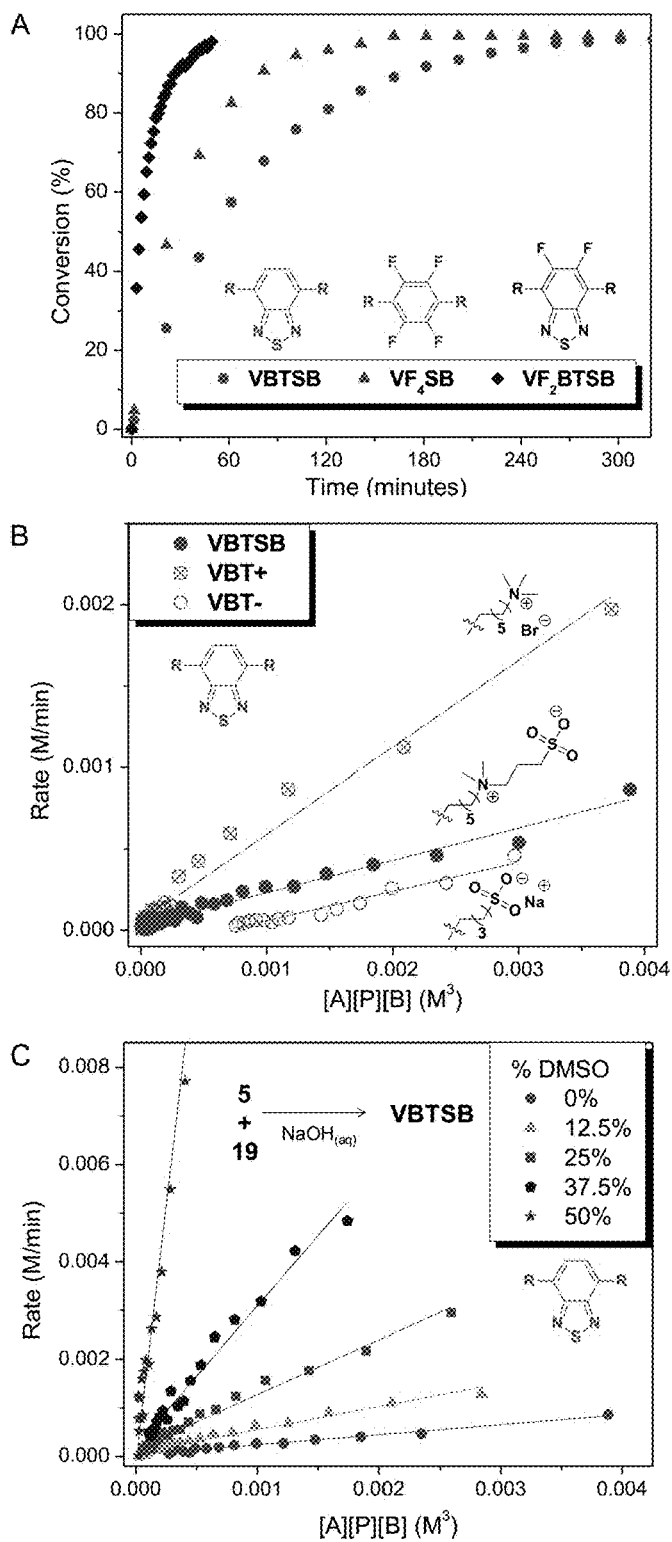
FIG. 4. HWE coupling kinetics for: (A) aromatic bisphosphonates 12, 8 and 5, with zwitterionic benzaldehyde 19; (B) aromatic bisphosphonate 5 with zwitterionic (19), cationic (20) and anionic (21) benzaldehydes, and (C) $H_2O$ and $H_2O$:DMSO solvents. The observed reaction rate trends are: 12>8>5; cation>zwitterion>anion; and $DMSO:H_2O$>$H_2O$. Experiments were conducted in duplicate and at room temperature in $H_2O$ ($H_2O$:DMSO) with four equivalents of NaOH as base, using $^{31}$P-NMR to monitor conversion.
Figure 13:
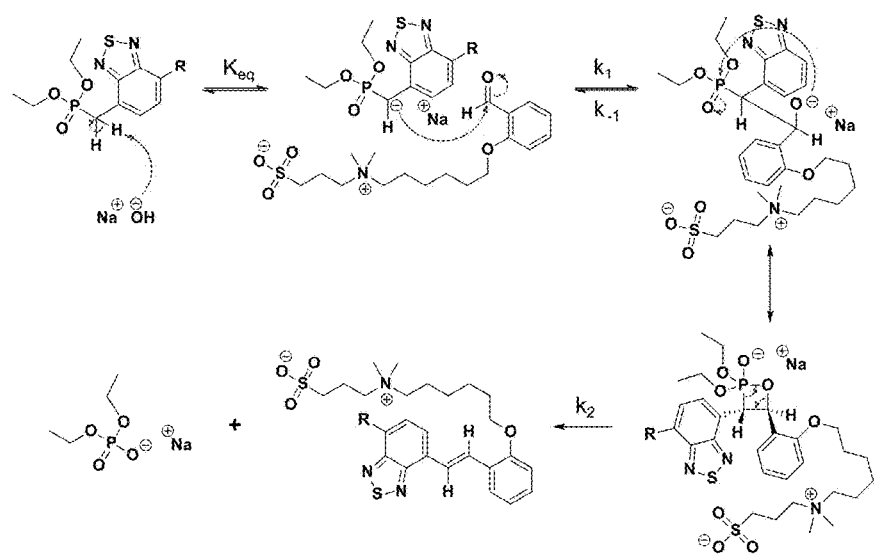
FIG. 13. Mechanism of HWE coupling and corresponding rate equation[S11-S13] (derived using the steady state approximation), where [A]=aldehyde concentration, [P]=phosphonate concentration, and [B]=base concentration.
Figure 14:
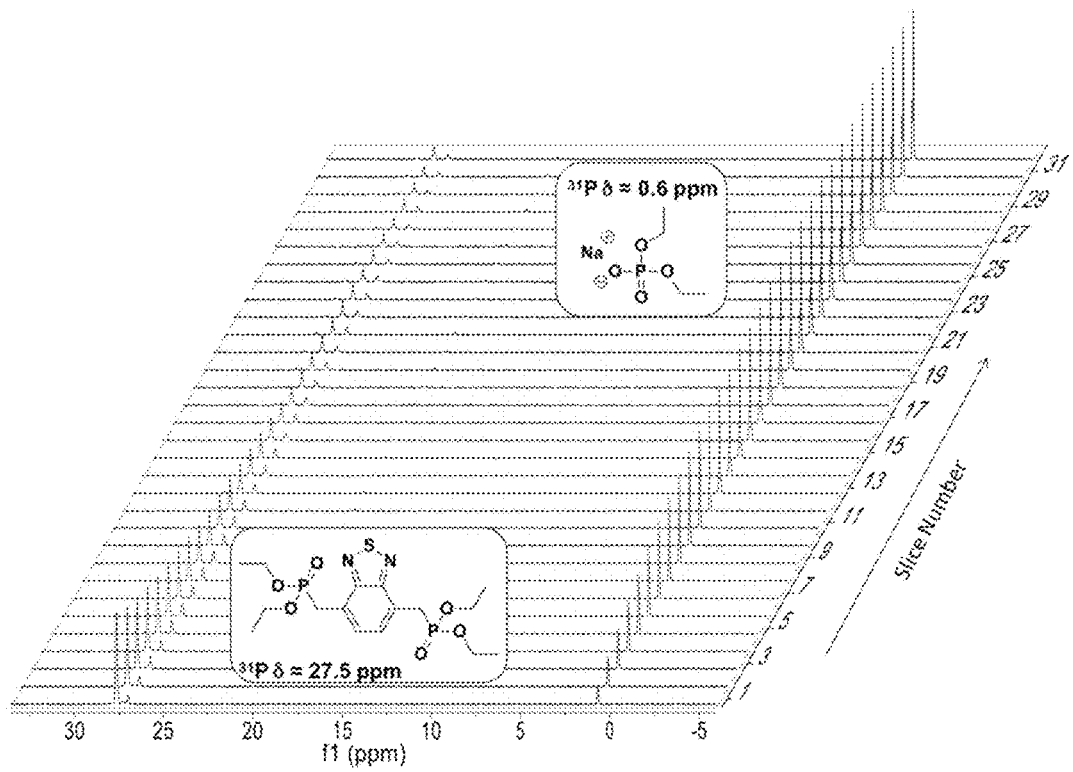
FIG. 14. Representative $^{31}$P-NMR kinetics spectra of the reaction between bis(methylphosphonate) benzothiadiazole monomer (5) and sulfobetaine benzaldehyde (19) in water containing four equivalents of sodium hydroxide, yielding the VBTSB trimer. Phosphonate chemical shifts for 3 are at approximately 25 ppm and for the sodium phosphonate salt by-product at 0.6 ppm. The overlay shows the disappearance of the peak at 25 ppm and concurrent increase of peak at 0.6 ppm over 32 slices taken every 20 minutes.
Figure 15:
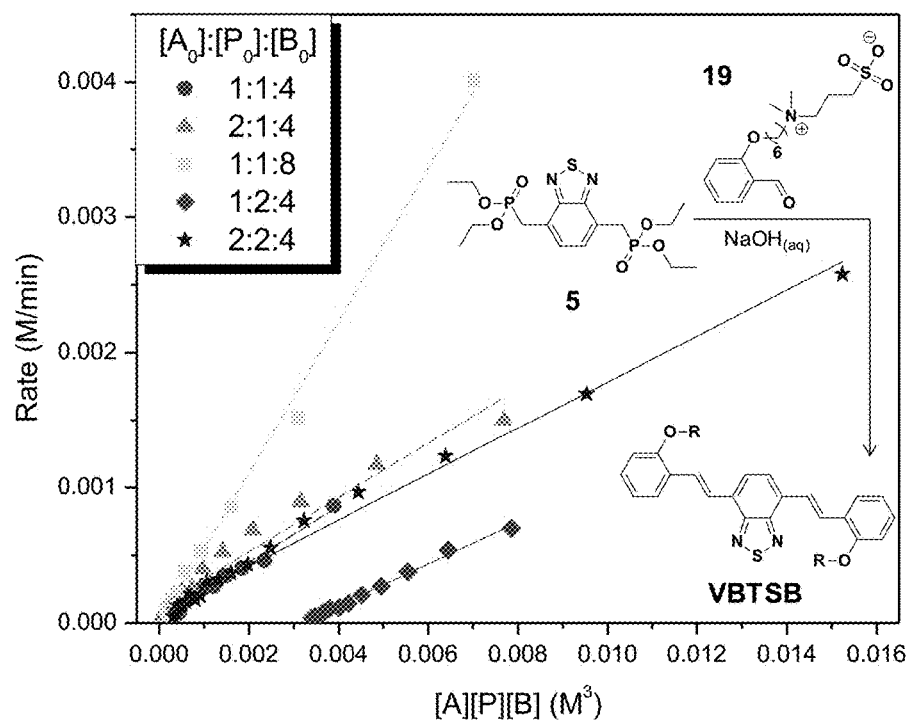
FIG. 15. HWE kinetics for the trimerization reaction between bis(methylphosphonate) benzothiadiazole monomer, 5, and sulfobetaine-benzaldehyde 19 with sodium hydroxide as the base and water as the solvent, yielding VBTSB. The rate given represents the rate at which the sodium phosphonate salt byproduct is formed, monitoring with $^{31}$P-NMR. Initial reactant equivalents are varied and the observed rate constant ($k_{obs}$) remains approximately the same irrespective of the initial aldehyde, $[A_0]$, or phosphonate, $[P_0]$, concentrations, but changes upon increasing the initial base concentration, $[B_0]$. All trimerization and polymerization HWE reactions were done with the same $[B_0]$.
Figure 16:
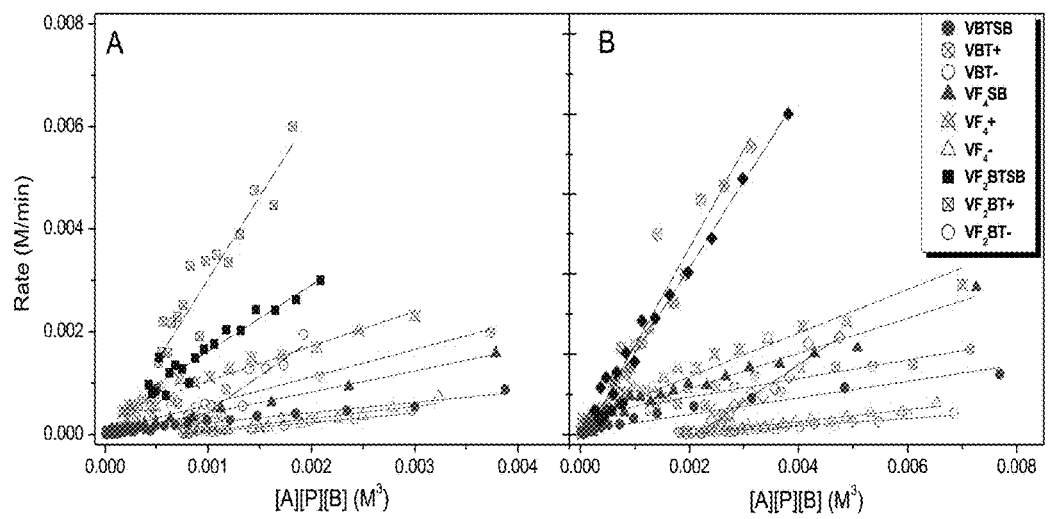
FIG. 16. Representative HWE trimerization kinetics comparing the nine AVs, with (A) equimolar benzaldehyde and phosphonate functionalities and (B) excess benzaldehyde reactant (2 equivalents of aldehyde functionality relative to phosphonate functionality). The kinetics reveal the following trends regarding bis(methylphosphonate) and functionalized benzaldeyde reaction rates: 12>8>5 and cation>zwitterions>anion (respectively). Reactions were done at room temperature, in water with four equivalents of NaOH as the base. Experiments were run in duplicate.

NMR spectroscopy was used to monitor the kinetics of the HWE reactions (FIGS. 4 and 13). $^{13}$P-NMR spectra were recorded on reactions performed in basic (NaOH) D$_2$O in an NMR tube, specifically noting signals for benzylphosphonates (20-30 ppm) and sodium phosphonate salt by-product (0.5 ppm) (FIG. 14). HWE reactions are typically overall third order (first order each in aldehyde [A], phosphonate [P], and base [B]) with carbanion addition to the aldehyde representing the rate-limiting step (FIG. 13). (Li, et al. *ARKIVOC* 2005, 1, 98-104; Larsen, et al. *Phosphorus and Sulfur* 1983, 15, 219-228; Larsen, et al. *Phosphorus and Sulfur* 1983, 15, 229.) The reaction of phosphonate 5 with zwitterionic benzaldehyde 19 was monitored by varying reactant concentration, finding the expected linear relationship between reaction rate and [A][P][B] (FIG. 15 and Table 2). Subsequent experiments compared the reaction rates of the aromatic bisphosphonates 5, 8 and 12 (FIGS. 4A and 16 and Tables 3 and 4) and hydrophilic benzaldehydes 19-21 (FIGS. 4B and 16 and Tables 3 and 4), with additional examination of the effect of DMSO as a co-solvent with water (FIG. 4C and Table 5). The reactivities of the bisphosphonate monomers tracked closely with calculated benzyl pKa values, with the more acidic 12 reacting 6-10 times faster than the less acidic 5. For the benzaldehydes, the cationic example was most reactive, followed by the zwitterionic and anionic versions. Since the rate-limiting step of HWE coupling is nucleophilic attack on the aldehyde, the cation of 20 interacts with the transient anion of the benzyl phosphonate derivatives, drawing it closer to the aldehyde. In contrast, charge repulsion may slow the reaction of 21. Increasing the DMSO:water ratio to 3:1 (FIG. 4C) accelerated the reaction rate by >100 times (the reaction went to completion in <2 minutes, in accord with the higher molecular weight PAVs obtained for polymerizations in DMSO: water, FIG. 1). DMSO accelerates the reaction rate by interrupting solution aggregation of the aromatic groups that occurs in pure water.

Electronic Characterization

Figure 17:
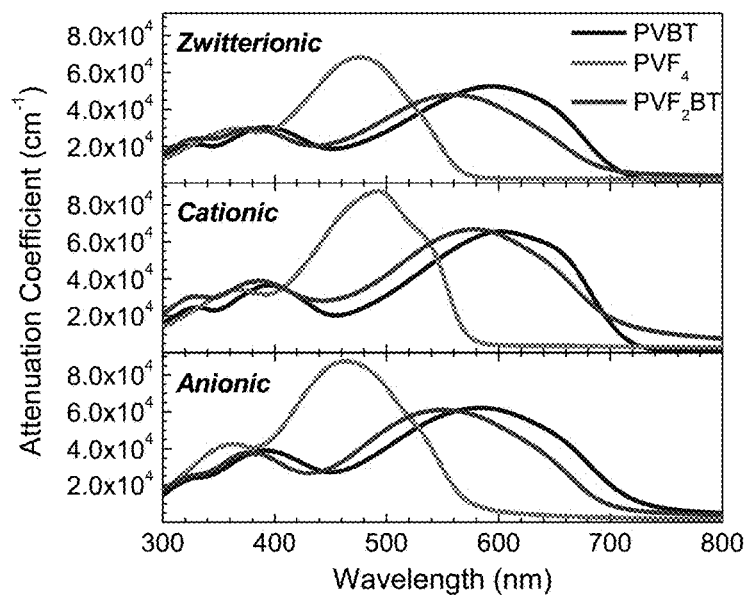
FIG. 17. UV-Vis absorption spectra of PAV films spun-coat onto glass substrates. Thickness of the films was determined after measuring absorption profiles using a profilometer, followed by calculating the shown attenuation coefficients using Beer's law ($\varepsilon=A/l$, where $\varepsilon$ is attenuation coefficient, A is absorption and l is thickness). $E_g$'s were determined from the absorption onset.

The solid state energy levels were determined for the nine PAVs using UV-Vis absorption spectroscopy (FIG. 17) to determine the energy gap ($E_g$) from the onset of absorption, and ultraviolet photoelectron spectroscopy (UPS) to determine ionization potential ($I_P$) from the low-binding energy onset (Table 1). UPS also probes interactions between a conductive substrate and an ultra-thin coating, providing information about work function ($\Phi$) from the high binding energy region of the spectrum. This is calculated from the difference between the secondary electron cutoff energies ($E_{SEC}$) of the bare vs coated conductive substrate, denoted as an interfacial dipole ($\Delta$).

TABLE 1

PAV energy levels and interfacial dipoles measured on Ag, determined from UV-Vis absorption spectroscopy and UPS. The $\Delta$ values are averaged from ≥3 measurements, with ±1 standard deviation.

| PAVs | $E_g$ (eV) | $I_P$ (eV) | $E_A$ (eV) | $\Delta_{Ag}$ (eV) |
|---|---|---|---|---|
| PVBTSB | 1.74 | 5.18 | 3.44 | −0.56 ± 0.05 |
| PVF$_4$SB | 2.19 | 5.48 | 3.29 | −0.67 ± 0.02 |
| PVF$_2$BTSB | 1.79 | 5.30 | 3.51 | −0.63 ± 0.03 |
| PVBT+ | 1.71 | 5.09 | 3.38 | −0.70 ± 0.05 |
| PVF$_4$+ | 2.17 | 5.46 | 3.29 | −0.77 ± 0.06 |
| PVF$_2$BT+ | 1.74 | 5.19 | 3.45 | −0.73 ± 0.07 |
| PVBT− | 1.72 | 5.19 | 3.47 | 0.03 ± 0.03 |
| PVF$_4$− | 2.16 | 5.68 | 3.52 | 0.13 ± 0.03 |
| PVF$_2$BT− | 1.78 | 5.34 | 3.56 | 0.05 ± 0.03 |

TABLE 2

Observed rate constants for HWE trimerization reactions between benzothiadiazole-phosphonate, 5, and zwitterionic benzaldehyde, 19, to give VBTSB. All reactions were done in water at room temperature. Data shown is an average from two experiments.

| | VBTSB | | | | |
|---|---|---|---|---|---|
| [A$_0$] (M) | 0.1 | 0.2 | 0.2 | 0.1 | 0.1 |
| [P$_0$] (M) | 0.1 | 0.2 | 0.1 | 0.2 | 0.1 |
| [B$_0$] (M) | 0.4 | 0.4 | 0.5 | 0.4 | 0.8 |
| k$_{obs}$ (M$^{-2}$ min$^{-1}$) | 0.21 | 0.17 | 0.19 | 0.15 | 0.56 |
| r$^2$ | 0.98 | 0.99 | 0.95 | 0.99 | 0.99 |

TABLE 3

Observed rate constants for HWE trimerization reactions done in water at room temperature, with equivalent amounts of aldehyde ([$A_0$] = 0.1M) and phosphonate ([$P_0$] = 0.1M) and excess base ([$B_0$] = 0.4M). Data shown is an average from two experiments.

| | VBT | | | VF$_4$ | | | VF$_2$BT | | |
|---|---|---|---|---|---|---|---|---|---|
| | SB | + | − | SB | + | − | SB | + | − |
| $k_{obs}$ (M$^{-2}$ min$^{-1}$) | 0.21 | 0.53 | 0.18 | 0.43 | 0.68 | 0.24 | 1.29 | 3.22 | 1.39 |
| r$^2$ | 0.98 | 0.98 | 0.95 | 0.99 | 0.95 | 0.85 | 0.91 | 0.89 | 0.88 |

TABLE 4

Observed rate constants for HWE trimerization reactions done in water at room temperature, with two equivalents of aldehyde ([$A_0$] = 0.2M) relative to phosphonate ([$P_0$] = 0.1M) and excess base ([$B_0$] = 0.4M). Data shown is an average from two experiments.

| | VBT | | | VF$_4$ | | | VF$_2$BT | | |
|---|---|---|---|---|---|---|---|---|---|
| | SB | + | − | SB | + | − | SB | + | − |
| $k_{obs}$ (M$^{-2}$ min$^{-1}$) | 0.19 | 0.23 | 0.09 | 0.44 | 0.54 | 0.15 | 1.89 | 2.29 | 1.00 |
| r$^2$ | 0.95 | 0.84 | 0.89 | 0.96 | 0.94 | 0.88 | 0.95 | 0.85 | 0.94 |

TABLE 5

Observed rate constants for trimerization reactions done in H$_2$O:(DMSO) at room temperature between benzothiadiazole-phosphonate, 5, and zwitterionic benzaldehyde, 19, to give VBTSB, with equivalent amounts of aldehyde ([$A_0$] = 0.1M) and phosphonate ([$P_0$] = 0.1M) and excess base ([$B_0$] = 0.4M). Data shown is an average from two experiments.

| | DMSO (%) | | | | | |
|---|---|---|---|---|---|---|
| VBTSB | 0 | 12.5 | 25 | 37.5 | 50 | 75* |
| $k_{obs}$ (M$^{-2}$ min$^{-1}$) | 0.21 | 0.48 | 1.12 | 2.88 | 21.11 | — |
| r$^2$ | 0.98 | 0.97 | 0.98 | 0.98 | 0.98 | — |

*Reaction was complete by the time one $^{31}$P NMR scan could be measured (~2 mins).

Figure 5:
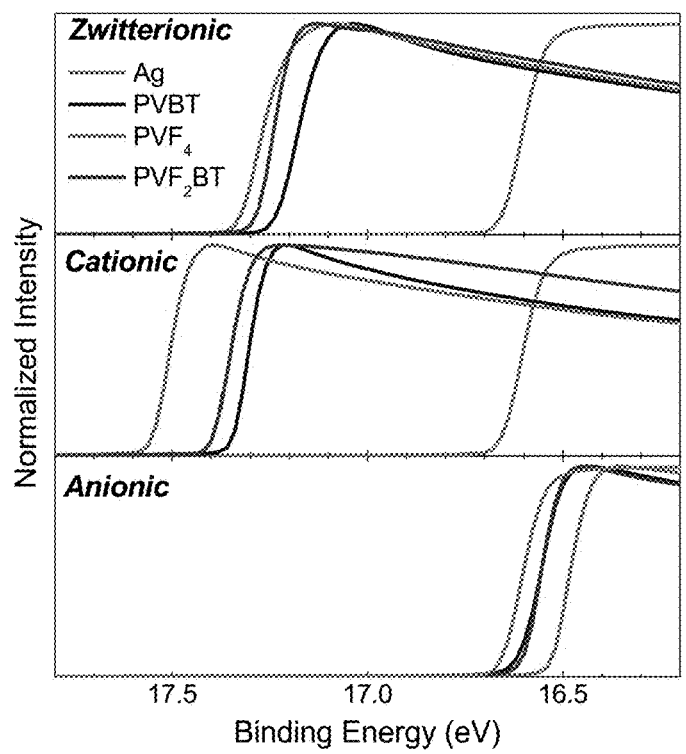
FIG. 5. Representative UPS of thin PAV layers (<5 nm) on silver substrates. Δ values are extracted from the high binding energy region at the onset ($E_{SEC}$). The zwitterionic and cationic PAVs reduce the work function of Ag by ~0.6 to 0.8 eV and the anionic PAVs lead to a small increase in work function of ≤0.1 eV (PVBT− and $PVF_2BT$− traces are overlapping). Binding energies are given with reference to the instrument Fermi level and UPS experiments were run in triplicate.

It was previously shown that CPZs reduce the Φ of Ag (−Δ), a high work function metal, facilitating its use as a cathode in OSCs in place of the lower work function (less stable) Ca/Al. For CPEs, cationic polymers induce a similarly negative Δ, while anionic polymers lead to a positive Δ (increase Φ), and thus find utility as both cathode (cationic CPEs) and anode (anionic CPEs) modification layers in optoelectronics. (Seo, et al. J. Am. Chem. Soc. 2008, 130, 10042-10043.) The zwitterionic, cationic and anionic PAVs prepared in this work were coated as ultra-thin layers (<5 nm) onto freshly deposited Ag substrates and characterized by UPS (FIG. 5). The zwitterionic and cationic PAVs resulted in a substantial decrease in Φ (Δ≈−0.6 to −0.8 eV), while the anionic CPEs produced little change, noting only a minor increase in 0 of both Ag and ITO (Δ≤0.1 eV) (Table 6 for UPS data of anionic PAVs on ITO).

TABLE 6

Anionic PAV energy levels and interfacial dipoles measured on an ITO substrate, determined from a combination of UV-Vis absorption spectroscopy and UPS. Δ values given are averages from ≥3 measurements, with ±1 standard deviation.

| PAVs | $E_g$ (eV) | $I_P$ (eV) | $E_A$ (eV) | $Δ_{ITO}$ (eV) |
|---|---|---|---|---|
| PVBT− | 1.72 | 5.19 | 3.47 | −0.02 ± 0.04 |
| PVF$_4$− | 2.16 | 5.68 | 3.52 | 0.15 ± 0.02 |
| PVF$_2$BT− | 1.78 | 5.34 | 3.56 | 0.00 ± 0.04 |

Amplified Quenching Response

Figure 6:
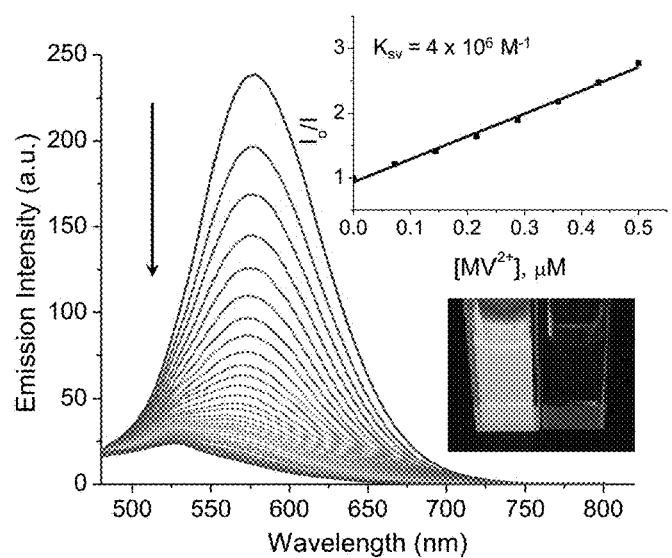
FIG. 6. Evolution of the PL spectrum of $PVF_4-$ with added $MV^{2+}$ quencher, the respective Stern-Volmer plot, and photograph of the polymer solutions in water with (left) and without (right) quencher.
Figure 18:
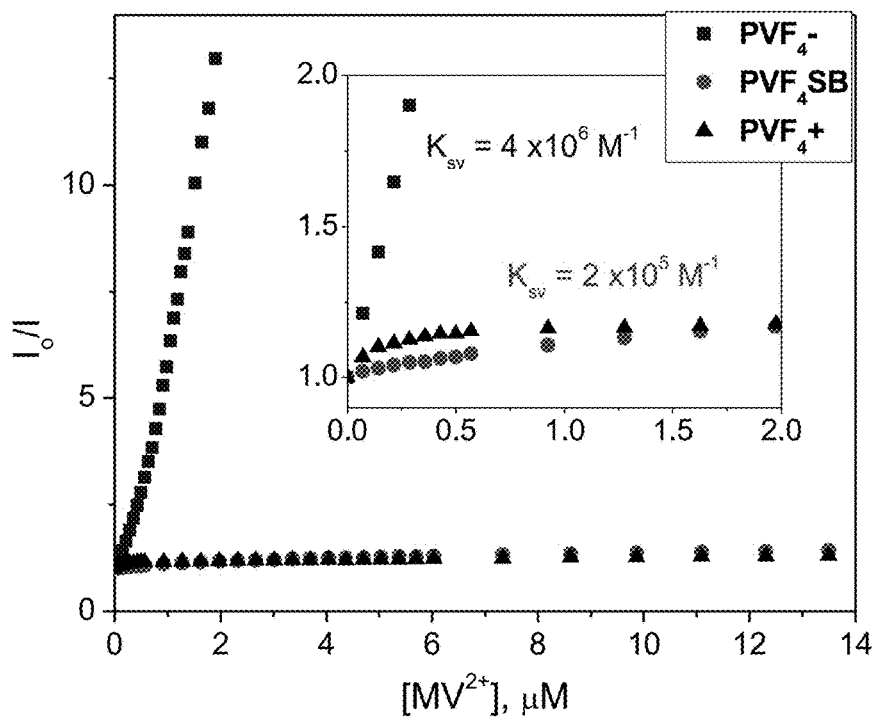
FIG. 18. Stern-Volmer plots for polymers $PVF_4SB$ (zwitterion), $PVF_4+$ (cation), and PVF– (anion) and the respective Stern-Volmer quenching constants.

Due to their inherent photoluminescence and structural tunability, CPEs are interesting for chemo- and bio-sensing based on electrostatic, van der Waals, and substrate specific (antigen-antibody, biotin-avidin) interactions, exploiting fluorescence 'turn-on' and 'turn-off' mechanisms. (Jiang, et al. Angew. Chem. Int. Ed. 2009, 48 (24), 4300-4316.) Implementation of these sensing strategies relies on amplified quenching, where high PL quenching efficiency is achieved at low quencher/analyte concentrations. The tetrafluorobenzene polymer family (PVF$_4$) produced by aqueous HWE coupling was subjected to Stem-Volmer photoluminescence quenching experiments using methyl viologen (MV$^{2+}$) dichloride as a cationic quencher (FIGS. 6 and 18). Notably, PVF$_4$− exhibited a relatively strong amplified quenching response with K$_{sv}$=4×10$^6$ M$^{-1}$, comparable to state-of-the-art CPEs (~10$^6$-10$^7$ M$^{-1}$).[43,44] At a MV$^{2+}$ concentration of 0.3 μM, approximately 50% of the polymer PL intensity was quenched, corresponding to 1 quencher molecule per ~20 polymer repeat units. Additionally, it was observed that ca. 3 μM MV$^{2+}$ effectively quenched 95% of the PL intensity.

The high quenching efficiency of the PVF$_4$− results from ion-complexation between MV$^{2+}$ and the polymer repeat units, effectively increasing the local concentration of the quencher ion. More importantly, high quenching efficiency indicated exciton delocalization and rapid migration along the polymer chain, increasing the effective sphere of action of the quencher molecule. High MV$^{2+}$ concentrations enhanced quenching (as shown in FIG. 18), likely arising from complexation (and thus aggregation) of two polymer chains with one MV$^{2+}$ quencher. (Wang, et al. Langmuir 2001, 17, 1262-1266.) As expected, only moderate amplification was exhibited for the zwitterionic derivative, PVF$_4$SB, (K$_{sv}$=2×10$^5$ M$^{-1}$), with the PL intensity attenuation essentially similar to that exhibited by the cationic polyelectrolyte, PVF$_4$+ (16% and 18% PL quenching at ca. 3 μM MV$^{2+}$) (FIG. 18). Negative deviation from the Stern-Volmer relationship was characteristic of both the cationic and zwitterionic polymers, in accord with the hindered chromophore access, possibly due to electrostatic repulsion between the quencher ion and the polymer side chains. (Principles of Fluorescence Spectroscopy, 3rd ed. Lakowicz, J. R. Springer, 2006, pp 954.) The efficient fluorescence 'turn-off' of PVF$_4$− CPEs, coupled with their inherent water solubility, underscores their potential for continued examination in chemo- and bio-sensing.

Polymer Solar Cells (PSCs)

Figure 7:
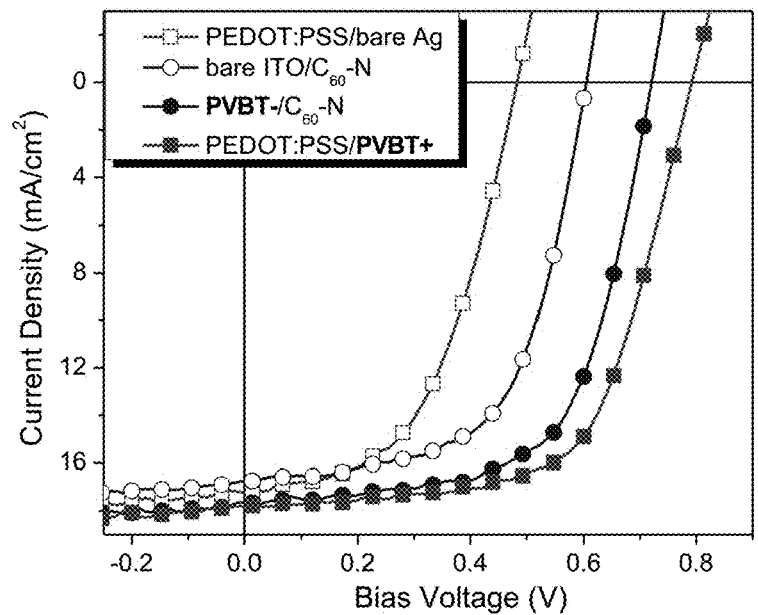
FIG. 7. OPV device performance for ITO/AML/PBDTT-TT:$PC_{71}$BM/CML/Ag architecture, where AML represents anode modification layer (either PEDOT:PSS or PVBT–) and CML represents cathode modification layer ($C_{60}$—N or PVBT+).
Figure 19:
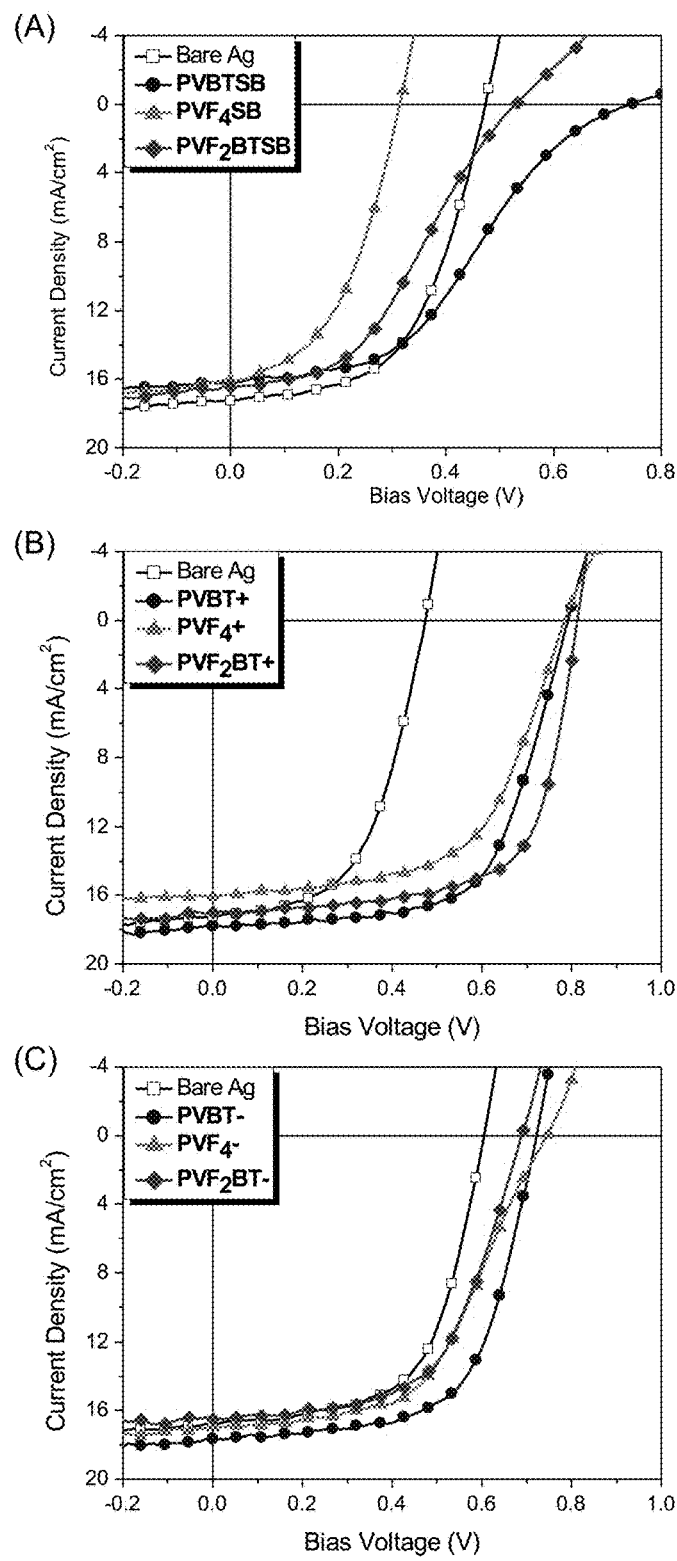
FIG. 19. OPV device performance for ITO/AML/PBDTT-TT:$PC_{71}$BM/CML/Ag architecture, where AML represents anode interlayer (either PEDOT:PSS or PAV) and CML represents cathode interlayer ($C_{60}$—N or PAV). (A) zwitterionic PAVs; (B) cationic PAVs; (C) anionic PAVs.
Figure 20:
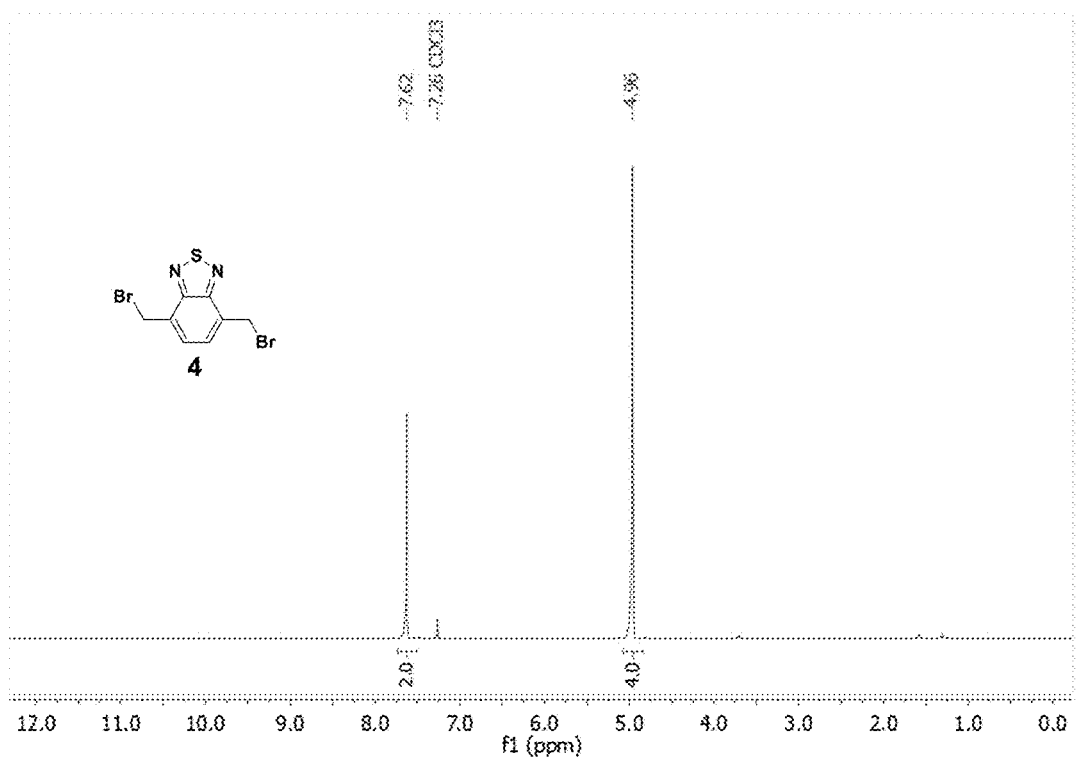
FIG. 20. $^1$H NMR of 4,7-Bis(bromomethyl)benzo[c][1,2,5]thiadiazole (4) in $CDCl_3$.
Figure 21:
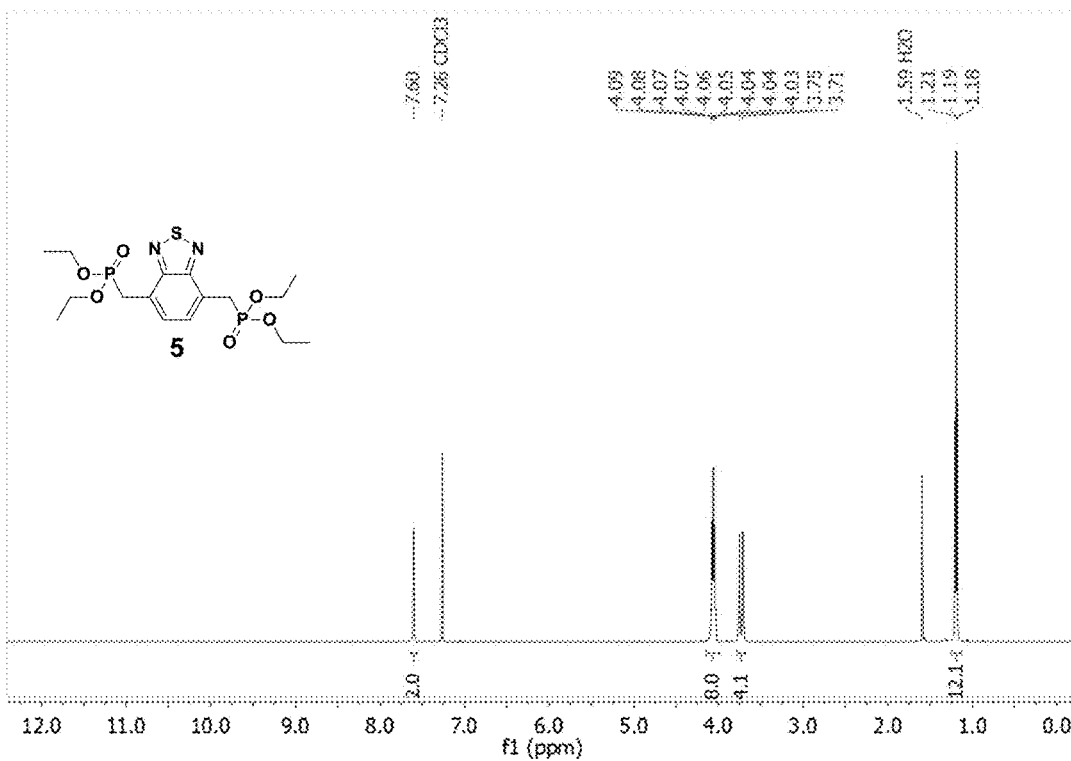
FIG. 21. $^1$H NMR of Tetraethyl (benzo[c][1,2,5]thiadiazole-4,7-diylbis(methylene))bis (phosphonate) (5) in $CDCl_3$.
Figure 22:
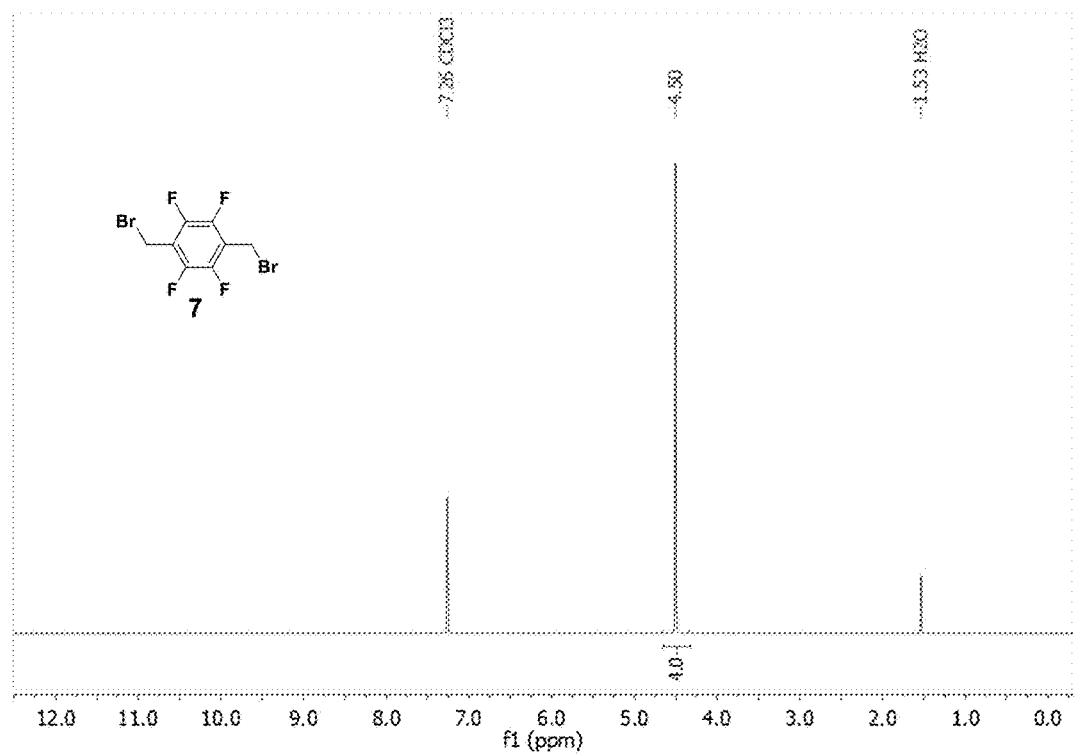
FIG. 22. $^1$H NMR of 1,4-Bis(bromomethyl)-2,3,5,6-tetrafluorobenzene (7) in $CDCl_3$.
Figure 23:
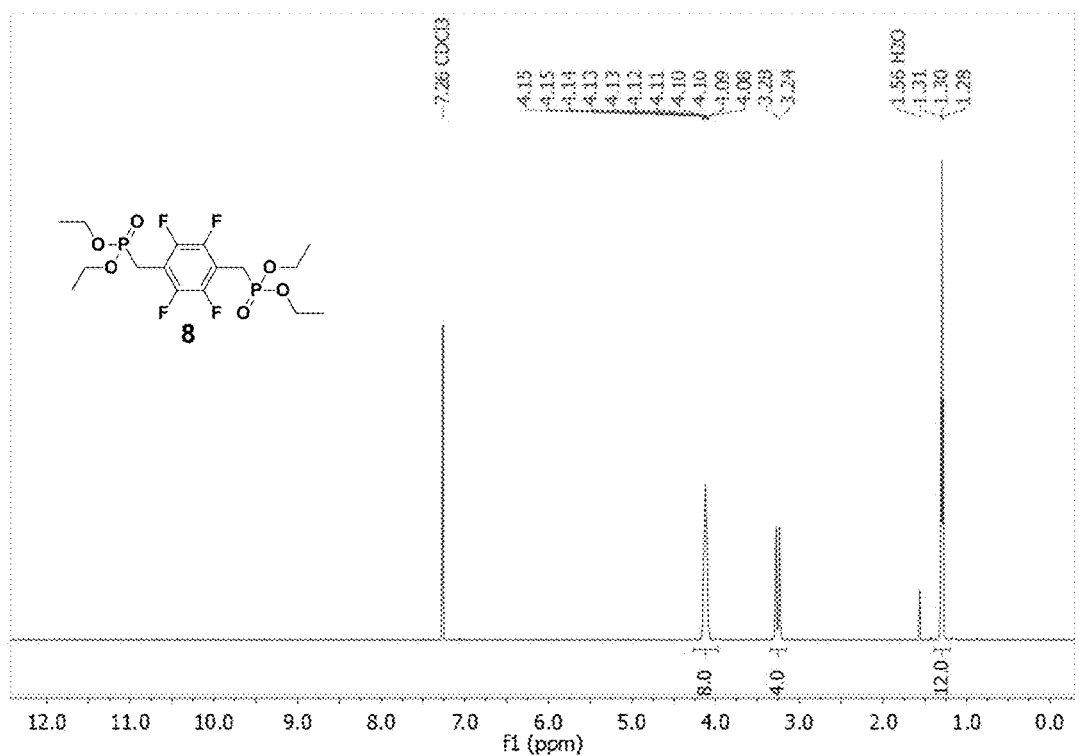
FIG. 23. $^1$H NMR of Tetraethyl ((perfluoro-1,4-phenylene)bis(methylene))bis(phosphonate) (8) in $CDCl_3$.
Figure 24:
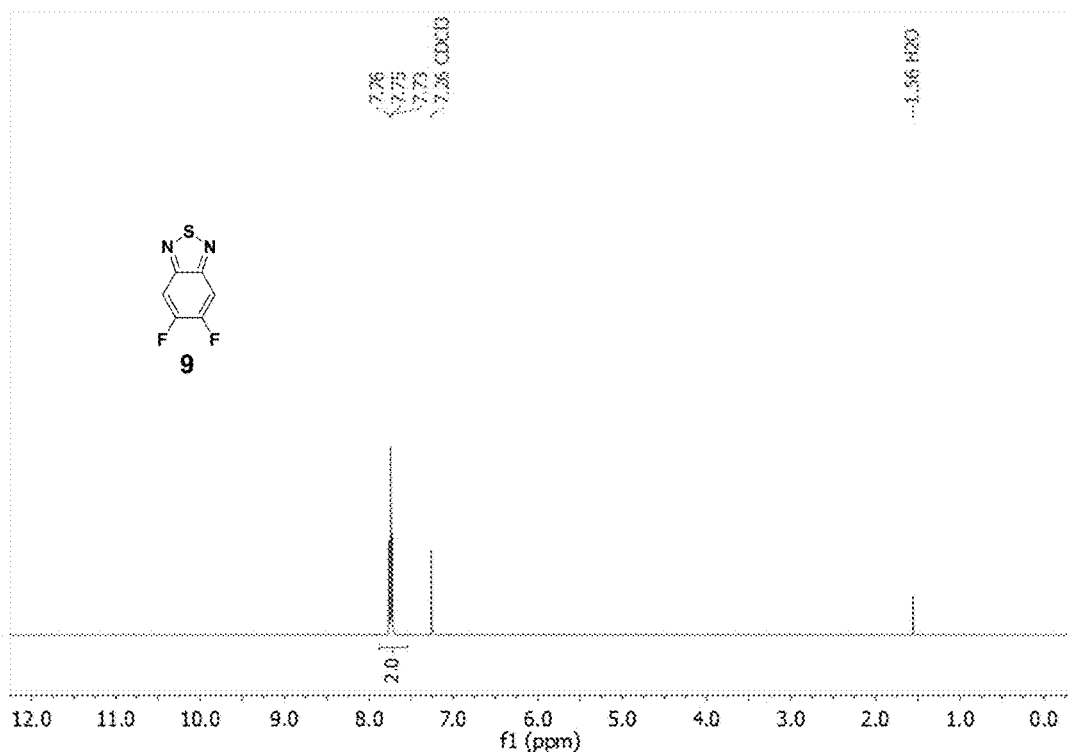
FIG. 24. $^1$H NMR of 5,6-Difluorobenzo[c][1,2,5]thiadiazole (9) in $CDCl_3$.
Figure 25:
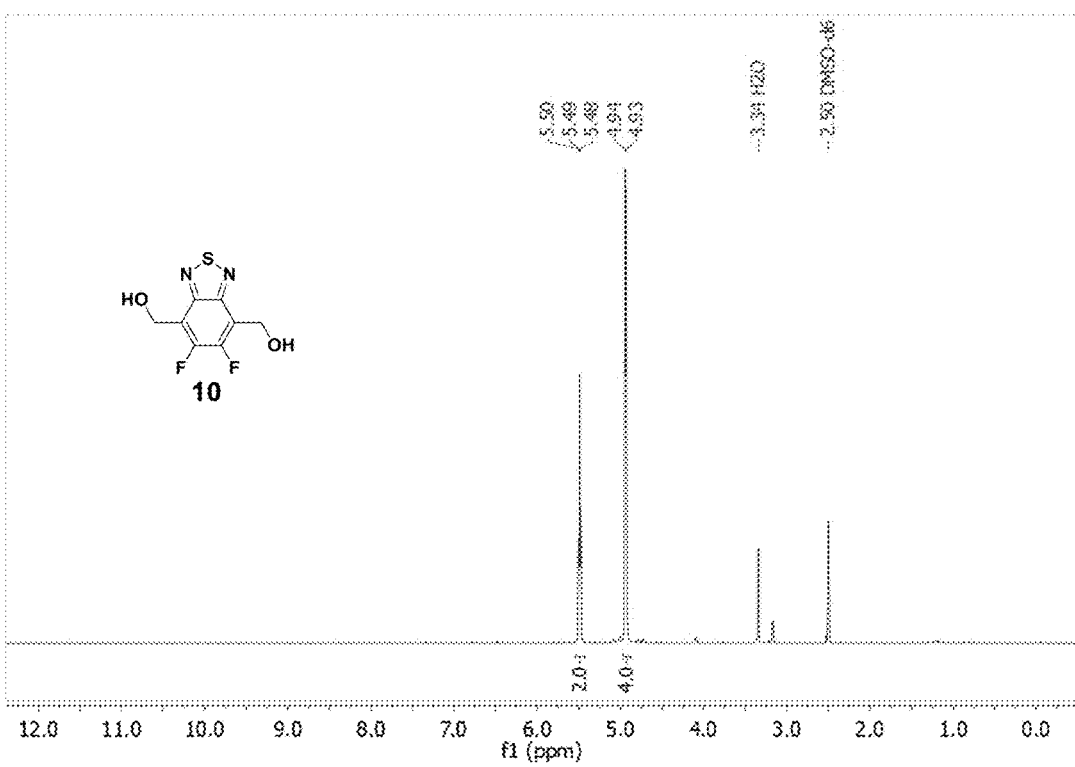
FIG. 25. $^1$H NMR of (5,6-Difluorobenzo[c][1,2,5]thiadiazole-4,7-diyl)dimethanol (10) in DMSO-d6.
Figure 26:
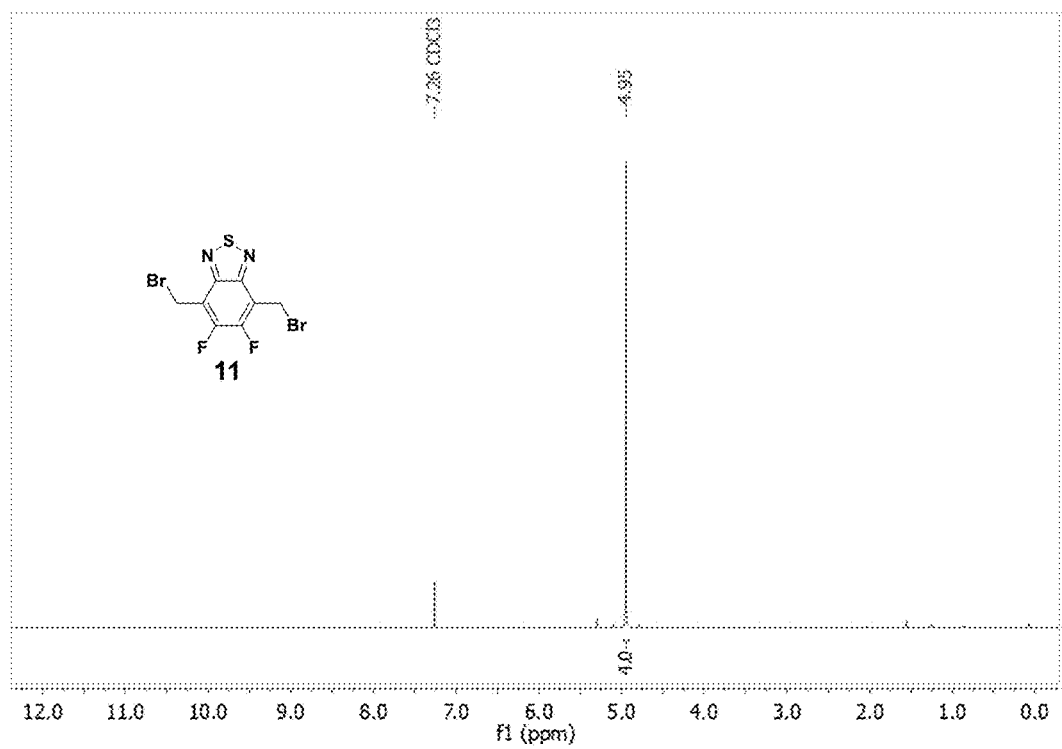
FIG. 26. $^1$H NMR of 4,7-Bis(bromomethyl)-5,6-difluorobenzo[c][1,2,5]thiadiazole (11) in $CDCl_3$.
Figure 27:
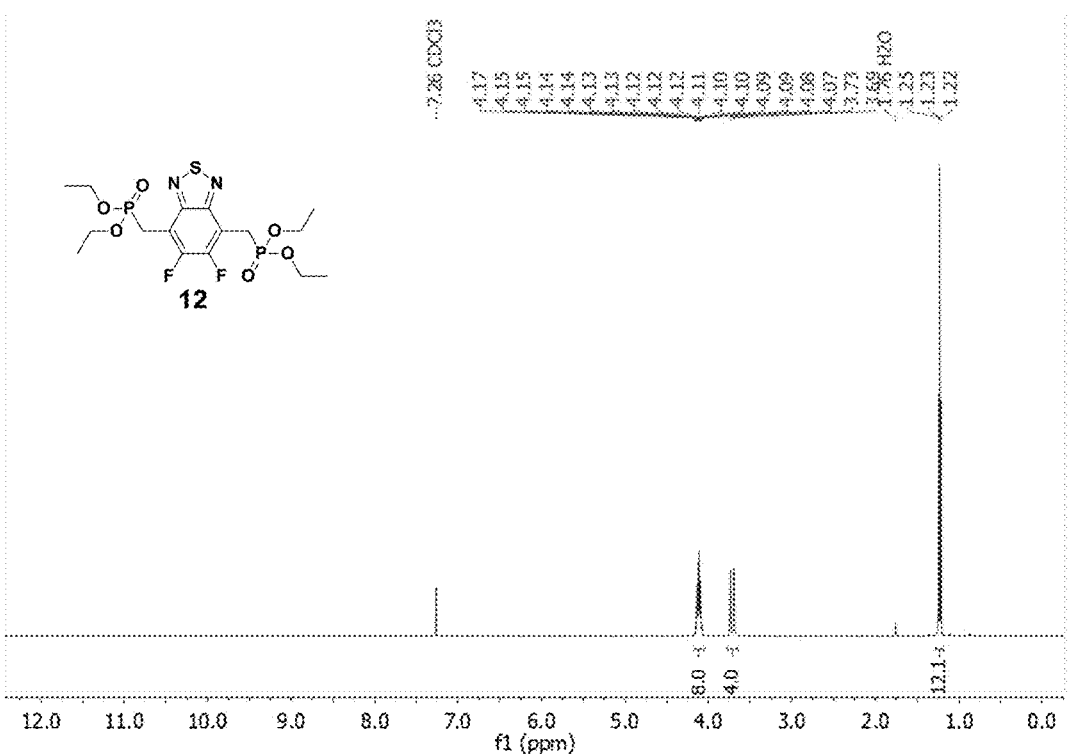
FIG. 27. $^1$H NMR of Tetraethyl ((5,6-difluorobenzo[c][1,2,5]thiadiazole-4,7-diyl)bis(methylene))bis (phosphonate) (12) in $CDCl_3$.
Figure 28:
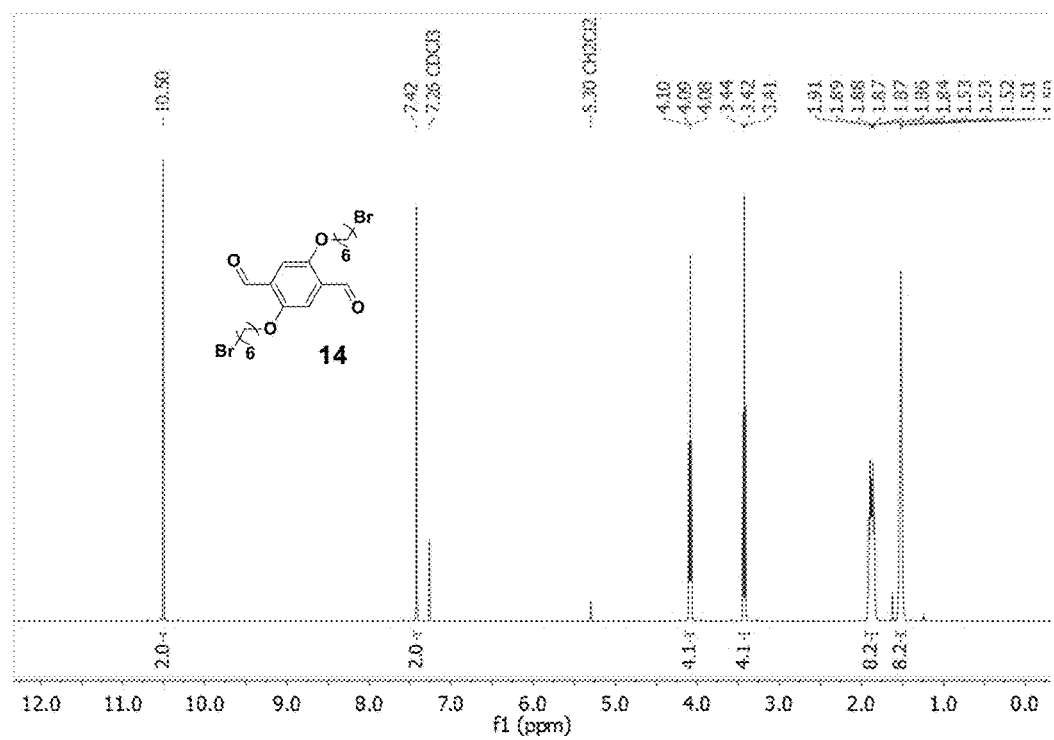
FIG. 28. $^1$H NMR of 2,5-bis((6-bromohexyl)oxy)terephthalaldehyde (14) in $CDCl_3$.
Figure 29:
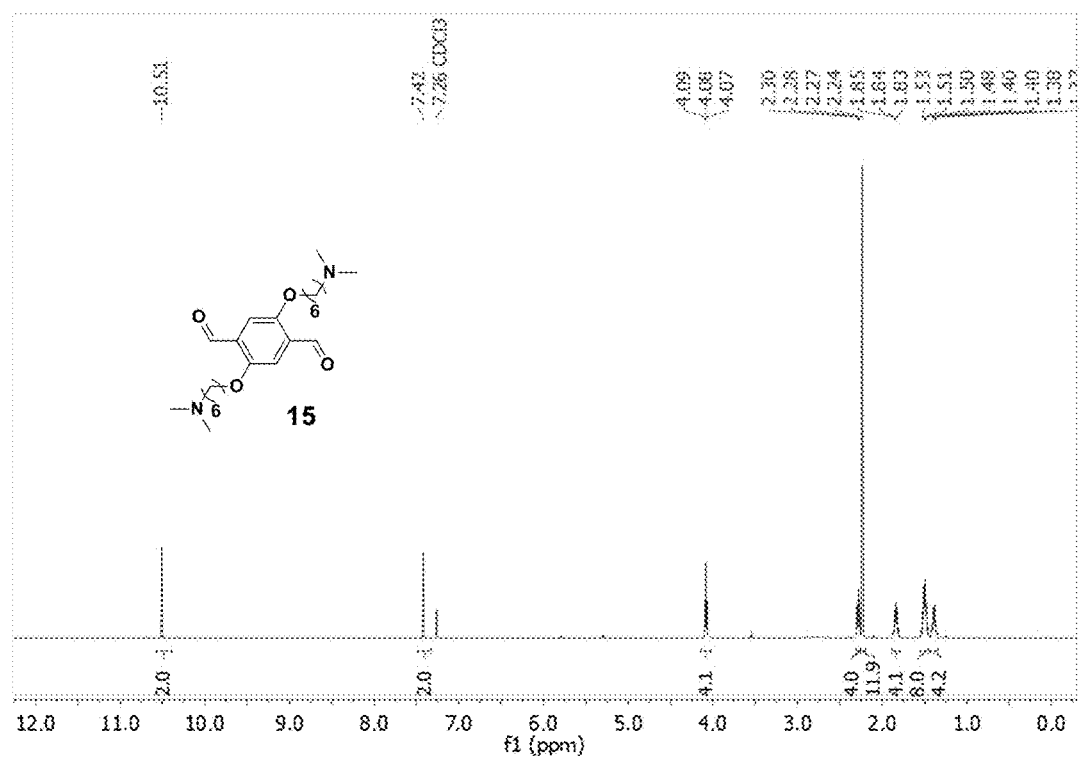
FIG. 29. $^1$H NMR of 2,5-bis((6-(dimethylamino)hexyl)oxy)terephthalaldehyde (15) in $CDCl_3$.
Figure 30:
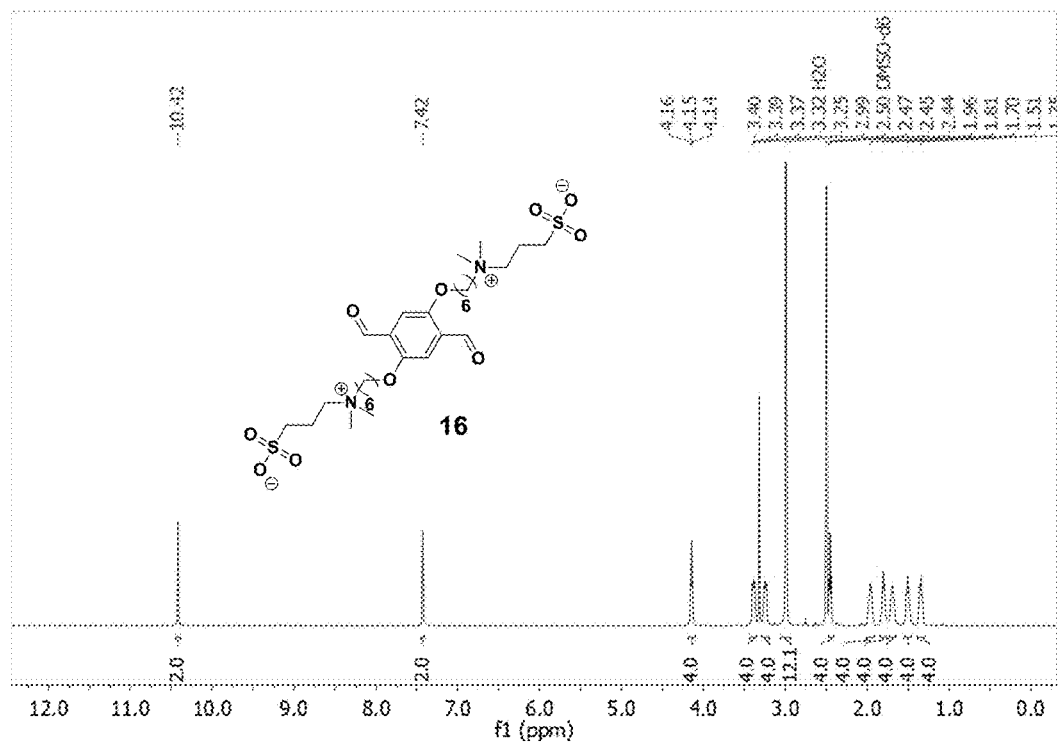
FIG. 30. $^1$H NMR of 3,3'-(((((2,5-Diformyl-1,4-phenylene)bis(oxy))bis(hexane-6,1-diyl))bis(dimethylammonionediyl))bis(propane-1-sulfonate) (16) in DMSO-d6.
Figure 31:
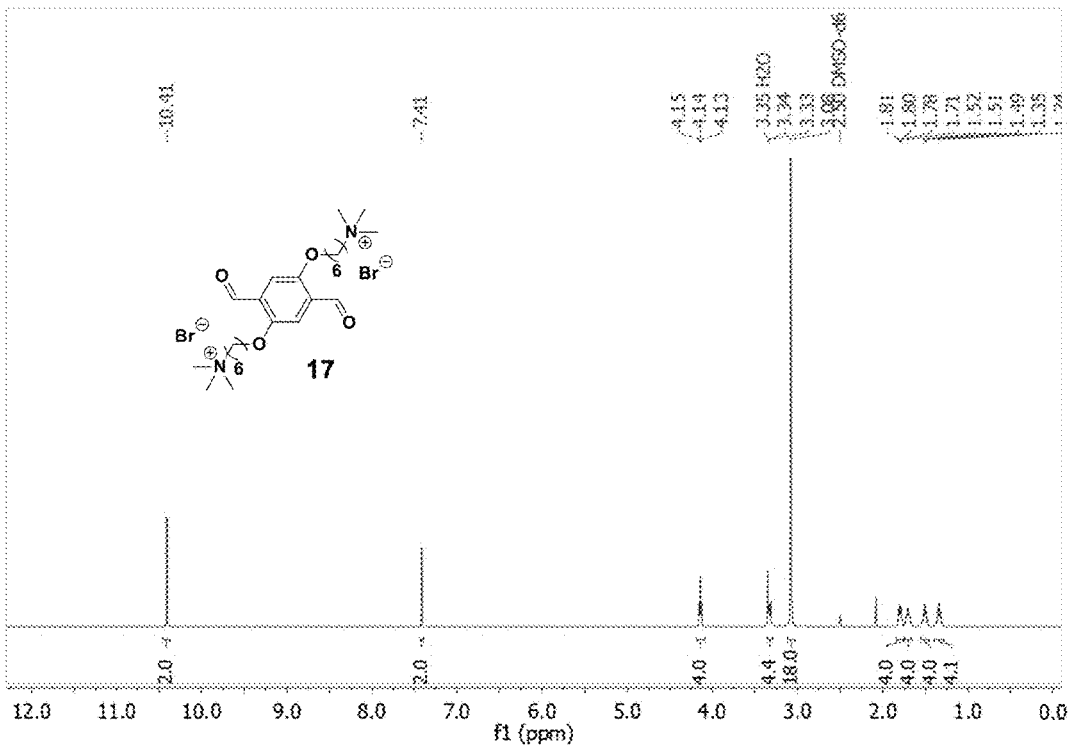
FIG. 31. $^1$H NMR of 6,6'-((2,5-Diformyl-1,4-phenylene)bis(oxy))bis(N,N,N-trimethylhexan-1-aminium) bromide (17) in DMSO-d6.
Figure 32:
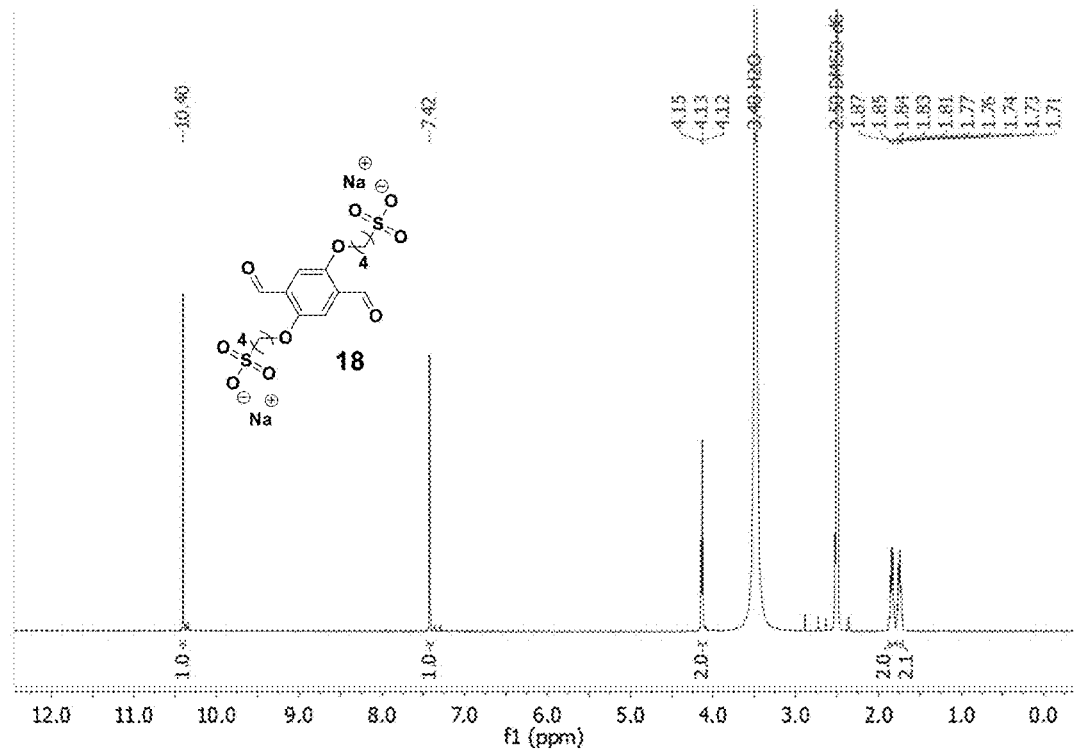
FIG. 32. $^1$H NMR of Sodium 4,4'-((2,5-diformyl-1,4-phenylene)bis(oxy))bis(butane-1-sulfonate) (18) in DMSO-d6.
Figure 33:
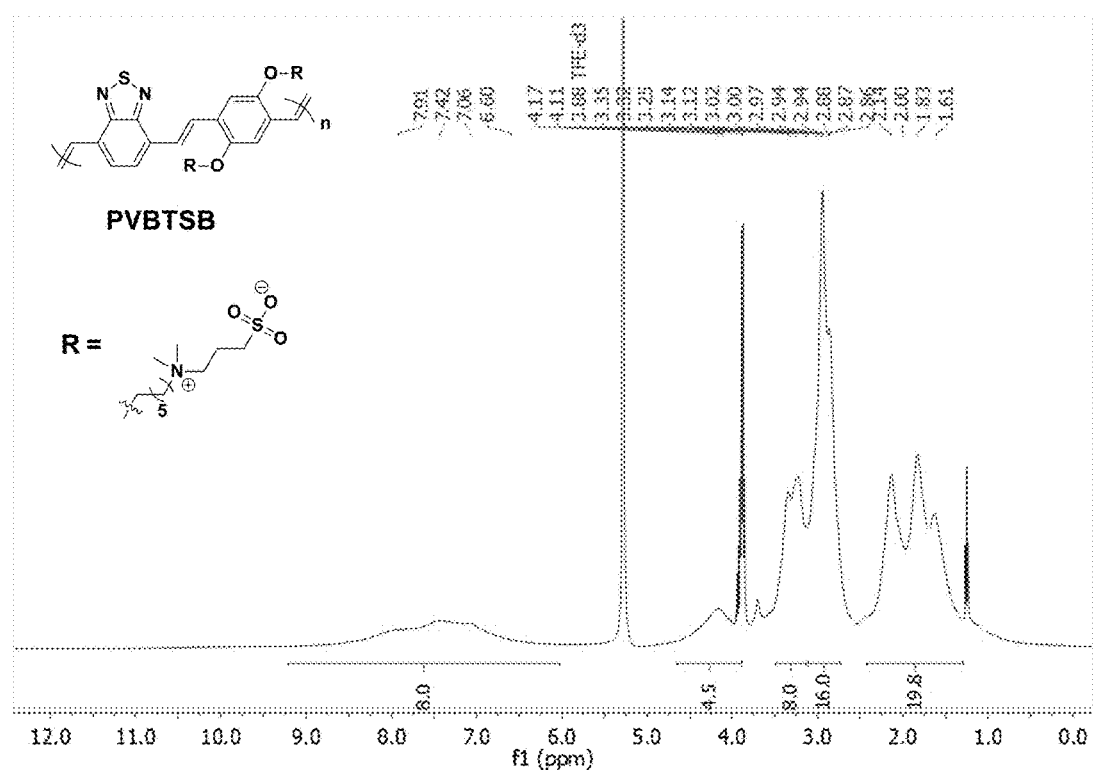
FIG. 33. $^1$H NMR of PVBTSB in TFE-d3.
Figure 34:
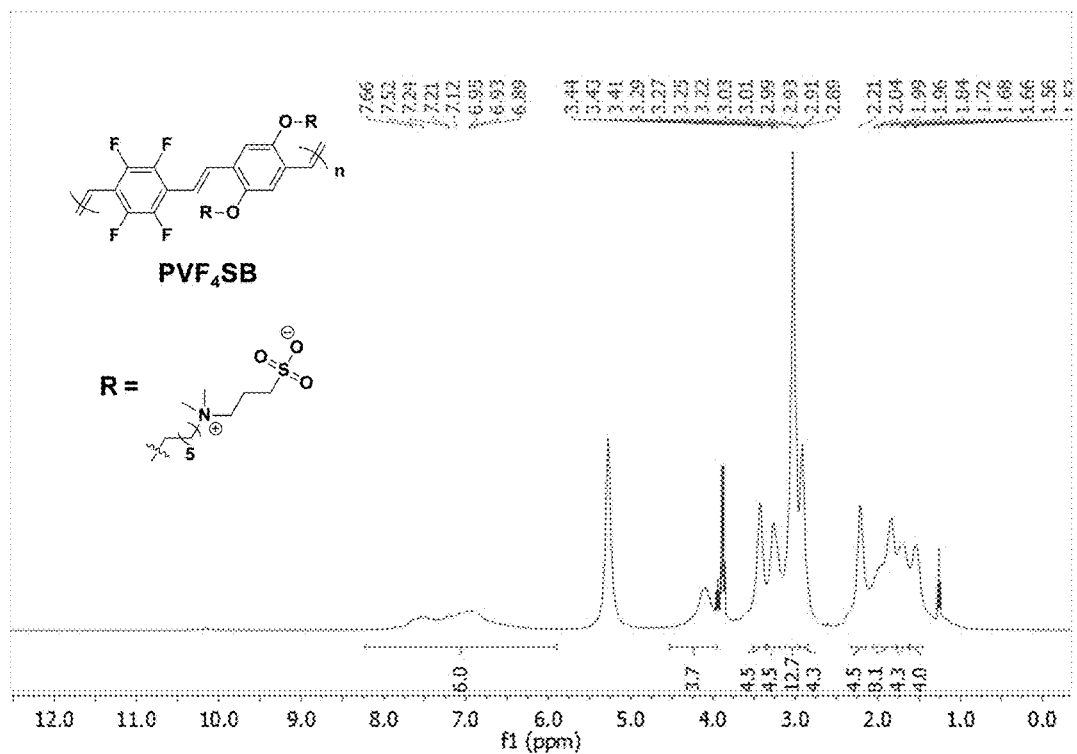
FIG. 34. $^1$H NMR of $PVF_4SB$ in TFE-d3.
Figure 35:
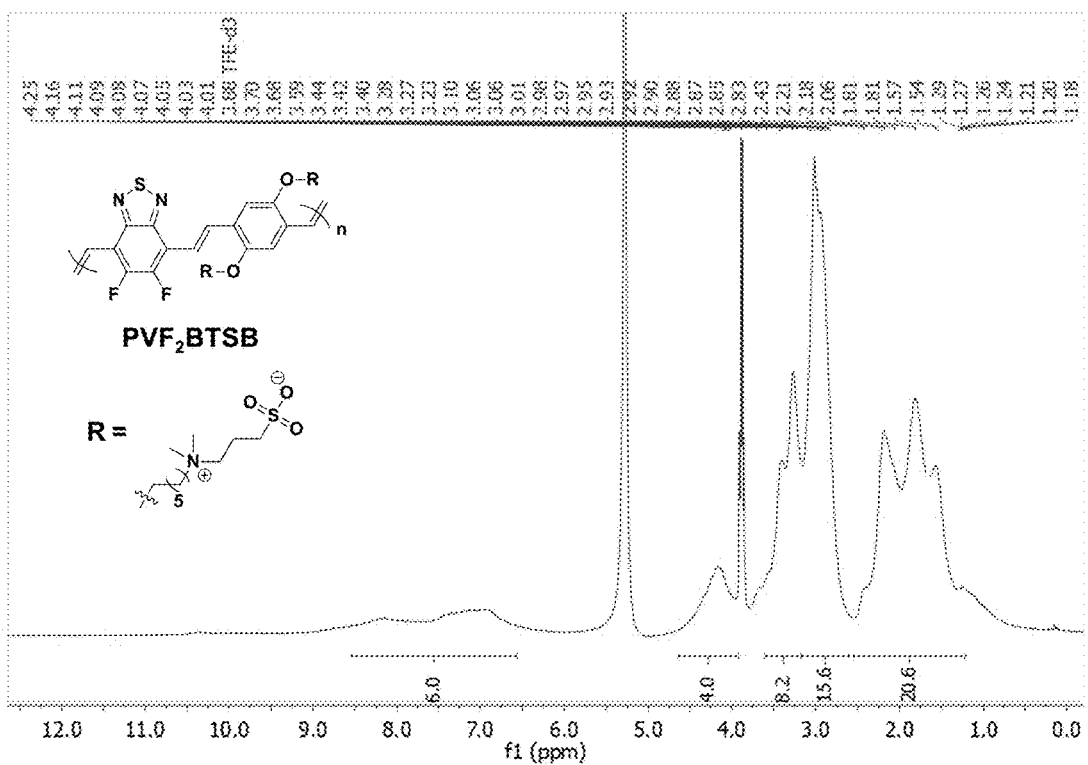
FIG. 35. $^1$H NMR of $PVF_2BTSB$ in TFE-d3.
Figure 36:
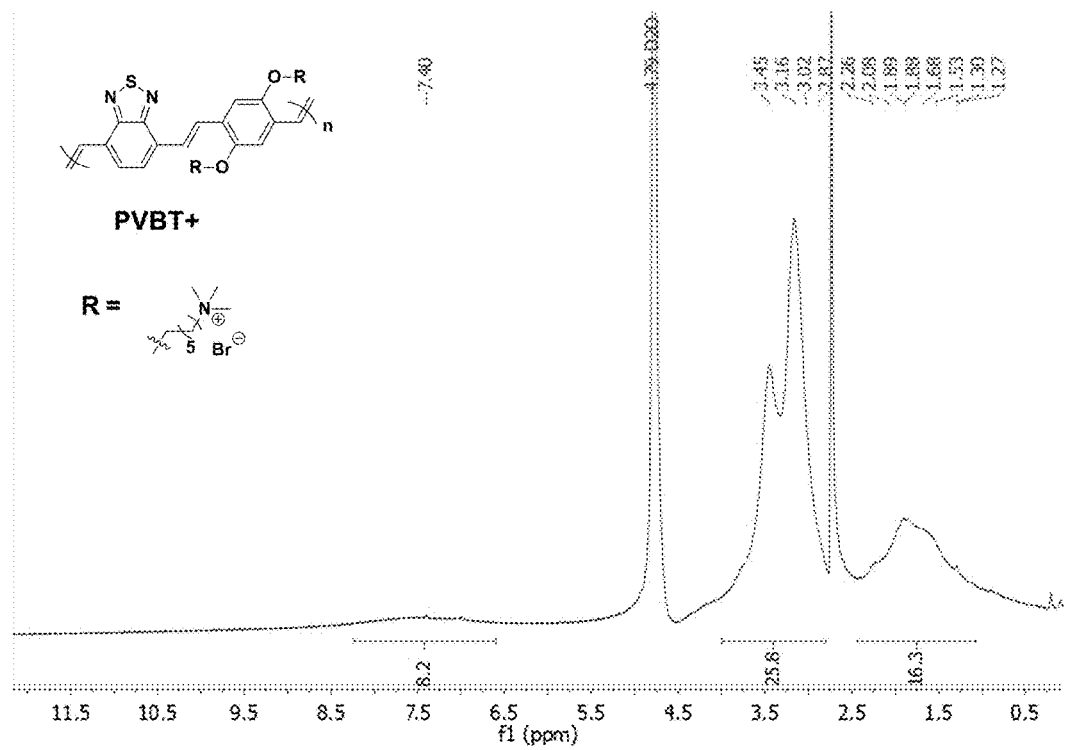
FIG. 36. $^1$H NMR of PVBT+ in $D_2O$.
Figure 37:
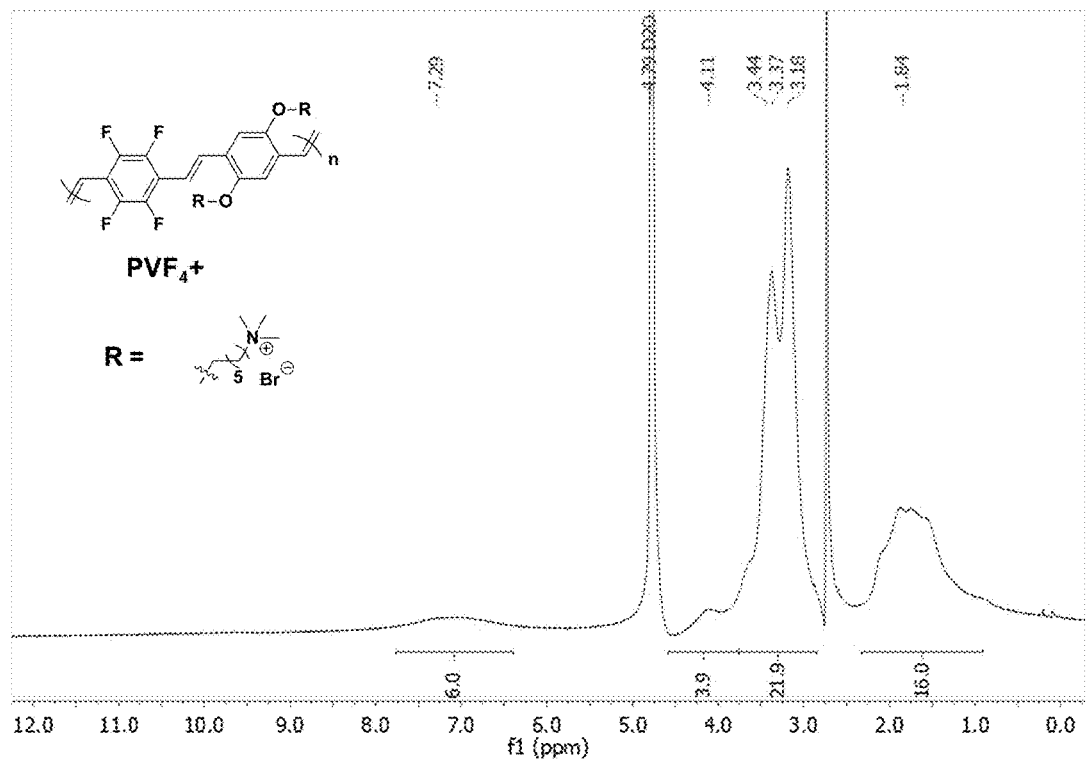
FIG. 37. $^1$H NMR of $PVF_4+$ in $D_2O$.
Figure 38:
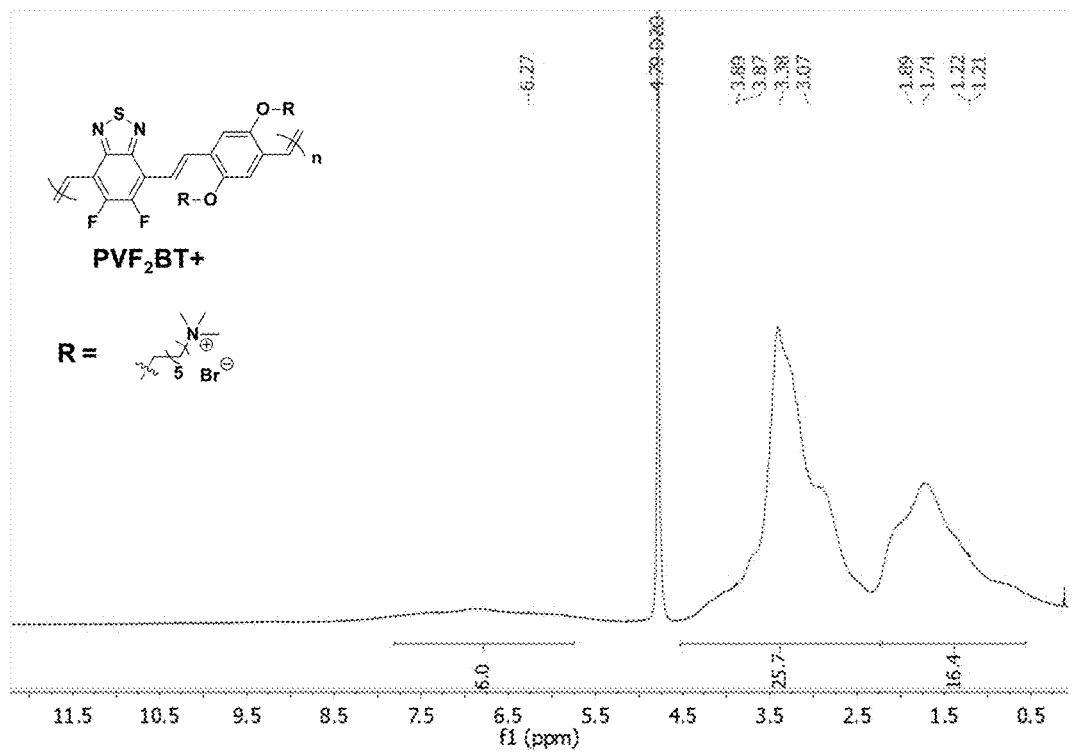
FIG. 38. $^1$H NMR of $PVF_2BT+$ in $D_2O$.
Figure 39:
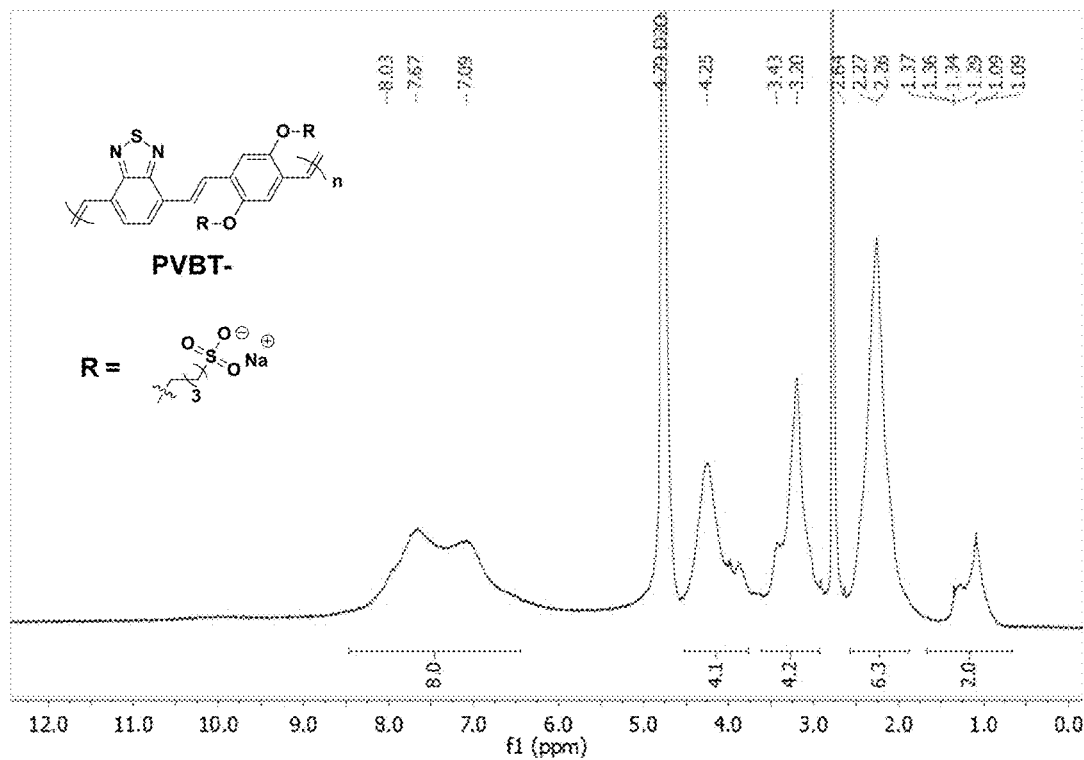
FIG. 39. $^1$H NMR of PVBT– in $D_2O$.
Figure 40:
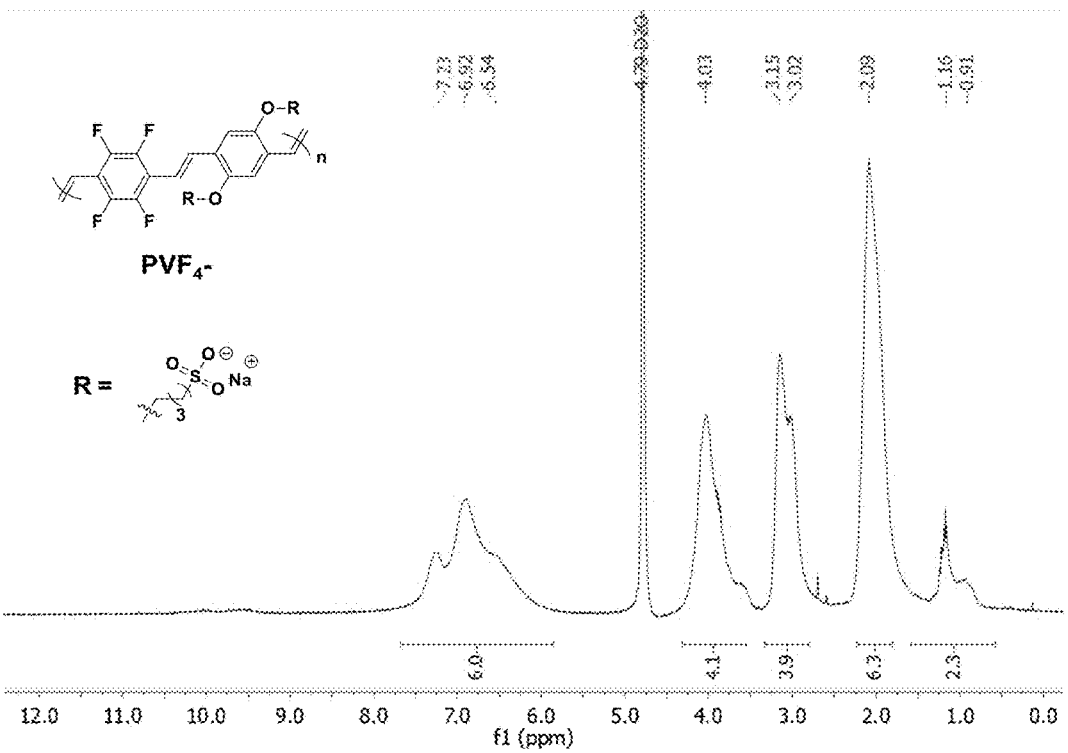
FIG. 40. $^1$H NMR of $PVF_4-$ in $D_2O$.
Figure 41:
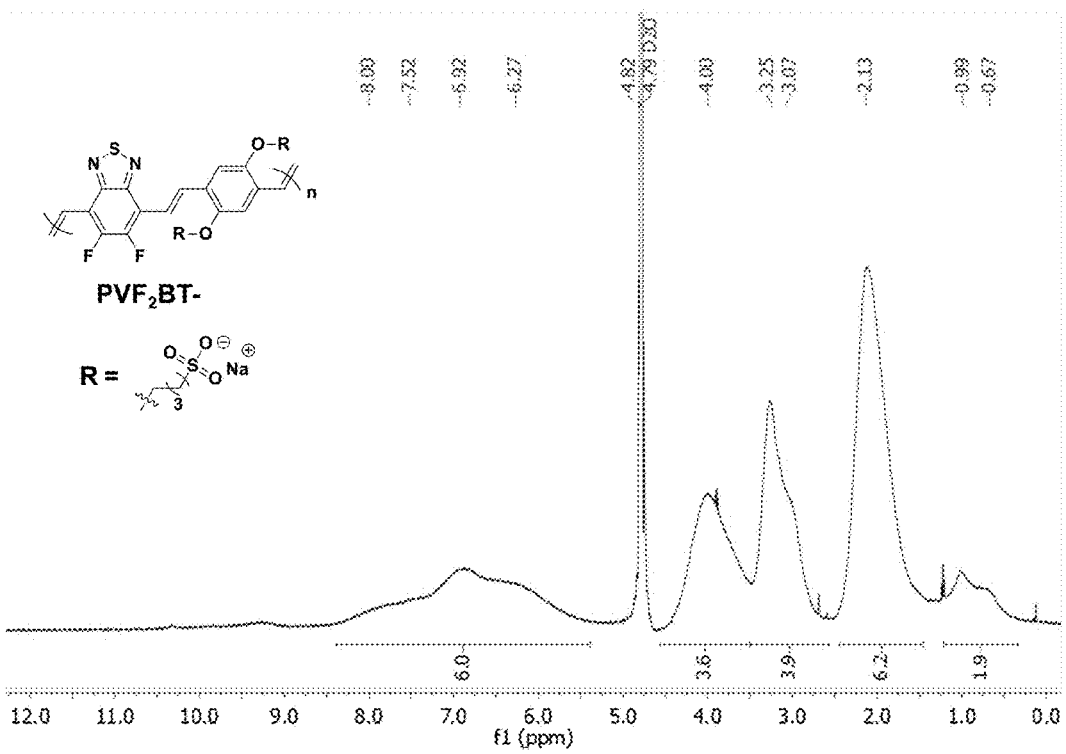
FIG. 41. $^1$H NMR of $PVF_2BT-$ in $D_2O$.
Figure 42:
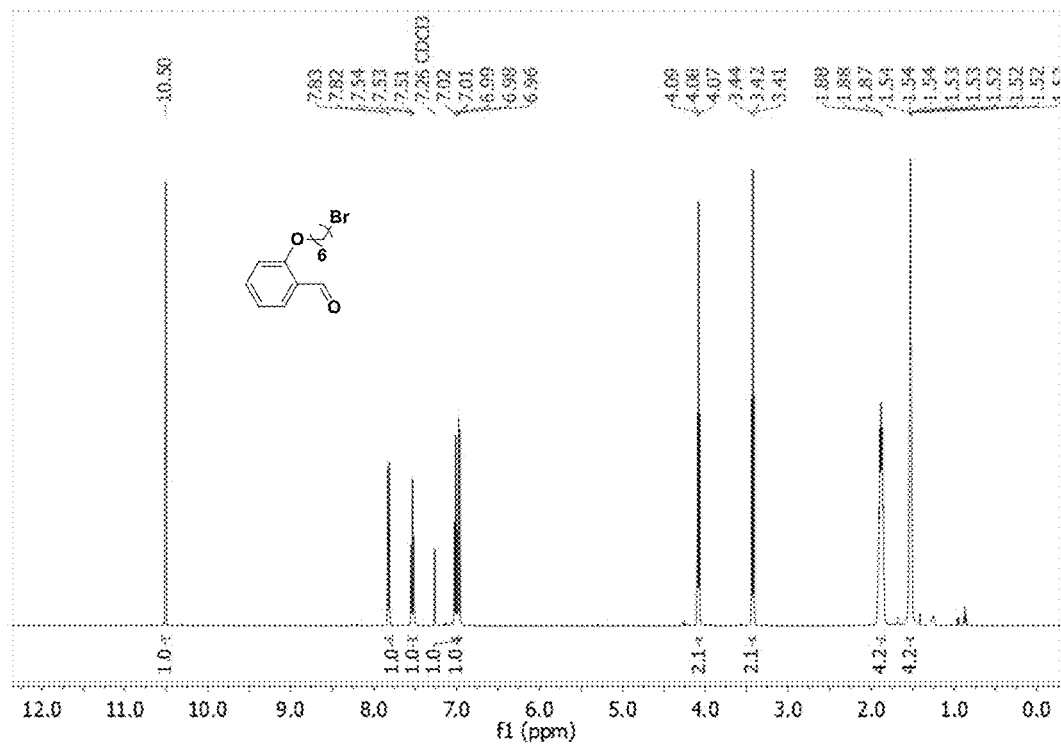
FIG. 42. $^1$H NMR of 2-((6-bromohexyl)oxy)benzaldehyde in $CDCl_3$.
Figure 43:
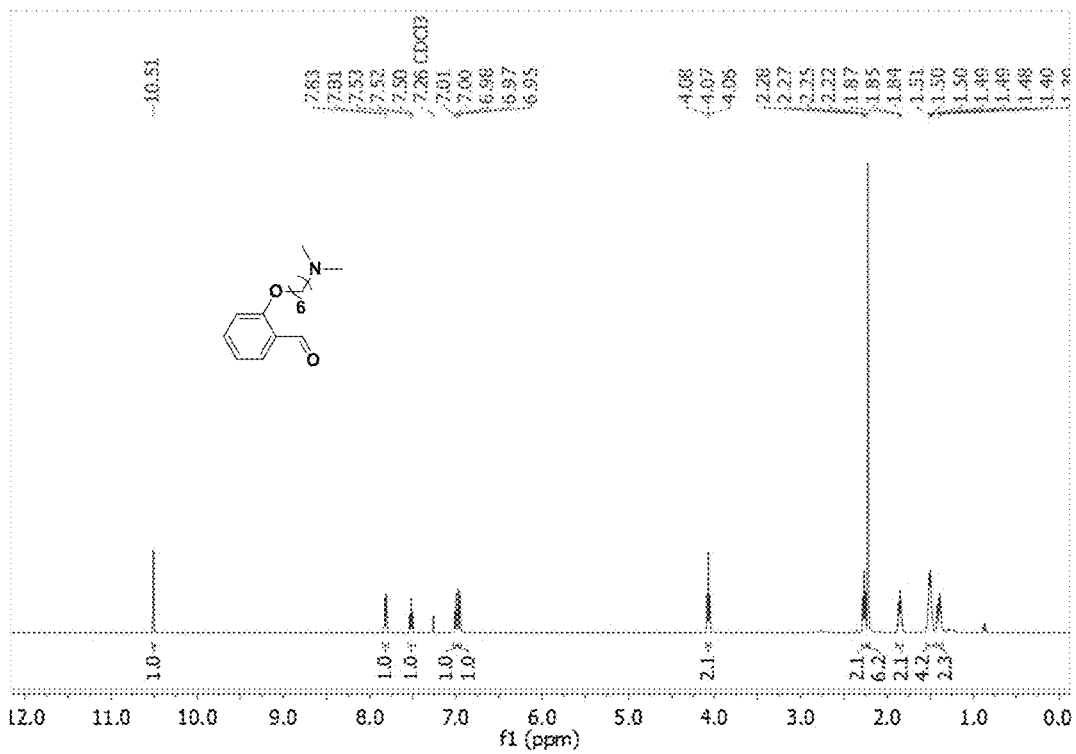
FIG. 43. $^1$H NMR of 2-((6-(dimethylamino)hexyl)oxy) benzaldehyde in $CDCl_3$.
Figure 44:
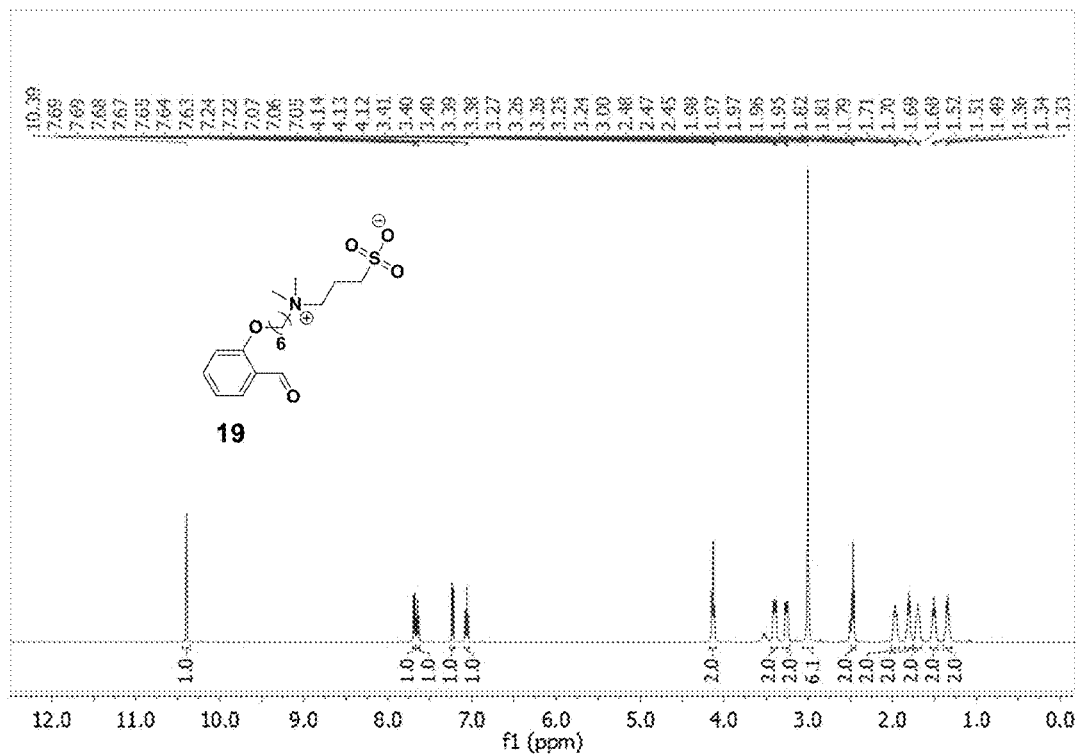
FIG. 44. $^1$H NMR of 3-((6-(2-Formylphenoxy)hexyl) dimethylammonio)propane-1-sulfonate (19) in DMSO-d6.
Figure 45:
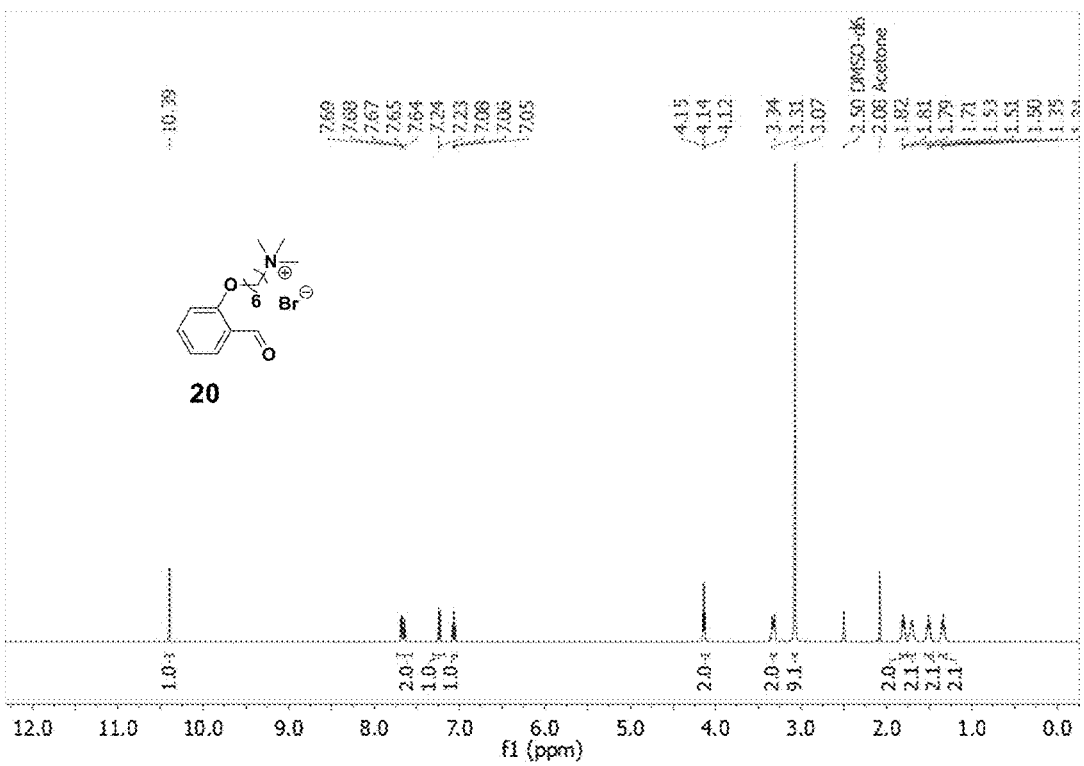
FIG. 45. ¹H NMR of 6-(2-Formylphenoxy)-N,N,N-trimethylhexan-1-aminium bromide (20) in DMSO-d6.
Figure 46:
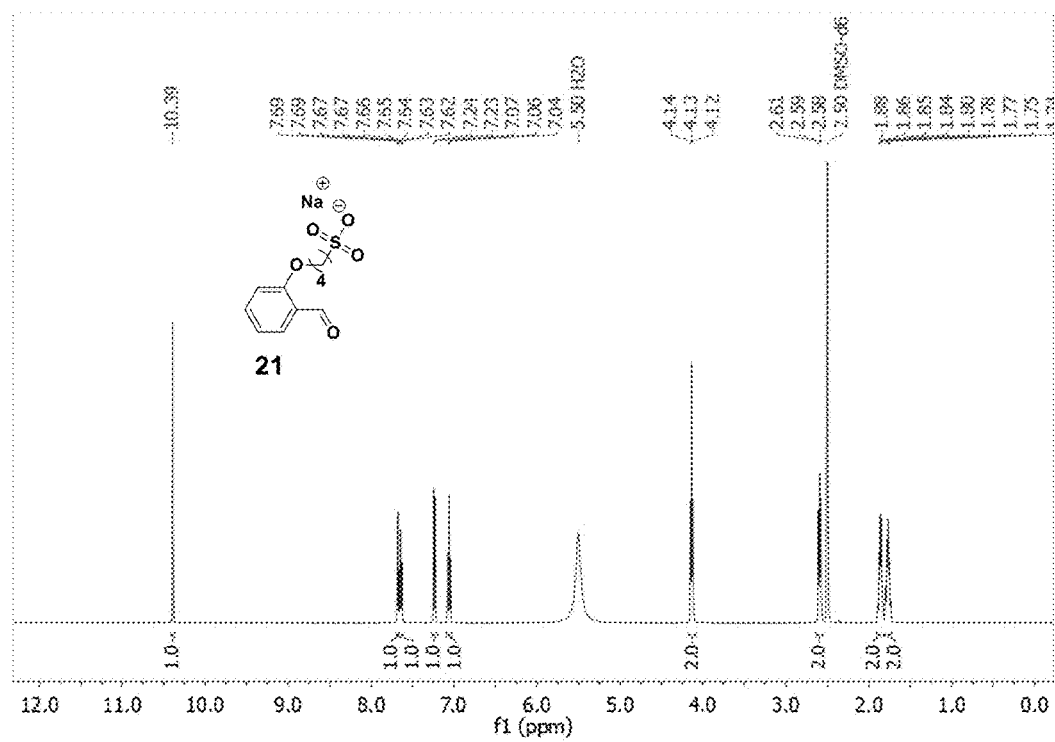
FIG. 46. ¹H NMR of Sodium 4-(2-formylphenoxy)butane-1-sulfonate (21) in DMSO-d6.
Figure 47:
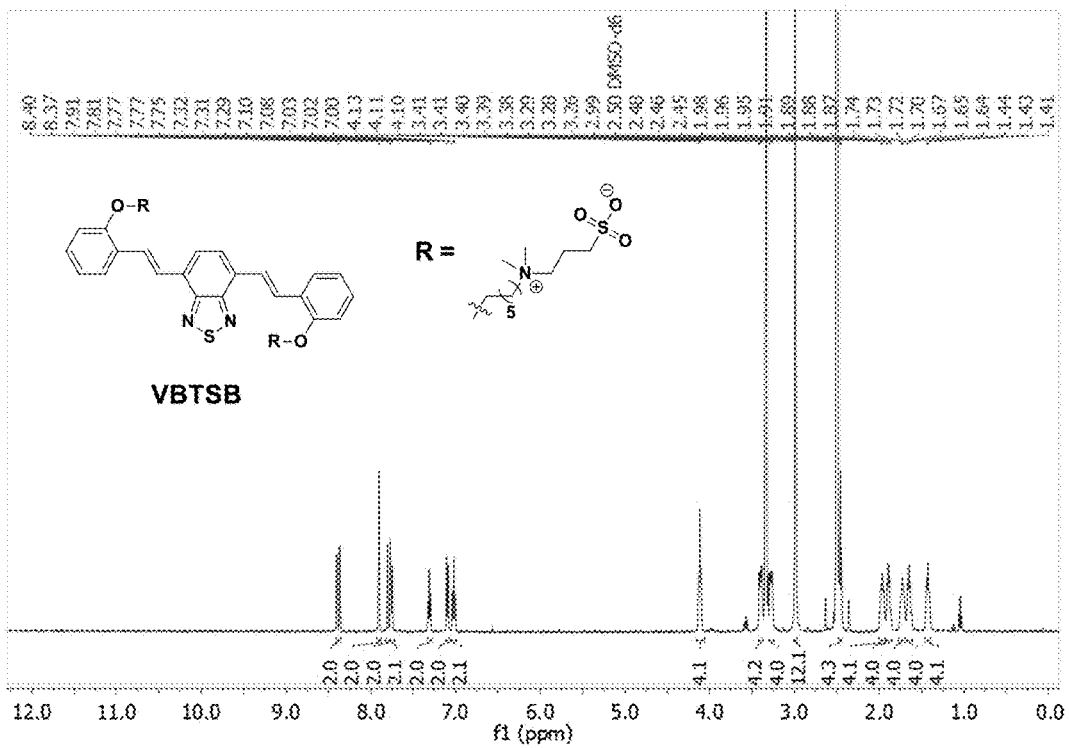
FIG. 47. ¹H NMR of VBTSB in DMSO-d6.
Figure 48:
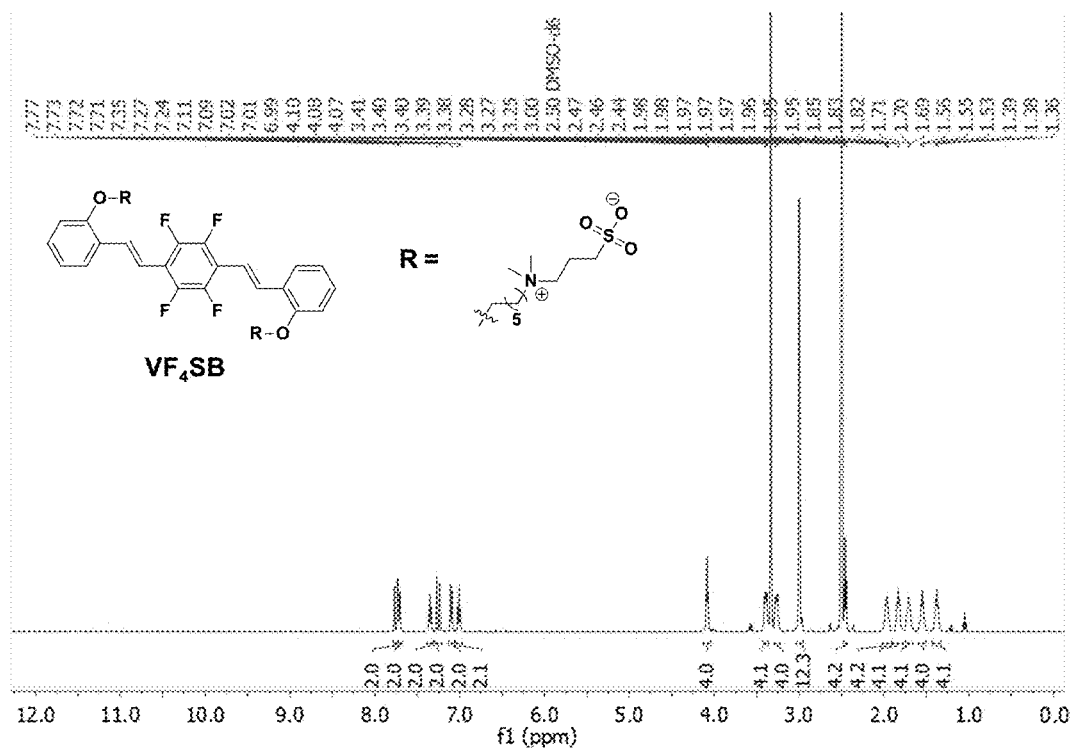
FIG. 48. ¹H NMR of VF$_4$SB in DMSO-d6.
Figure 49:
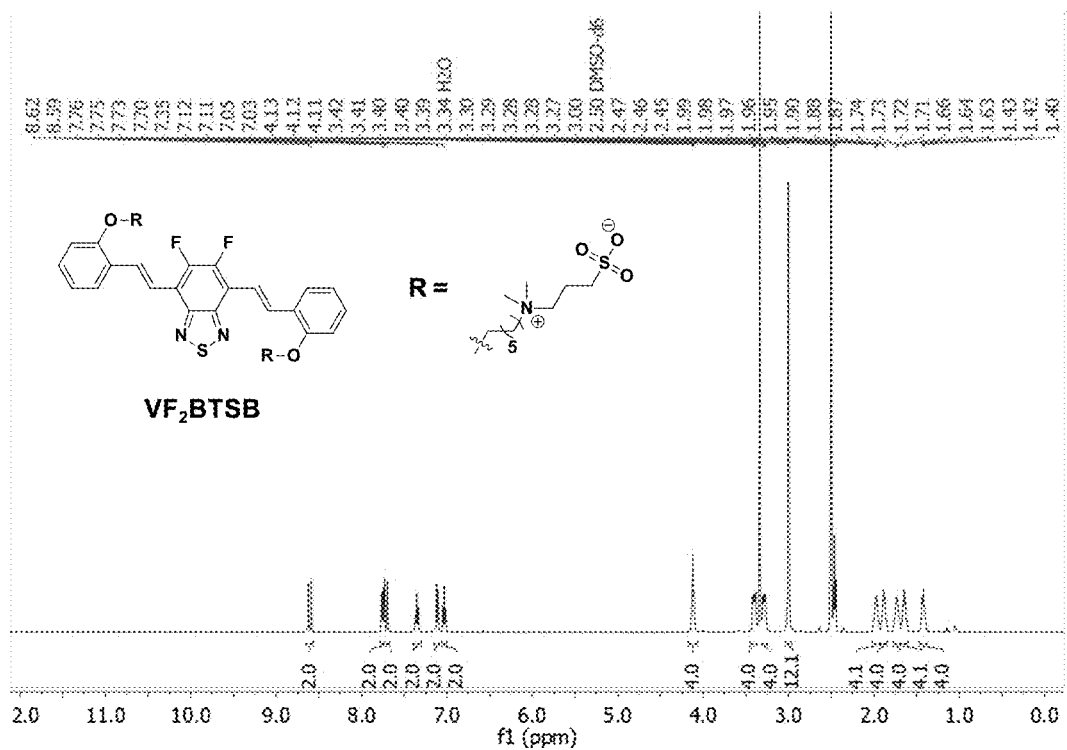
FIG. 49. ¹H NMR of VF$_2$BTSB in DMSO-d6.
Figure 50:
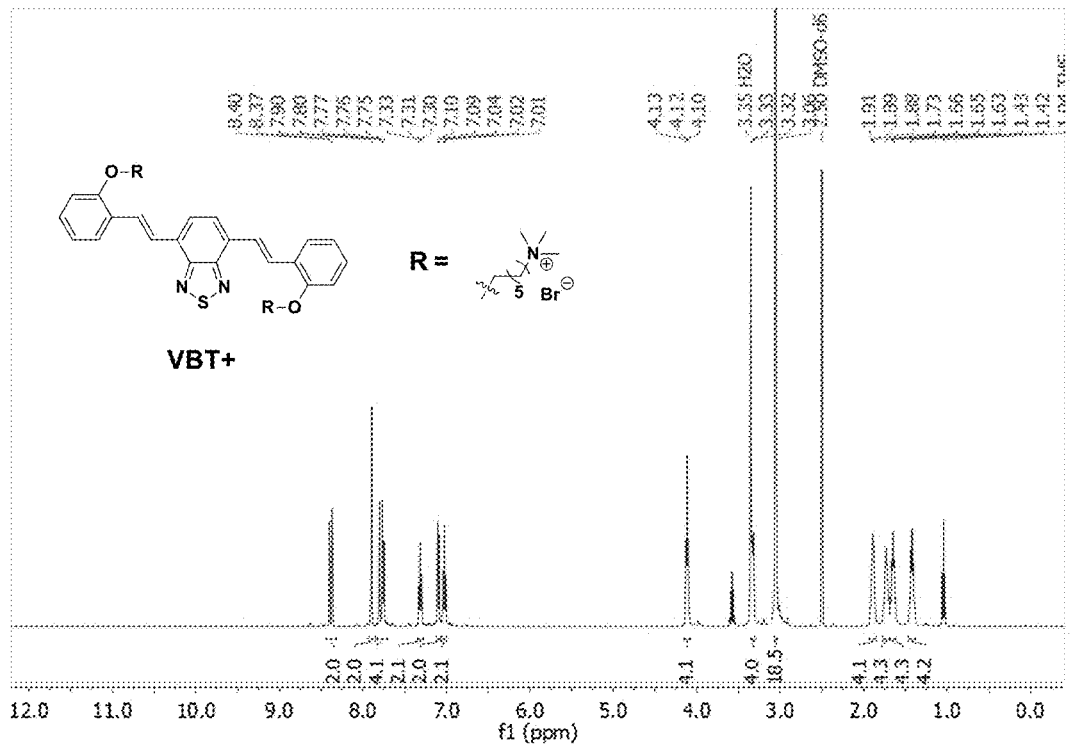
FIG. 50. ¹H NMR of VBT+ in DMSO-d6.
Figure 51:
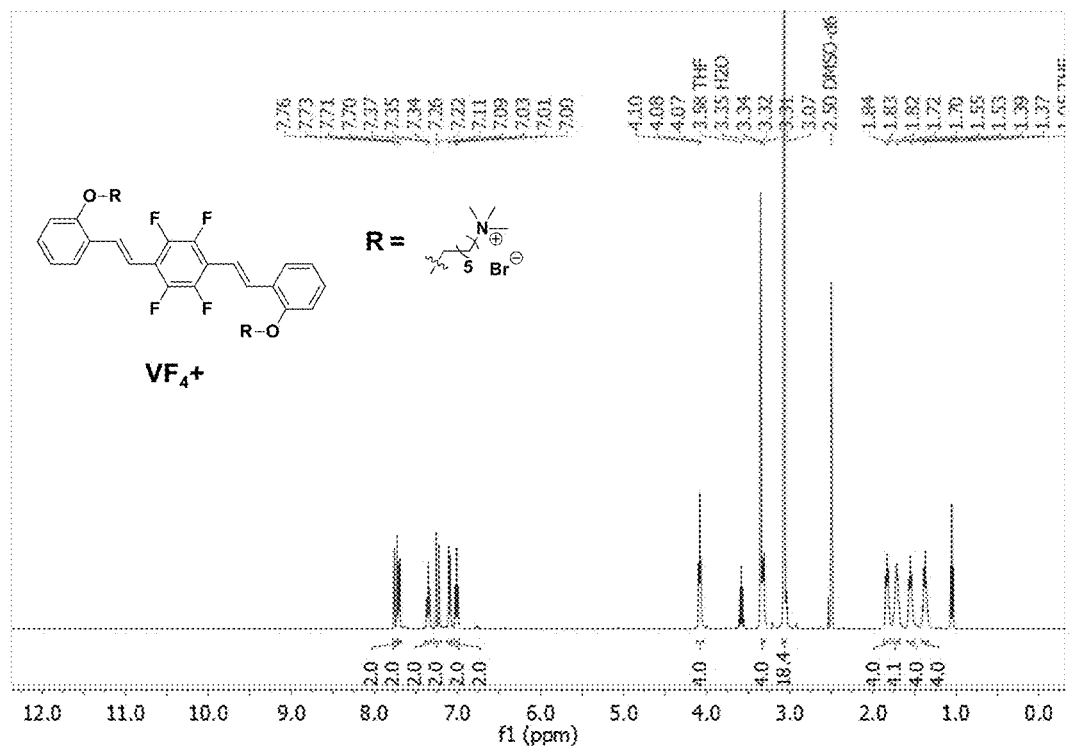
FIG. 51. ¹H NMR of VF$_4$+ in DMSO-d6.
Figure 52:
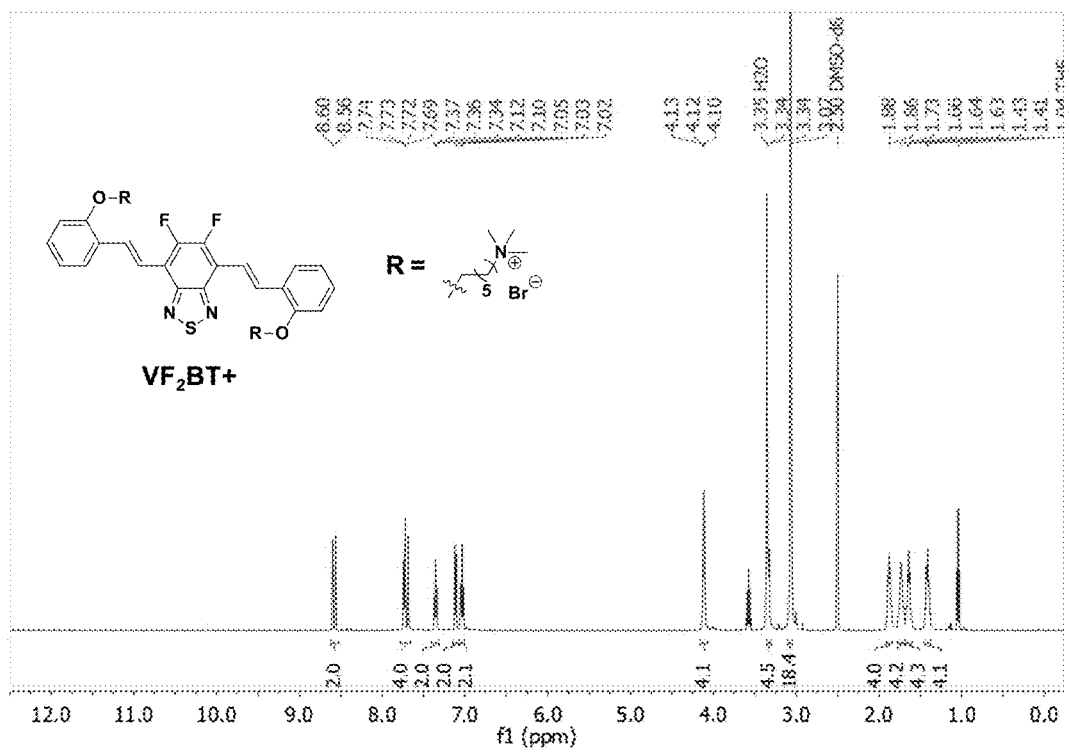
FIG. 52. ¹H NMR of VF$_2$BT+ in DMSO-d6.
Figure 53:
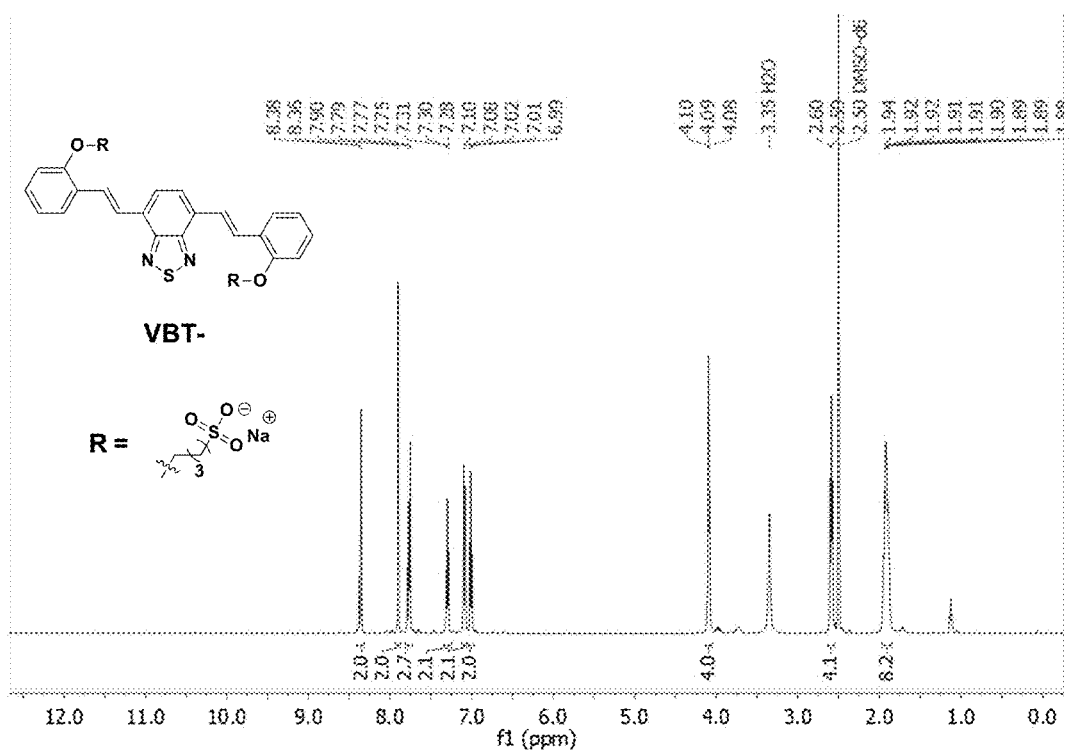
FIG. 53. ¹H NMR of VBT− in DMSO-d6.
Figure 54:
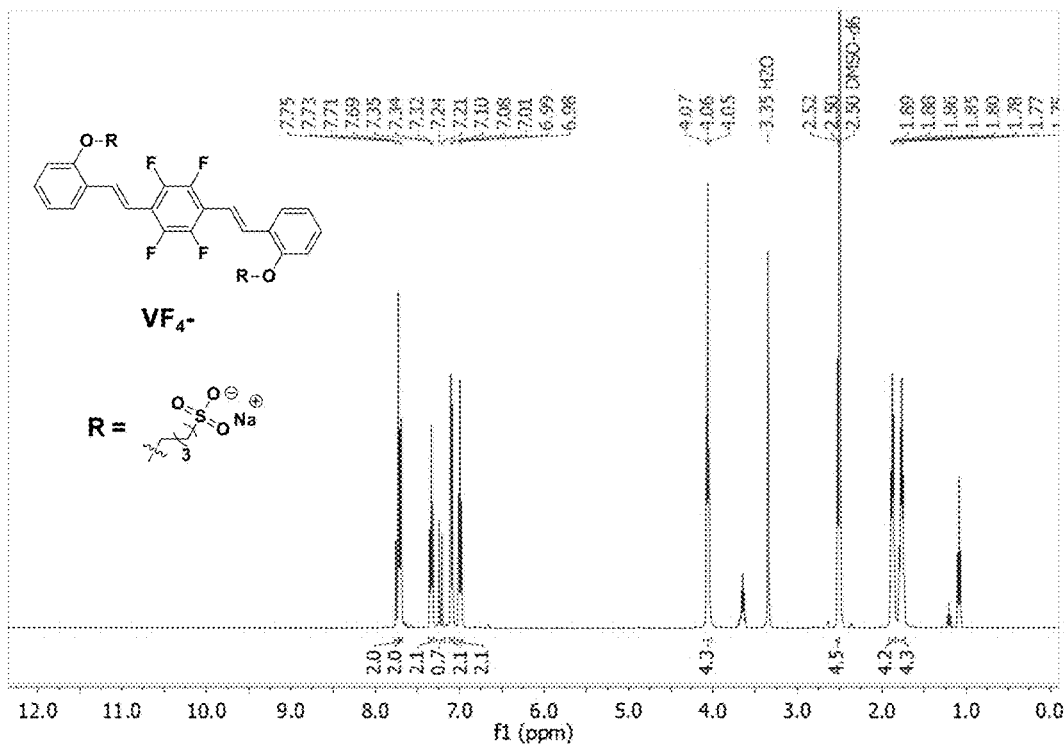
FIG. 54. ¹H NMR of VF$_4$− in DMSO-d6.
Figure 55:
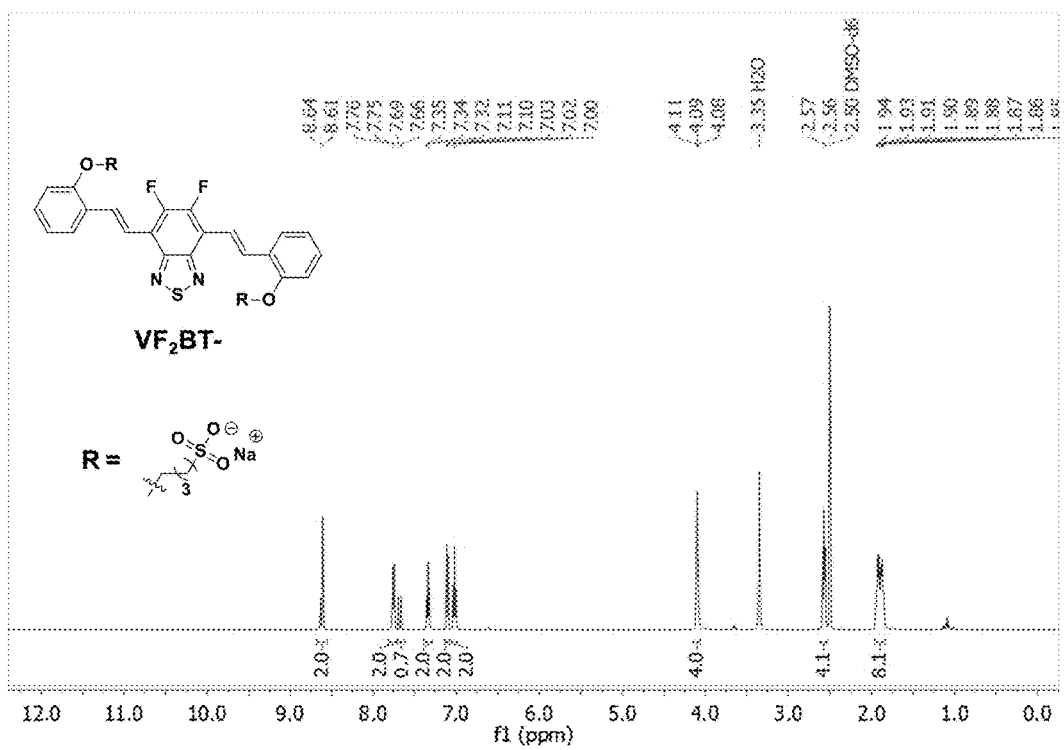
FIG. 55. ¹H NMR of VF$_2$BT− in DMSO-d6.

Finally, these PAVs were studied in PSCs by their incorporation as interfacial layers between the photoactive layer and electrode. The PSCs were fabricated with Ag cathodes rather than Al, to demonstrate their utility in conjunction with stable high 0 metal electrodes. Based on the Δ values determined by UPS (FIG. 5 and Tables 1 and 7), the zwitterionic and cationic polymers were used as cathode modifiers (in place of $C_{60}$—N) and anionic polymers as anode modifiers (in place of poly(ethylenedioxythiophene): poly(styrene sulfonate), PEDOT:PSS) (FIGS. 7 and 19 and Table 8). (Page, et al. *Science* 2014, 346, 441-444.)

TABLE 7

Summarized photovoltaic performance of devices with architectures: ITO/AML/PBDTT-TT:PC$_{71}$BM/CML/Ag, where AML represents the anode interlayer and CML represents cathode interlayer. Error represents ±1 standard deviation for averages obtained over six devices.

| AML/CML composition | $V_{OC}$ (V) | $J_{SC}$ (mA/cm$^2$) | FF (%) | PCE (%) |
|---|---|---|---|---|
| PEDOT:PSS/bare Ag | 0.48 ± 0.01 | 17.17 ± 0.02 | 53.08 ± 2.25 | 4.35 ± 0.13 |
| bare ITO/C$_{60}$-N | 0.61 ± 0.01 | 16.55 ± 0.25 | 58.71 ± 2.34 | 5.93 ± 0.22 |
| PEDOT:PSS/PVBTSB | 0.72 ± 0.04 | 16.29 ± 0.17 | 35.98 ± 1.57 | 4.21 ± 0.31 |
| PEDOT:PSS/PVF$_4$SB | 0.31 ± 0.02 | 15.91 ± 0.24 | 44.32 ± 1.72 | 2.20 ± 0.16 |
| PEDOT:PSS/PVF$_2$BTSB | 0.47 ± 0.03 | 17.03 ± 0.89 | 39.02 ± 2.27 | 3.15 ± 0.18 |
| PEDOT:PSS/PVBT+ | 0.80 ± 0.01 | 17.02 ± 0.76 | 64.18 ± 1.86 | 8.72 ± 0.17 |
| PEDOT:PSS/PVF$_4$+ | 0.73 ± 0.03 | 16.08 ± 0.14 | 53.73 ± 3.20 | 6.35 ± 0.59 |
| PEDOT:PSS/PVF$_2$BT+ | 0.80 ± 0.005 | 16.92 ± 0.41 | 66.50 ± 1.79 | 9.03 ± 0.16 |
| PVBT-/C$_{60}$-N | 0.71 ± 0.02 | 17.46 ± 0.32 | 61.33 ± 1.91 | 7.59 ± 0.33 |
| PVF$_4$-/C$_{60}$-N | 0.73 ± 0.02 | 16.52 ± 0.37 | 48.26 ± 6.58 | 5.82 ± 0.90 |
| PVF$_2$BT-/C$_{60}$-N | 0.70 ± 0.01 | 16.46 ± 0.13 | 54.73 ± 2.39 | 6.27 ± 0.24 |
| PVBT-/PVBT+ | 0.72 ± 0.01 | 16.43 ± 0.42 | 52.94 ± 3.02 | 6.22 ± 0.42 |

Specifically, the zwitterionic and cationic PAVs were cast from TFE onto the photoactive layer (PBDTT-TT/PC$_{71}$BM BHJ) followed by thermal deposition of Ag, while the anionic PAVs were cast from water onto indium tin oxide (ITO), followed by spin-coating the photoactive layer from chlorobenzene. Unlike devices made with PEDOT:PSS, thermal annealing was not required after casting the anionic PAVs. The cationic PAV cathode interlayers led to improved PSC device performance compared control devices with bare Ag cathodes (from 4.3% to 9.0% PCE), while the anionic PAV anode interlayers led to improved PSC performance relative to control devices containing bare ITO (from 6.1% to 8.0% PCE).

TABLE 8

Summarized photovoltaic performance of devices with architecture: ITO/AML/PBDTT-TT:PC$_{71}$BM/CML/Ag, where AML is the anode modification layer (either PEDOT:PSS or PVBT-) and CML is the cathode modification layer (C$_{60}$-N or PVBT+). The values given correspond to optimized PSC devices, with J-V curves shown in FIG. 7.

| AML/CML composition | $V_{OC}$ (V) | $J_{SC}$ (mA/cm$^2$) | FF (%) | PCE (%) |
|---|---|---|---|---|
| PEDOT:PSS/bare Ag | 0.48 | 17.2 | 51.5 | 4.26 |
| bare ITO/C$_{60}$-N | 0.60 | 16.8 | 60.4 | 6.12 |
| PVBT-/C$_{60}$-N | 0.72 | 17.7 | 63.0 | 8.03 |
| PEDOT:PSS/PVBT+ | 0.79 | 17.9 | 63.3 | 8.95 |

The larger improvement in device efficiency for the cationic PAV cathode modifiers relative to the anionic PAV anode modifiers (compared to bare Ag and ITO controls, respectively) correlates with the absolute change in Φ (|Δ|) measured with UPS; the anionic PAVs produce a smaller change in electrode Φ (|Δ|≤0.1 eV) than the cationic PAVs Φ (|Δ|≈0.8 eV). Additionally, UPS measurements of the zwitterionic and cationic PAVs on Ag indicate a similar reduction in Φ (Δ≈−0.6 to −0.8 eV). Surprisingly, the CPZ interlayers did not perform as might be anticipated for such structures, instead giving "S-shaped" J-V curves and reduced PCEs relative to the anionic and cationic interlayers (FIG. 19), suggesting a charge extraction imbalance that may arise from poor electron transport through the interlayer. (Page, et al. *Macromolecules* 2013, 46 (2), 344-351; Liu, et al. *Adv. Mater.* 2013, 25, 6868-6873; Page, et al. *Chem. Sci.* 2014, 5, 2368-2373; Page, et al. *J. Polym. Sci., Part A Polym. Chem.* 2015, 53 (2), 327-336.) In this instance, the CPEs may improve conductivity by self-doping effects of the transient counterions. (Chueh, et al. *Energy Environ. Sci.* 2015, 8 (4), 1160-1189.) More generally, the distinct advantage of these PAV interlayers in PSCs over commonly used Ca cathode modification layers and PEDOT:PSS anode modification layers is found in their ease of solution processing that precludes the need for thermal evaporation (Ca) and annealing (PEDOT:PSS) procedures for the electrode modification layers.

Instrumentation

NMR spectra were recorded on a Bruker 500 AVANCE III HD with a CryoProbe Prodigy and at 500 MHz for $^1$H, 176 MHz for $^{13}$C, 202 MHz for $^{31}$P and 471 MHz for $^{19}$F. Centrifugation was done using an eppendorf centrifuge 5804 and lyophilization using a Labconco FreeZone® 4.5 Liter Freeze Dry System, model 77500. UV/vis absorbance measurements were taken on a Perkin-Elmer Lambda 25 UV/vis spectrometer. Fluorescence measurements were taken on a Perkin-Elmer LS 55 luminescence spectrometer. UPS measurements were performed on the Omicron Nanotechnology, Model ESCA+S, consisting of a helium discharge lamp (He I line, 21.2 eV) as the UV excitation source and a hemispherical SPHERA energy analyzer. All samples were negatively biased by −3V during the measurements. This bias compensated for the instrument work function difference repelling the low-kinetic energy electrons. The energy scale of experimental graphs which was given with reference to the instrument Fermi level was shifted by 3 eV. Film thickness was determined by a combination of the surface profiler KLA Tencor, model Alpha-Step IQ, and UV-Vis absorption measurements given attenuation coefficients (α). Electrospray ionization (ESI) measurements were taken on a Bruker micrOTOF II. Current-voltage (I-V) characteristics were measured in a N$_2$ atmosphere (unless otherwise stated) using a Keithley 2400 source-meter under simulated AM 1.5G irradiation using a 300 W Xe lamp solar simulator (Newport 91160). The light intensity was adjusted with an NREL-calibrated Si reference solar cell and KG-5 filter. Teledyne Isco CombiFlashRr automated chromatography system with internal UV-Vis detection and external refractive index detection (model 340CF ELSD) was used for purification of the anionic compounds 18 and 21. Molecular weights and dispersities (Đ) of the zwitterionic and cationic polymers were estimated by size exclusion chromatography (SEC) in 2,2,2-trifluoroethanol with 0.02 M sodium trifluoroacetate at 40° C. using an Agilent 1200 system, calibrated against poly(methyl methacrylate) standards, equipped with an isocratic pump operated at 1 mL/min, a degasser, an Agilent 1260 infinity autosampler, one 50 mm×8 mm PSS PFG guard column (Polymer Standards Service), three 300 mm×7.5 mm PSS PFG analytical linear M columns with a 7 μm particle size (Polymer Standards Service), and an Agilent 1200 refractive index detector and Agilent 1200 VWD UV detector. Molecular weights and Đ of the anionic polymers were estimated by SEC in water:CH$_3$CN 1/1 v/v with 0.01% NaN$_3$ at 35° C., calibrated against poly(ethylene oxide) standards. The system was equipped with a Waters Ultrahydrogel™ guard column (6 mm×40 mm), 2 Waters Ultrahydrogel™ linear columns (10 μm, 7.8 mm×300 mm), an Agilent 1100 series isocratic pump operated at 1 mL/min and an Optilab rEX™ differential refractive index detector (Wyatt Technology Corporation).

OPV Device Fabrication

Photovoltatic devices were fabricated by spin coating poly(ethylenedioxythiophene):poly(styrene sulfonate) (PEDOT:PSS) (H.C. Starck, I 4083) or anionic PAV (PVBT–, PVF$_4$– and PVF$_2$BT–) from water onto pre-cleaned glass substrates (14.7×14.7 mm), patterned with indium tin oxide (ITO) (10Ω/□, from Thin Film Devices, Inc.) to cover half of the substrate area. Then, PEDOT:PSS was baked at 150° C. for 30 minutes in air, and transferred to the glove box (N$_2$ atmosphere, <1 ppm O$_2$, <1 ppm H$_2$O) for photoactive layer, interlayer and top electrode deposition. A mixture of PBDTT-TT and PC$_{71}$BM (1:1.8 weight ratio) in chlorobenzene:1,8-diiodoocatane (3 v % DIO) was stirred at 55° C. for ~1 day. The photoactive layers were deposized by spin-coating the solution onto the PEDOT:PSS or anionic PAV layer. The thickness of the active layer film was ~100 nm (determined by profilometry). DIO was removed under vacuum, followed by spin-coating of zwitterionic or cationic PAVs. Thermal evaporation of metal electrodes through a shadow mask created four devices on each substrate. The areas of the devices were 6 mm², as defined by the evaporator shadow mask area. Performance characteristics of those devices were averaged.

Stern-Volmer Photoluminescence Quenching Experiments

Stern-Volmer photoluminescence quenching experiments were carried out using methyl viologen dichloride (MV$^{2+}$) as a cationic quencher (FIGS. 6 and 18). Polymer solutions in HPLC grade water were prepared (a.u.≈0.2 at $\lambda_{max}$). To a known volume of a polymer solution, aqueous solution of MV$^{2+}$ was added in portions, and the photoluminescence spectra were recorded simultaneously. Stern-Volmer quenching constant was then calculated using the following equation at low quencher concentrations (linear regime):

$$I_o/I = 1 + K_{SV}[Q]$$

Where $I_o$ and $I$ are photoluminescence intensities observed in the absence and presence of the quencher, respectively, [Q] is the quencher concentration, and $K_{SV}$ is the Stern-Volmer quenching constant.

Synthetic Schemes

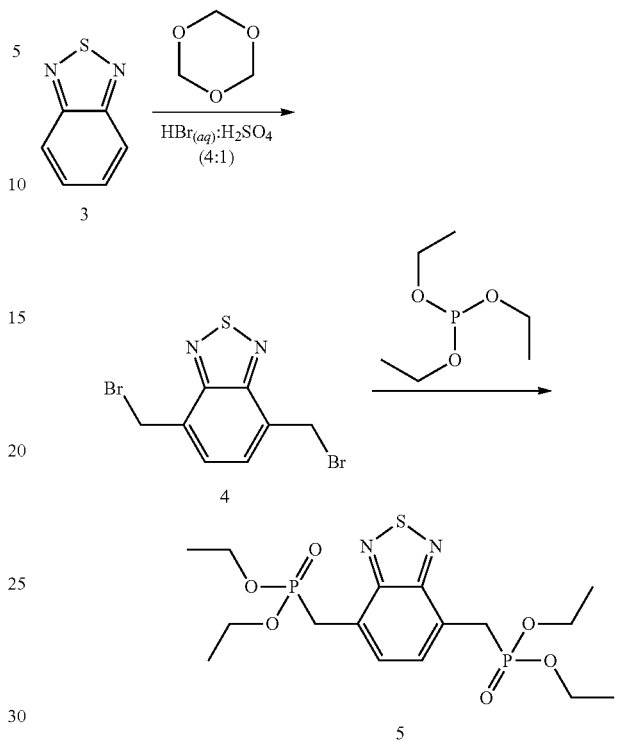

4,7-Bis(bromomethyl)benzo[c][1,2,5]thiadiazole (4)

To a 1-neck, 500 mL roundbottom flask equipped with a magnetic stir bar and condenser was added 2,1,3-benzothiadiazole (10.0 g, 73 mmol), hydrobromic acid (48 wt % in water, 200 mL) and sulfuric acid (conc., 50 mL). 1,3,5-Trioxane (33.1 g, 367 mmol) and myristyltrimethylammonium bromide (2.5 g, 7 mmol) were added to the flask while stirring the mixture. The reaction was heated to reflux and stirred for 16 hours. The reaction was cooled to room temperature and the precipitate was filtered, washed with water then ethanol and dried under reduced pressure. The resulting off-white solid was further purified using silica gel column chromatography eluting with dichloromethane:hexanes (1:3), yielding 4 (once concentrated) as a white crystalline solid (21.7 g, 92%). $^1$H NMR (500 MHz, Chloroform-d) δ 7.62 (s, 2H), 4.96 (s, 4H). $^{13}$C NMR (126 MHz, Chloroform-d) δ 153.66, 131.33, 129.46, 28.21.

Tetraethyl (benzo[c][1,2,5]thiadiazole-4,7-diylbis(methylene))bis(phosphonate) (5)

Michaelis-Arbuzov reaction: To a 2-neck, 25 mL roundbottom flask equipped with a magnetic stir bar, Vigreaux column, inlet adapter and septum was added 4 (4.0 g, 12 mmol) and triethyl phosphite (12.4 g, 75 mmol). The reaction was brought under a nitrogen atmosphere and heated to 120° C. with stirring for 4 hours. The reaction was cooled and added to boiling hexanes while stirring. Upon cooling the hexanes mixture 5 crystallized out as white needles, which were isolated by filtration and dried under reduced pressure (5.1 g, 95%). $^1$H NMR (500 MHz, Chloroform-d) δ 7.60 (s, 2H), 4.06 (p, J=7.3 Hz, 8H), 3.73 (d, J=20.8 Hz, 4H), 1.19 (t, J=7.0 Hz, 12H). $^{13}$C NMR (126 MHz, Chloroform-d) δ 154.78 (t, J=2.0 Hz), 129.91-129.67 (m), 124.31-124.04 (m), 62.30 (t, J=3.3 Hz), 29.69 (d, J=2.0 Hz), 28.57 (d, J=2.1 Hz), 16.40 (t, J=3.0 Hz). $^{31}$P NMR (202 MHz, Chloroform-d) δ 25.15. High resolution ESI (m/z): [M·H]$^-$ calculated for: $C_{16}H_{26}N_2O_6P_2S$: 435.0914, found: 435.0909.

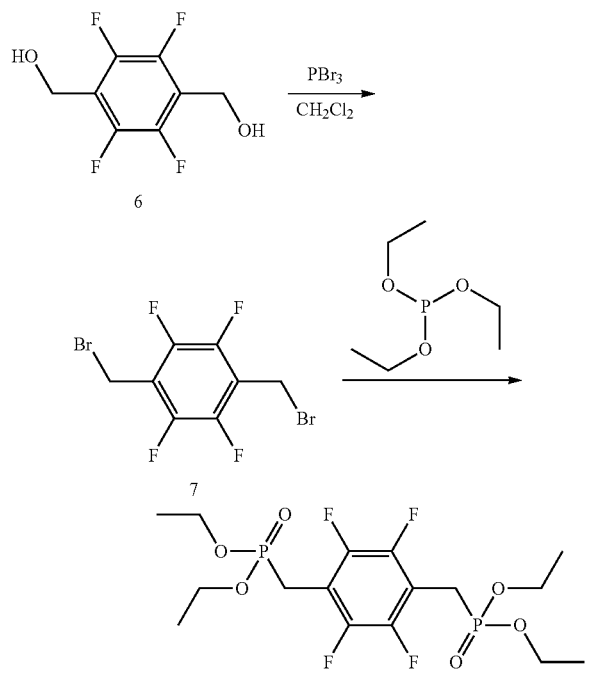

1,4-Bis(bromomethyl)-2,3,5,6-tetrafluorobenzene (7)

A dry 2-neck, 250 mL roundbottom flask equipped with a magnetic stir bar, inlet adapter and septum was flushed with nitrogen and 6 (6.0 g, 29 mmol) was added followed by dichloromethane (anhydrous, 90 mL). The mixture was cooled to 0° C. with an ice bath followed by the dropwise addition of phosphorus tribromide (5.4 mL, 57 mmol) through a syringe. The reaction was removed from the ice bath and allowed to warm to room temperature. After stirring for 3 hours the flask was again cooled to 0° C. and sodium bicarbonate was added slowly to quench the reaction. When the generation of carbon dioxide ceased the mixture was washed with brine, followed by drying the organic layer with anhydrous magnesium sulfate, filtering and concentrating to obtain the crude product. Further purification was done by running the product through a plug of silica gel eluting with dichloromethane:hexanes (1:3). After concentrating under reduced pressure the product, 7, was obtained as a white crystalline solid (3.7 g, 38%). $^1$H NMR (500 MHz, Chloroform-d) δ 4.50 (s, 4H). $^{13}$C NMR (126 MHz, Chloroform-d) δ 145.79-143.43 (m), 117.62 (tdd, J=10.6, 7.3, 4.3 Hz), 16.38 (p, J=3.1 Hz). $^{19}$F NMR (471 MHz, Chloroform-d) δ -142.38.

Tetraethyl ((perfluoro-1,4-phenylene)bis(methylene))bis(phosphonate) (8)

Following the same Michaelis-Arbuzov reaction used to make compound 5: Product 8 was obtained as white needles (3.3 g, 73%). $^1$H NMR (500 MHz, Chloroform-d) δ 4.12 (pt, J=7.2, 3.4 Hz, 8H), 3.26 (d, J=20.5 Hz, 4H), 1.30 (t, J=7.0 Hz, 12H). $^{13}$C NMR (126 MHz, Chloroform-d) δ 146.06-143.26 (m), 110.99-110.37 (m), 62.56 (t, J=3.3 Hz), 21.52 (d, J=142.6 Hz), 16.25 (t, J=3.1 Hz). $^{19}$F NMR (471 MHz, Chloroform-d) δ -142.49. $^{31}$P NMR (202 MHz, Chloroform-d) δ 21.92. High resolution ESI (m/z): [M·H]$^-$ calculated for: $C_{16}H_{24}F_4O_6P_2$: 449.0911, found: 449.0907.

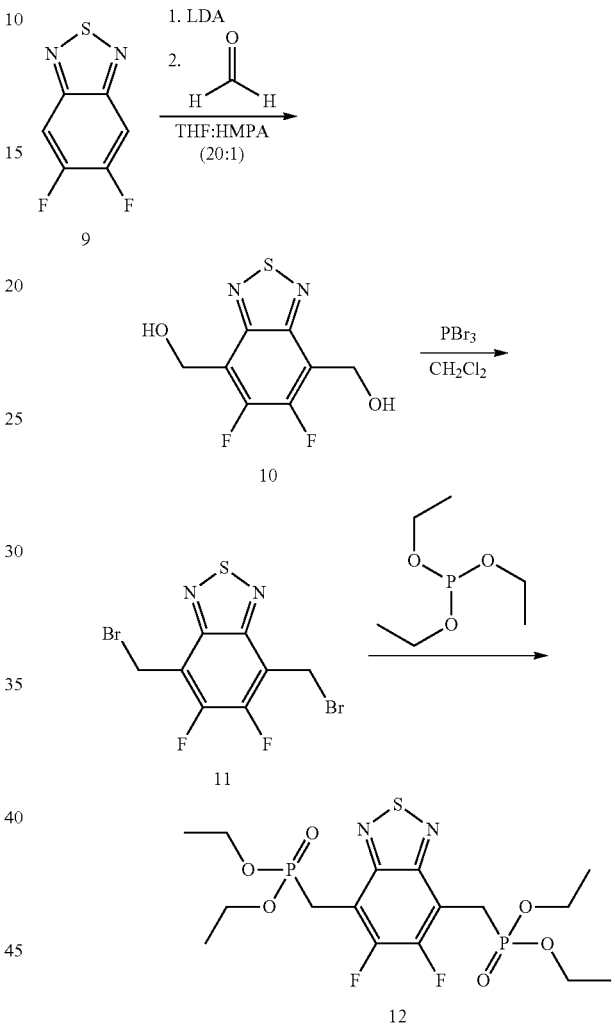

5,6-Difluorobenzo[c][1,2,5]thiadiazole (9)

A dry 3-neck, 500 mL roundbottom flask equipped with a magnetic stir bar, inlet adapter, condenser, addition funnel and septa was flushed with nitrogen and 1,2-diamino-4,5-difluorobenzene (10.0 g, 69 mmol) was added followed by chloroform (anhydrous, 200 mL) and triethylamine (38.7 mL, 278 mmol). Thionyl chloride (10.6 mL, 146 mmol) was diluted in chloroform (anhydrous, 50 mL) and added dropwise to the mixture while stirring at room temperature. After complete addition the reaction was heated to reflux for 5 hours, then cooled to room temperature and quenched with water. The product was extracted with dichloromethane and the organic fractions were combined, dried with anhydrous magnesium sulfate, filtered and concentrated. The crude product was further purified using silica gel column chromatography eluting with dichloromethane:hexanes (1:3).

The product 9 was obtained as an off-white solid and sublimed at room temperature to obtain a pure white crystalline solid (10.5 g, 87%). $^1$H NMR (500 MHz, Chloroform-d) δ 7.75 (t, J=8.7 Hz, 2H). $^{13}$C NMR (126 MHz, Chloroform-d) δ 154.86 (d, J=20.0 Hz), 152.79 (d, J=20.0 Hz), 150.86 (t, J=5.6 Hz), 106.17 (dd, J=15.6, 6.0 Hz). $^{19}$F NMR (471 MHz, Chloroform-d) δ −127.98 (t, J=8.7 Hz).

(5,6-Difluorobenzo[c][1,2,5]thiadiazole-4,7-diyl) dimethanol (10)

A dry 2-neck, 250 mL roundbottom flask equipped with a magnetic stir bar, inlet adapter and septum was evacuated and refilled with nitrogen and anhydrous tetrahydrofuran (THF, 65 mL) and diisopropylamine (7.9 mL, 56 mmol) were added. The mixture was cooled to −78° C. with a dry ice/acetone bath and n-butyllithium (2.5 M in hexanes, 19.2 mL, 48 mmol) was added carefully. The contents of the flask were stirred for 40 minutes at −78° C. to generate lithium diisopropylamide (LDA).

A second 2-neck, 500 mL roundbottom flask equipped with a magnetic stir-bar, jacketed addition funnel, inlet adapter and septum was evacuated and refilled with nitrogen and THF (65 mL) and 9 (3.44 g, 20 mmol) were added. The mixture was cooled to −78° C. with a dry ice/acetone bath and the freshly prepared LDA solution was added dropwise by cannulating it over directly from the first flask. The reaction immediately turned a dark red/brown color. Anhydrous hexamethylphosphoramide (HMPA, 11 mL) was added dropwise at −78° C. and the stirred at this temperature for one hour, during which time the reaction mixture turned dark green. THF (20 mL) was added to the jacketed addition funnel and chilled to −78° C. with dry ice/acetone, followed by the addition of formaldehyde* (1.3 M in THF, 49 mL, 64 mmol). The formaldehyde in THF was added dropwise, maintaining a temperature of −78° C. for the reaction flask and addition funnel. After complete addition the reaction mixture was warmed to −45° C. using a dry ice/acetonitrile bath and then allowed to warm to −30° C. over the course of one hour. After the dry ice/acetonitrile cooling bath had reached −30° C. it was replaced with an ice bath and the reaction mixture was stirred for 20 minutes at 0° C. followed by quenching with 1 M HCl. The product was extracted with dichloromethane, dried with anhydrous magnesium sulfate, filtered and concentrated to obtain an orange oil. The crude product was further purified using silic gel column chromatography eluting with ethyl acetate:hexanes (3:7 gradient to 8:2). After concentrating under reduced pressure the product 10 was obtained as a yellow solid (3.61 g, 78%). $^1$H NMR (500 MHz, DMSO-$d_6$) δ 5.49 (t, J=5.8 Hz, 2H), 4.94 (d, J=5.6 Hz, 4H). $^{13}$C NMR (126 MHz, DMSO-$d_6$) δ 151.69 (d, J=20.3 Hz), 150.07 (t, J=4.5 Hz), 149.64 (d, J=20.2 Hz), 118.56 (dd, J=11.7, 4.5 Hz), 53.22 (t, J=2.4 Hz). $^{19}$F NMR (471 MHz, DMSO-$d_6$) δ −134.70. Formaldehyde solutions were generated by cracking paraformaldehyde thermally under reduced pressure and trapping it in anhydrous tetrahydrofuran (THF) at −78° C. The solutions were filtered to remove repolymerized material and stored under an inert atmosphere at −80° C., where they were stable for months. The molar concentration of formaldehyde in THF was determined using $^1$H-NMR spectroscopy.

4,7-Bis(bromomethyl)-5,6-difluorobenzo[c][1,2,5] thiadiazole (11)

A dry 2-neck, 500 mL roundbottom flask equipped with a magnetic stir bar, inlet adapter and septum was flushed with nitrogen and 10 (3.6 g, 16 mmol) was added followed by tetrahydrofuran (anhydrous, 300 mL). The mixture was cooled to 0° C. with an ice bath followed by the dropwise addition of phosphorus tribromide (2.9 mL, 31 mmol) through a syringe. The reaction was removed from the ice bath and allowed to warm to room temperature. After stirring for 3 hours the flask was again cooled to 0° C. and sodium bicarbonate was added slowly to quench the reaction. When the generation of carbon dioxide ceased the mixture was washed with brine, followed by drying the organic layer with anhydrous magnesium sulfate, filtering and concentrating to obtain the crude product. Further purification was done by running the product through a plug of silica gel eluting with ethyl acetate:hexanes (1:4). After concentrating under reduced pressure the product, 11, was obtained as a yellow crystalline solid (3.6 g, 65%). $^1$H NMR (500 MHz, Chloroform-d) δ 4.95 (s, 4H). $^{13}$C NMR (126 MHz, Chloroform-d) δ 152.31 (d, J=19.6 Hz), 150.22 (d, J=19.8 Hz), 149.58 (t, J=3.7 Hz), 116.91 (dd, J=11.4, 4.8 Hz), 19.36 (t, J=3.1 Hz). $^{19}$F NMR (471 MHz, Chloroform-d) δ −129.80.

Tetraethyl ((5,6-difluorobenzo[c][1,2,5]thiadiazole-4,7-diyl)bis(methylene))bis(phosphonate) (12)

Following the same Michaelis-Arbuzov reaction used to make compound 5: Product 12 was obtained as light yellow crystals (3.5 g, 75%). $^1$H NMR (500 MHz, Chloroform-d) δ 4.20-4.04 (m, 8H), 3.71 (d, J=20.8 Hz, 4H), 1.23 (t, J=7.0 Hz, 12H). $^{13}$C NMR (126 MHz, Chloroform-d) δ 152.96-152.58 (m), 150.88-150.52 (m), 110.64-110.11 (m), 62.56 (t, J=3.2 Hz), 24.57 (d, J=1.6 Hz), 23.44 (d, J=2.3 Hz), 16.38 (t, J=3.2 Hz). $^{19}$F NMR (471 MHz, Chloroform-d) δ −130.34 (d, J=5.5 Hz). $^{31}$P NMR (202 MHz, Chloroform-d) δ 22.81 (d, J=6.0 Hz). High resolution ESI (m/z): [M·H]$^-$ calculated for: $C_{16}H_{24}F_2N_2O_6P_2S$: 471.0726, found: 471.0709.

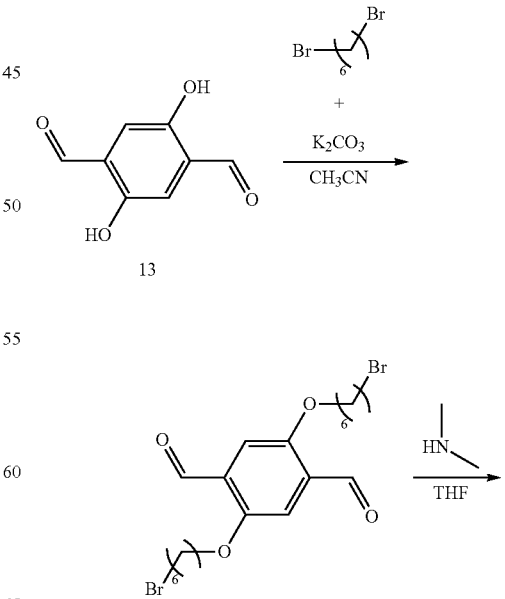

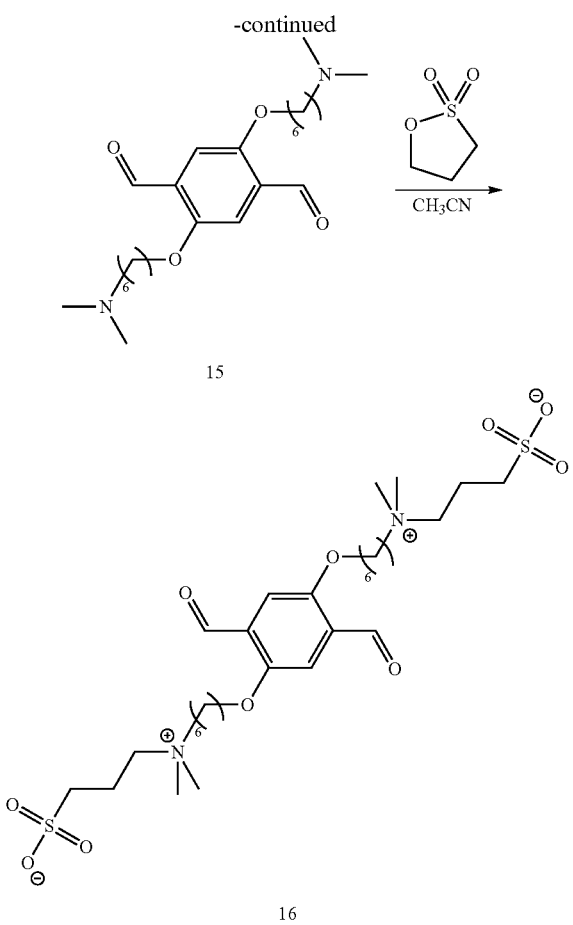

2,5-bis((6-bromohexyl)oxy)terephthalaldehyde (14)

A dry 2-neck, 250 mL roundbottom flask equipped with a magnetic stir bar, inlet adapter, condenser and septum was flushed with nitrogen and 13 (1.6 g, 10 mmol) and potassium carbonate (5.3 g, 39 mmol) were added followed by acetonitrile (anhydrous, 80 mL) and 1,6-dibromohexane (8.9 mL, 58 mmol). The mixture was degassed with nitrogen and heated to reflux while stirring for 14 hours. Initially the reaction becomes dark red (formation of phenoxide anions), but turns bright yellow over time. The reaction mixture was cooled to room temperature, concentrated under reduced pressure, dissolved in dichloromethane, washed with aqueous sodium carbonate then water. The organic phase was dried with anhydrous magnesium sulfate, filtered and concentrated. The crude product was subjected to silica gel column chromatography eluting with dichlromethane: hexanes (1:1). After concentration under reduced pressure the product 14 was obtained as a bright yellow crystalline solid (3.28 g, 69%). $^1$H NMR (500 MHz, Chloroform-d) δ 10.50 (s, 2H), 7.42 (s, 2H), 4.09 (t, J=6.4 Hz, 4H), 3.42 (t, J=6.7 Hz, 4H), 1.95-1.78 (m, 8H), 1.58-1.46 (m, J=4.2 Hz, 8H). $^{13}$C NMR (126 MHz, Chloroform-d) δ 189.43, 155.22, 129.28, 111.67, 77.16, 69.02, 33.88, 32.69, 29.01, 27.96, 25.38.

2,5-bis((6-(dimethylamino)hexyl)oxy)terephthalaldehyde (15)

A dry, 250 mL pressure flask equipped with a magnetic stir bar and Teflon screw cap with a rubber O-ring was flushed with nitrogen and 14 (3.2 g, 7 mmol) was added, followed by dimethylamine (2 M solution in THF, 65 mL, 130 mmol). The Teflon cap was closed tightly and the reaction mixture was heated to 60° C., while stirring, for 5 hours. Shortly after heating the reaction turns from yellow to almost colorless and a white precipitate is formed. The salt is likely dimethylammonium bromide and the change in color is thought to arise from aminal formation, which may occur if dimethylamine reacts with benzaldehyde, reducing conjugation. After 5 hours, the reaction mixture is allowed to cool and a couple milliliters of aqueous 1 M hydrochloric acid is added while stirring. The solution quickly changes back to its original yellow color, indicating that conjugation through the aldehyde was restored. The reaction mixture was neutralized with aqueous sodium carbonate, extracted with dichloromethane and the combined organic extracts were washed with brine, dried with anhydrous magnesium sulfate, filtered and concentrated under reduced pressure to obtain the product 15 as a bright yellow solid (2.4 g, 87%). $^1$H NMR (500 MHz, Chloroform-d) δ 10.51 (s, 2H), 7.42 (s, 2H), 4.08 (t, J=6.4 Hz, 4H), 2.28 (t, J=7.5 Hz, 4H), 2.24 (s, 12H), 1.84 (p, J=6.7 Hz, 4H), 1.50 (h, J=7.0 Hz, 8H), 1.43-1.34 (m, 4H). $^{13}$C NMR (126 MHz, Chloroform-d) δ 189.52, 155.33, 129.39, 111.76, 77.16, 69.26, 59.81, 45.57, 29.16, 27.67, 27.28, 26.14.

3,3'-((((2,5-Diformyl-1,4-phenylene)bis(oxy))bis(hexane-6,1-diyl))bis(dimethylammonionediyl)) bis(propane-1-sulfonate) (16)

A dry 2-neck, 500 mL roundbottom flask equipped with a magnetic stir bar, inlet adapter, condenser and septum was flushed with nitrogen and 15 (2.4 g, 6 mmol), 1,3-propane sultone (5.5 g, 45 mmol) and anhydrous acetonitrile (200 mL) were added. The mixture was degassed with nitrogen, then heated to reflux while stirring for 14 hours. The reaction mixture was cooled to room temperature and the yellow precipitate was filtered and washed with acetonitrile, tetrahydrofuran and diethyl ether sequentially. After drying under reduced pressure the product 16 was isolated as a bright yellow solid (3.7 g, 98%). $^1$H NMR (500 MHz, DMSO-d$_6$) δ 10.42 (s, 2H), 7.42 (s, 2H), 4.15 (t, J=6.2 Hz, 4H), 3.43-3.35 (m, 4H), 3.28-3.22 (m, 12H), 2.99 (s, 4H), 2.45 (t, J=6.9 Hz, 4H), 1.96 (p, J=7.3, 6.8 Hz, 4H), 1.81 (p, J=6.8 Hz, 4H), 1.70 (p, J=7.7 Hz, 4H), 1.51 (p, J=7.6 Hz, 4H), 1.35 (p, J=7.6 Hz, 4H). $^{13}$C NMR (126 MHz, DMSO-d$_6$) δ 189.07, 154.59, 128.93, 112.01, 68.80, 67.04, 62.84, 62.20, 50.06, 47.65, 39.52, 28.25, 25.49, 25.16, 25.01. High resolution ESI (m/z): [M·2Na]$^{2+}$ calculated for: C$_{30}$H$_{52}$N$_2$O$_{10}$S$_2$: 355.1424, found: 355.1425.

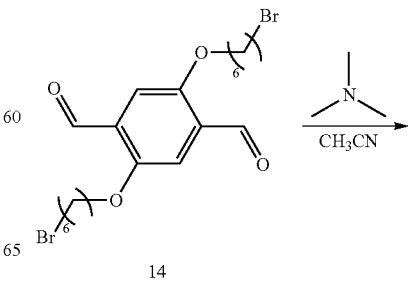

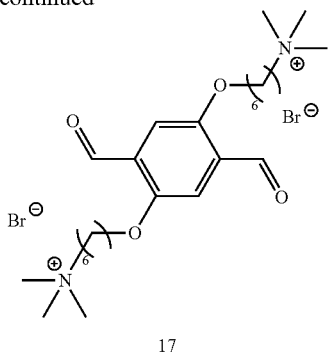

17

6,6'-((2,5-Diformyl-1,4-phenylene)bis(oxy))bis(N,N,N-trimethylhexan-1-aminium) bromide (17)

A dry, 250 mL pressure flask equipped with a magnetic stir bar and Teflon screw cap with a rubber O-ring was flushed with nitrogen and 14 (3.2 g, 7 mmol) was added and dissolved in anhydrous acetonitrile (65 mL). The flask and contents were cooled to −10° C. with a salt/ice bath and trimethylamine (2.5 mL, 26 mmol) was quickly added followed by tightly capping the pressure flask. The reaction mixture was heated to 60° C., while stirring, for 4 hours. The bright yellow precipitate that formed was filtered, washed with tetrahydrofuran and diethyl ether and concentrated under reduced pressure to obtain the product 17 (3.7 g, 96%) as a bright yellow solid. $^1$H NMR (500 MHz, DMSO-$d_6$) δ 10.41 (s, 2H), 7.41 (s, 2H), 4.14 (t, J=6.3 Hz, 4H), 3.36-3.30 (m, 4H), 3.08 (s, 18H), 1.80 (p, J=6.4 Hz, 4H), 1.70 (dq, J=12.0, 8.2, 6.2 Hz, 4H), 1.51 (p, J=7.5 Hz, 4H), 1.34 (p, J=7.5 Hz, 4H). $^{13}$C NMR (126 MHz, DMSO-$d_6$) δ 189.04, 154.55, 128.88, 112.00, 68.79, 65.12, 52.09, 39.52, 28.23, 25.45, 24.99, 22.00. High resolution ESI (m/z): $[M]^{2+}$ calculated for: $C_{26}H_{46}N_2O_4$: 225.1723, found: 225.1724.

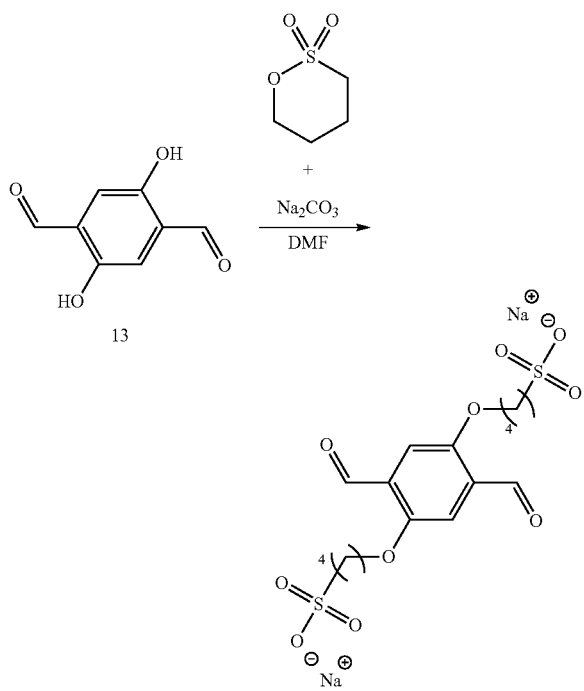

18

Sodium 4,4'-((2,5-diformyl-1,4-phenylene)bis(oxy))bis(butane-1-sulfonate) (18)

A dry 2-neck, 100 mL roundbottom flask equipped with a magnetic stir bar, inlet adapter, condenser and septum was flushed with nitrogen and 13 (1.0 g, 6 mmol) and sodium carbonate (2.55 g, 24 mmol) were added followed by acetonitrile (anhydrous, 50 mL) and 1,4-butane sultone (3.3 g, 24 mmol). The mixture was degassed with nitrogen and heated to 80° C. while stirring for 18 hours. Initially the reaction becomes dark red (formation of phenoxide anions), but turns orange over time. The reaction mixture was cooled to room temperature, poured into tetrahydrofuran, filtered and the filtrate was washed with tetrahydrofuran. The yellow-orange solid was dried under reduced pressure then dissolved in water containing 0.1% trifluoroacetic acid (TFA) to give a concentration of ~100 mg/mL. Acetic acid was added dropwise to the aqueous mixture while stirring until the evolution of carbon dioxide ceased or when the pH was determined to be ~5-7. The mixture was subjected to reverse phase chromatography with C18-derivatized silica as the stationary phase and mixed water:acetonitrile (+0.1% TFA) as the mobile phase (see FIG. 9 for details). After removing acetonitrile and TFA under reduced pressure the water was removed by lyophelization, yielding the product 18 (2.1 g, 74%) as a yellow fluffy solid. $^1$H NMR (500 MHz, DMSO-$d_6$) δ 10.40 (s, 2H), 7.42 (s, 2H), 4.13 (t, J=6.3 Hz, 4H), 2.62 (t, J=7.5 Hz, 4H), 1.84 (p, J=6.6 Hz, 4H), 1.74 (p, J=7.2, 6.6 Hz, 4H). $^{13}$C NMR (126 MHz, DMSO-$d_6$) δ 189.01, 154.64, 128.98, 112.09, 68.76, 50.95, 39.52, 27.68, 21.57. High resolution ESI (m/z): $[M]^{2+}$ calculated for: $C_{16}H_{20}O_{10}S_2$: 218.0254, found: 218.0269.

General Procedure for HWE Polymerization

To a scintillation vial equipped with a magnetic stir-bar was added bis(methylphosphonate) $A_2$ monomer 5, 8 or 12 (0.4 mmol) and functionalized terephthalaldehyde $B_2$ monomer 16, 17 or 18 (0.4 mmol), followed by 0.1 mL of water and 0.5 mL of DMSO. The reaction mixture was rapidly stirred and sodium hydroxide (3.2 mmol) in 0.4 mL of water was quickly added. The color changes immediately from bright yellow to orange ($PVF_4$ derivatives) or blue/purple (PVBT and $PVF_2BT$ derivatives). The vial was capped and the mixture was stirred at room temperature for 24 hours. The fluorinated polymers tended to precipitate out of the reaction, limiting the attainable molecular weight. After 24 hours the reaction mixtures were diluted with water and added to a dialysis membrane (molecular weight cutoff 3,500 Da). The zwitterionic and anionic polymers were dialyzed against pure water and the cationic polymers were dialyzed against water alternating with water containing sodium chloride (0.5 M) in order to exchange out the bromide and phosphonate counterions for chloride (the dialysis was done in an alternating fashion because the PAV cationic polyelectrolytes precipitated in the bag when the salt solutions were being used, but readily redissolved after switching back to pure water; exemplifying the polyelectrolyte effect). The contents of the dialysis bags were lyophilized to obtain the polymers as brightly colored and fluffy solids, with yields typically ≥95%.

PVBTSB was obtained as a dark blue solid. $M_n$=22,800 Da, Đ=2.0; $^1$H NMR (500 MHz, TFE-$d_3$) δ 9.13-6.13 (br, 8H), 4.66-3.96 (br, 4H), 3.55-3.10 (br, 8H), 3.15-2.69 (br, 16H), 2.39-1.32 (br, 20H).

$PVF_4SB$ was obtained as a bright orange solid. $M_n$=8,300 Da, Đ=2.0 $^1$H NMR (500 MHz, TFE-$d_3$) δ 8.02-6.04 (br, 6H), 4.38-3.92 (br, 4H), 3.52-3.36 (br, 4H), 3.35-3.16 (br, 4H) 3.14-2.96 (br, 12H), 2.95-2.81 (br, 4H), 2.29-2.11 (br, 4H), 2.10-1.77 (br, 8H), 1.76-1.63 (br, 4H), 1.62-1.45 (br, 4H).

PVF$_2$BTSB was obtained as a dark purple solid. $M_n$=9,700 Da, Đ=2.0 $^1$H NMR (500 MHz, TFE-d$_3$) δ 8.82-6.41 (br, 6H), 4.60-3.95 (br, 4H), 3.53-3.17 (br, 8H), 3.13-2.65 (br, 16H), 2.52-1.27 (br, 20H).

PVBT+ was obtained as a dark blue solid. $M_n$=48,600 Da, Đ=1.6 $^1$H NMR (500 MHz, Deuterium Oxide) δ 8.16-6.43 (br, 8H), 4.03-2.84 (br, 26H), 2.42-1.12 (br, 16H).

PVF$_4$+ was obtained as a bright orange solid. $M_n$=26,000 Da, Đ=1.4 $^1$H NMR (500 MHz, Deuterium Oxide) δ 7.76-6.38 (br, 6H), 4.55-3.80 (br, 4H), 3.76-2.84 (br, 22H), 2.27-1.05 (br, 16H).

PVF$_2$BT+ was obtained as a dark purple solid. $M_n$=25,500 Da, Đ=1.3 $^1$H NMR (500 MHz, Deuterium Oxide) δ 7.65-5.89 (br, 6H), 4.48-2.62 (br, 26H), 2.20-0.85 (br, 16H).

PVBT− was obtained as a dark purple/blue solid. $M_n$=50,100 Da, Đ=1.5 $^1$H NMR (500 MHz, Deuterium Oxide) δ 8.44-6.40 (br, 8H), 4.53-3.78 (br, 4H), 3.60-2.93 (br, 4H), 2.59-1.70 (br, 6H) 1.65-0.70 (br, 2H).

PVF$_4$− was obtained as a bright orange solid. $M_n$=42,600 Da, Đ=1.3 $^1$H NMR (500 MHz, Deuterium Oxide) δ 7.57-6.04 (br, 6H), 4.38-3.55 (br, 4H), 3.35-2.70 (br, 4H), 2.32-1.71 (br, 6H), 1.55-0.60 (br, 2H).

PVF$_2$BT− was obtained as a dark purple solid. $M_n$=43,300 Da, Đ=1.3 $^1$H NMR (500 MHz, Deuterium Oxide) δ 8.21-5.52 (br, 6H), 4.51-3.53 (br, 4H), 3.42-2.65 (br, 4H), 2.48-1.43 (br, 6H) 1.27-0.41 (br, 2H).

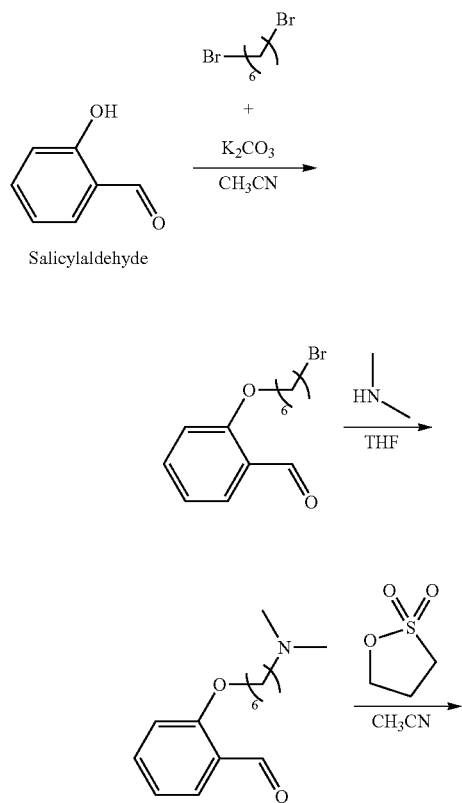

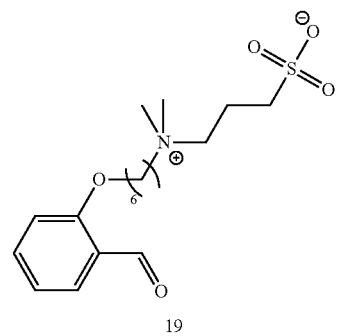

3-((6-(2-Formylphenoxy)hexyl)dimethylammonio)propane-1-sulfonate (19)

Starting from salicylaldehyde compound 19 was synthesized using an analogous procedure to that given for compound 16 (details above):

Salicylaldehyde was reacted under basic conditions (potassium carbonate in refluxing acetonitrile) with 1,6-dibromohexane through an S$_N$2 substitution, yielding 2-((6-bromohexyl)oxy)benzaldehyde (8.0 g, 86%) as a colorless clear oil. $^1$H NMR (500 MHz, Chloroform-d) δ 10.50 (s, 1H), 7.82 (d, J=7.8 Hz, 1H), 7.53 (t, J=7.9 Hz, 1H), 7.01 (t, J=7.5 Hz, 1H), 6.97 (d, J=8.4 Hz, 1H), 4.08 (t, J=6.3 Hz, 2H), 3.42 (t, J=6.7 Hz, 2H), 1.94-1.82 (m, 4H), 1.58-1.47 (m, 4H). $^{13}$C NMR (126 MHz, Chloroform-d) δ 189.95, 161.52, 136.07, 128.35, 124.89, 120.65, 112.51, 77.16, 68.29, 33.93, 32.69, 29.03, 27.95, 25.40.

2-((6-bromohexyl)oxy)benzaldehyde was reacted with excess dimethylamine in tetrahydrofuran in a pressure flask at 60° C., yielding 2-((6-(dimethylamino)hexyl)oxy)benzaldehyde (1.3 g, 99%) as a light yellow oil. $^1$H NMR (500 MHz, Chloroform-d) δ 10.51 (s, 1H), 7.82 (d, J=7.8 Hz, 1H), 7.52 (t, J=7.8 Hz, 1H), 6.99 (t, J=7.5 Hz, 1H), 6.96 (d, J=8.4 Hz, 1H), 4.07 (t, J=6.3 Hz, 2H), 2.27 (t, J=7.3 Hz, 2H), 2.22 (s, 6H), 1.85 (p, J=6.7 Hz, 2H), 1.57-1.45 (m, 4H), 1.43-1.34 (m, 2H). $^{13}$C NMR (126 MHz, Chloroform-d) δ 190.01, 161.65, 136.03, 128.34, 125.02, 120.60, 112.60, 77.16, 68.54, 59.85, 45.62, 29.19, 27.76, 27.30, 26.18.

2-((6-(dimethylamino)hexyl)oxy)benzaldehyde was reacted with 1,3-propane sultone in refluxing acetonitrile, yielding 19 (1.7 g, 94%) as a white solid. $^1$H NMR (500 MHz, DMSO-d$_6$) δ 10.39 (s, 1H), 7.68 (dd, J=7.7, 1.4 Hz, 1H), 7.65 (t, J=7.8 Hz, 1H), 7.23 (d, J=8.4 Hz, 1H), 7.06 (t, J=7.5 Hz, 1H), 4.13 (t, J=6.3 Hz, 2H), 3.44-3.35 (m, 2H), 3.32-3.18 (m, 2H), 3.00 (s, 6H), 2.47 (t, J=7.0 Hz, 2H), 2.01-1.91 (m, 2H), 1.81 (p, J=6.7 Hz, 2H), 1.75-1.63 (m, 2H), 1.51 (p, J=7.6 Hz, 2H), 1.34 (p, J=7.7 Hz, 2H). $^{13}$C NMR (126 MHz, DMSO-d$_6$) δ 189.22, 161.07, 136.54, 127.61, 124.18, 120.58, 113.54, 68.16, 62.83, 62.18, 50.04, 47.68, 39.52, 28.27, 25.52, 25.07, 21.61, 18.95. High resolution ESI (m/z): [M·Na]$^+$ calculated for: C$_{18}$H$_{29}$NO$_5$S: 394.1659, found: 394.1658.

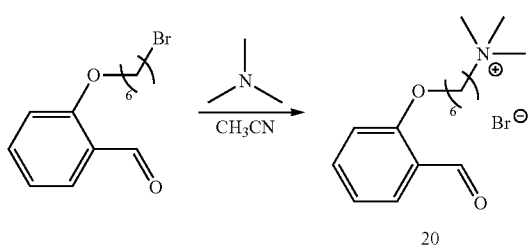

6-(2-Formylphenoxy)-N,N,N-trimethylhexan-1-aminium bromide (20)

Starting from salicylaldehyde compound 20 was synthesized using an analogous procedure to that given for compound 17 (details above): 2-((6-Bromohexyl)oxy)benzaldehyde was reacted with excess trimethylamine in acetonitrile in a pressure flask at 60° C., yielding 20 (2.2 g, 93%) as a white solid. $^1$H NMR (500 MHz, DMSO-$d_6$) δ 10.39 (s, 1H), 7.68 (d, J=7.7 Hz, 1H), 7.65 (t, J=7.9 Hz, 1H), 7.23 (d, J=8.4 Hz, 1H), 7.06 (t, J=7.5 Hz, 1H), 4.14 (t, J=6.3 Hz, 2H), 3.35-3.29 (m, 2H), 3.07 (s, 9H), 1.81 (p, J=6.6 Hz, 2H), 1.76-1.66 (m, 2H), 1.51 (p, J=7.5 Hz, 2H), 1.34 (p, J=7.6 Hz, 2H). $^{13}$C NMR (126 MHz, DMSO-$d_6$) δ 189.22, 161.06, 136.57, 127.62, 124.14, 120.59, 113.54, 68.15, 65.13, 52.10, 39.52, 28.27, 25.50, 25.11, 22.04. High resolution ESI (m/z): [M]$^+$ calculated for: $C_{16}H_{26}NO_2$: 264.1958, found: 264.1958.

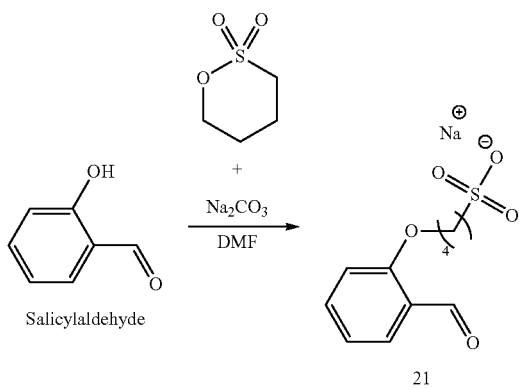

Sodium 4-(2-formylphenoxy)butane-1-sulfonate (21)

Starting from salicylaldehyde compound 21 was synthesized using an analogous procedure to that given for compound 18 (details above): Salicylaldehyde was reacted under basic conditions (sodium carbonate in N,N-dimethylformamide at 80° C.) with 1,4-butane sultone, and purified with reverse-phase chromatography (FIG. 10) on C18-derivatized silica eluting with acetonitrile:water (containing 0.1% trifluoroacetic acid), yielding 21 (1.8 g, 78%) as a yellow oil (material is deliquescent) after lyophilization. $^1$H NMR (500 MHz, DMSO-$d_6$) δ 10.39 (s, 1H), 7.68 (dd, J=7.7, 1.8 Hz, 1H), 7.67-7.62 (m, 1H), 7.24 (d, J=8.4 Hz, 1H), 7.06 (t, J=7.5 Hz, 1H), 4.14 (t, J=6.3 Hz, 2H), 2.60 (t, J=7.7 Hz, 2H), 1.87 (p, J=6.6 Hz, 2H), 1.77 (p, J=7.2, 6.6 Hz, 2H). $^{13}$C NMR (126 MHz, DMSO-$d_6$) δ 189.18, 161.14, 136.53, 127.54, 124.22, 120.57, 113.64, 68.12, 50.94, 39.52, 27.63, 21.60. High resolution ESI (m/z): [M]$^-$ calculated for: $C_{11}H_{13}O_5S$: 257.0489, found: 257.0491.

General Procedure for HWE Trimerization

To a scintillation vial equipped with a magnetic stir-bar was added bis(methylphosphonate) $A_2$ monomer 5, 8 or 12 (0.2 mmol) and functionalized benzaldehyde B terminators 19, 20 or 21 (0.4 mmol), followed by 0.9 mL of water and 1 mL of DMSO. The reaction mixture was rapidly stirred and sodium hydroxide (0.8 mmol) in 0.1 mL of water was quickly added. The color changes immediately from colorless to yellow (VF$_4$ derivatives) or orange (VBT and VF$_2$BT derivatives). The vial was capped and the mixture was stirred at room temperature for 24 hours. The fluorinated trimers tended to precipitate out of the reaction. After 24 hours the reaction mixtures were diluted with water and added to a dialysis membrane (molecular weight cutoff 1,000 Da). Only a small amount of color leached out of the bags, suggesting that the trimers, which have molecular weights <1,000 Da, may aggregate in solution, significantly reducing their rate of diffusion through the dialysis membrane. The zwitterionic and anionic trimers were dialyzed against pure water and the cationic trimers were dialyzed against water alternating with water containing sodium chloride (0.5 M) in order to exchange out the bromide and phosphonate counterions for chloride. The contents of the dialysis bags were lyophilized to obtain the trimers as brightly colored and fluffy solids, with yields typically ≥95%.

VBTSB was obtained as a bright orange solid. $^1$H NMR (500 MHz, DMSO-$d_6$) δ 8.39 (d, J=16.6 Hz, 2H), 7.91 (s, 2H), 7.79 (d, J=16.7 Hz, 2H), 7.76 (d, J=8.6 Hz, 2H), 7.31 (t, J=7.8 Hz, 2H), 7.09 (d, J=8.3 Hz, 2H), 7.02 (t, J=7.5 Hz, 2H), 4.11 (t, J=6.4 Hz, 4H), 3.44-3.35 (m, 4H), 3.30-3.24 (m, 4H), 2.99 (s, 12H), 2.46 (t, J=7.0 Hz, 4H), 1.97 (dt, J=14.6, 7.2 Hz, 4H), 1.89 (dt, J=13.6, 6.8 Hz, 4H), 1.77-1.69 (m, 4H), 1.65 (dt, J=13.7, 7.2 Hz, 4H), 1.43 (p, J=7.6 Hz, 4H). $^{13}$C NMR (126 MHz, TFE-$d_3$) δ 158.76, 155.59, 131.38, 129.84, 128.73, 128.48, 126.29, 114.70, 70.28, 66.91, 64.94, 61.50, 52.03, 48.82, 30.60, 27.44, 27.08, 24.13, 20.16. ESI (m/z): [M·Na]$^+$ calculated for: $C_{44}H_{62}N_4O_5S_3$: 893.362, found: 893.379; [M·2Na]$^{2+}$ calculated: 458.176, found: 458.188.

VF$_4$SB was obtained as a bright yellow solid. $^1$H NMR (500 MHz, DMSO-$d_6$) δ 7.75 (d, J=16.9 Hz, 2H), 7.71 (d, J=7.7 Hz, 2H), 7.35 (t, J=8.2 Hz, 2H), 7.25 (d, J=16.9 Hz, 2H), 7.10 (d, J=8.3 Hz, 2H), 7.01 (t, J=7.5 Hz, 2H), 4.08 (t, J=6.4 Hz, 4H), 3.44-3.36 (m, 4H), 3.30-3.21 (m, 4H), 3.00 (s, 12H), 2.46 (t, J=7.0 Hz, 4H), 2.04-1.90 (m, 4H), 1.83 (p, J=6.7 Hz, 4H), 1.71 (p, J=7.8 Hz, 4H), 1.55 (p, J=7.4 Hz, 4H), 1.38 (p, J=7.7 Hz, 4H). $^{13}$C NMR (126 MHz, TFE-$d_3$) δ 158.99, 148.10-145.43 (m), 134.12, 131.98, 128.92, 127.64, 122.80, 117.47-117.02 (m), 115.83, 114.42, 70.06, 67.04, 65.05, 52.12, 48.87, 30.59, 27.47, 27.29, 24.21, 20.23. ESI (m/z): [M·Na]$^+$ calculated for: $C_{44}H_{60}F_4N_2O_8S_2$: 907.362, found: 907.382; [M·2Na]$^{2+}$ calculated: 465.176, found: 465.192.

VF$_2$BTSB was obtained as a bright orange solid. $^1$H NMR (500 MHz, DMSO-$d_6$) δ 8.61 (d, J=16.7 Hz, 2H), 7.75 (d, J=6.9 Hz, 2H), 7.72 (d, J=16.7 Hz, 2H), 7.35 (t, J=7.7 Hz, 2H), 7.12 (d, J=8.3 Hz, 2H), 7.03 (t, J=7.5 Hz, 2H), 4.12 (t, J=6.3 Hz, 4H), 3.44-3.37 (m, 4H), 3.32-3.24 (m, 4H), 3.00 (s, 12H), 2.46 (t, J=7.0 Hz, 4H), 2.01-1.93 (m, 4H), 1.88 (p, J=6.6 Hz, 4H), 1.73 (td, J=11.4, 9.9, 5.8 Hz, 4H), 1.64 (p, J=7.6 Hz, 4H), 1.42 (p, J=7.6 Hz, 4H). $^{13}$C NMR (126 MHz, TFE-$d_3$) δ 159.07, 153.66-151.06 (m), 134.32, 131.75, 128.99, 127.92, 122.70, 118.21, 116.81, 114.37, 69.97, 66.90, 64.98, 52.01, 48.78, 30.61, 27.45, 27.11, 24.11, 20.13. ESI (m/z): [M·Na]$^+$ calculated for: $C_{44}H_{60}F_2N_4O_5S_3$: 929.343, found: 929.361; [M·2Na]$^{2+}$ calculated: 476.166, found: 476.179.

VBT+ was obtained as a bright orange solid. $^1$H NMR (500 MHz, DMSO-d$_6$) δ 8.38 (d, J=16.6 Hz, 2H), 7.90 (s, 2H), 7.79 (d, J=16.8 Hz, 2H), 7.76 (d, J=8.4 Hz, 2H), 7.31 (t, J=7.2 Hz, 2H), 7.09 (d, J=8.3 Hz, 2H), 7.02 (t, J=7.5 Hz, 2H), 4.12 (t, J=6.3 Hz, 4H), 3.35-3.31 (m, 4H), 3.06 (s, 18H), 1.89 (p, J=6.7 Hz, 4H), 1.73 (p, J=8.4 Hz, 4H), 1.65 (p, J=7.5 Hz, 4H), 1.42 (p, J=7.6 Hz, 4H). $^{13}$C NMR (126 MHz, DMSO-d$_6$) δ 156.44, 153.32, 129.60, 129.11, 128.16, 127.75, 126.80, 125.74, 124.84, 120.79, 112.62, 67.81, 65.18, 52.08, 39.52, 28.59, 25.66, 25.29, 22.18. ESI (m/z): [M]$^{2+}$ calculated for: $C_{40}H_{56}N_4O_2S$: 328.206, found: 328.234.

VF$_4$+ was obtained as a bright yellow solid. $^1$H NMR (500 MHz, DMSO-d$_6$) δ 7.75 (d, J=16.9 Hz, 2H), 7.70 (d, J=7.5 Hz, 2H), 7.35 (t, J=8.3 Hz, 2H), 7.24 (d, J=16.9 Hz, 2H), 7.10 (d, J=8.4 Hz, 2H), 7.01 (t, J=7.5 Hz, 2H), 4.08 (t, J=6.2 Hz, 4H), 3.35-3.30 (m, 4H), 3.07 (s, 18H), 1.83 (p, J=6.7 Hz, 4H), 1.72 (p, J=8.2 Hz, 4H), 1.55 (p, J=7.5 Hz, 4H), 1.37 (p, J=7.7 Hz, 4H). $^{13}$C NMR (126 MHz, DMSO-d$_6$) δ 156.56, 145.54-142.69 (m), 132.30, 130.62, 127.44, 124.45, 120.84, 115.13-114.83 (m), 113.82, 112.60, 67.77, 65.16, 52.06, 28.44, 25.47, 25.13, 22.06. ESI (m/z): [M]$^{2+}$ calculated for: $C_{40}H_{54}F_4N_2O_2$: 335.206, found: 335.231.

VF$_2$BT+ was obtained as a bright orange solid. $^1$H NMR (500 MHz, DMSO-d$_6$) δ 8.58 (d, J=16.7 Hz, 2H), 7.73 (d, J=8.0 Hz, 2H), 7.70 (d, J=16.8 Hz, 2H), 7.36 (t, J=7.4 Hz, 2H), 7.11 (d, J=8.3 Hz, 2H), 7.03 (t, J=7.5 Hz, 2H), 4.12 (t, J=6.3 Hz, 4H), 3.34-3.31 (m, 4H), 3.07 (s, 18H), 1.88 (p, J=6.3 Hz, 4H), 1.73 (p, J=8.3 Hz, 4H), 1.64 (p, J=7.6 Hz, 4H), 1.41 (p, J=7.7 Hz, 4H). $^{13}$C NMR (126 MHz, DMSO-d$_6$) δ 156.75, 151.37-148.55 (m), 132.55, 130.40, 127.32, 125.14, 120.89, 116.56, 114.76-114.52 (m), 112.66, 67.81, 65.17, 52.08, 28.59, 25.64, 25.27, 22.17. ESI (m/z): [M]$^{2+}$ calculated for: $C_{40}H_{54}F_4N_2O_2S$: 346.196, found: 346.223.

VBT− was obtained as a bright orange solid. $^1$H NMR (500 MHz, DMSO-d$_6$) δ 8.37 (d, J=12.7 Hz, 2H), 7.90 (s, 2H), 7.81-7.70 (m, 3H), 7.30 (t, J=7.6 Hz, 2H), 7.09 (d, J=8.3 Hz, 2H), 7.01 (t, J=7.5 Hz, 2H), 4.09 (t, J=6.0 Hz, 4H), 2.59 (t, J=7.3 Hz, 4H), 1.97-1.83 (m, 8H). $^{13}$C NMR (126 MHz, DMSO-d$_6$) δ 156.48, 153.20, 129.48, 128.98, 128.93, 127.85, 127.76, 127.65, 126.69, 126.64, 125.77, 124.77, 120.69, 112.60, 67.97, 51.20, 39.52, 28.19, 22.11. ESI (m/z): [M]$^{2-}$ calculated for: $C_{30}H_{30}N_2O_5S_3$: 321.059, found: 321.041.

VF$_4$− was obtained as a bright yellow solid. $^1$H NMR (500 MHz, DMSO-d$_6$) δ 7.74 (d, J=12.8 Hz, 2H), 7.70 (d, J=7.8 Hz, 2H), 7.33 (t, J=7.8 Hz, 1H), 7.23 (d, J=16.9 Hz, 2H), 7.09 (d, J=8.3 Hz, 2H), 6.99 (t, J=7.5 Hz, 2H), 4.06 (t, J=6.6 Hz, 4H), 2.54-2.50 (m, 4H), 1.88 (p, J=7.0 Hz, 4H), 1.76 (p, J=7.3, 6.9 Hz, 4H). $^{13}$C NMR (126 MHz, DMSO-d$_6$) δ 156.77, 151.28-148.37 (m), 132.27, 130.27, 127.13, 125.26, 120.76, 116.65-115.99 (m), 114.63, 112.62, 67.95, 51.12, 28.17, 21.98. ESI (m/z): [M]$^{2-}$ calculated for: $C_{30}H_{28}F_4O_5S_2$: 328.059, found: 328.052.

VF$_2$BT− was obtained as a bright orange solid. $^1$H NMR (500 MHz, DMSO-d$_6$) δ 8.62 (d, J=13.1 Hz, 2H), 7.75 (d, J=7.7 Hz, 2H), 7.68 (d, J=16.7 Hz, 1H), 7.34 (t, J=7.7 Hz, 2H), 7.11 (d, J=8.3 Hz, 2H), 7.02 (t, J=7.5 Hz, 2H), 4.09 (t, J=6.2 Hz, 4H), 2.57 (t, J=7.4 Hz, 4H), 1.97-1.83 (m, 8H). $^{13}$C NMR (126 MHz, DMSO-d$_6$) δ 156.77, 151.28-148.37 (m), 132.27, 130.27, 127.13, 125.26, 120.76, 116.49, 114.81-114.35 (m), 112.62, 67.95, 51.12, 28.17, 21.98. ESI (m/z): [M]$^{2-}$ calculated for: $C_{30}H_{28}F_2N_2O_5S_3$: 339.049, found: 339.046.

General Procedure for HWE Kinetics Experiments

To a scintillation vial equipped with a magnetic stir-bar was added bis(methylphosphonate) A$_2$ monomer 5, 8 or 12 (0.05 mmol) and functionalized benzaldehyde B terminators 19, 20 or 21 (0.1 mmol), followed by 0.75 mL of deuterium oxide. Sodium hydroxide (0.4 mmol) in 0.2 mL of D$_2$O was quickly added followed by transferring the homogenous contents of the vial to an NMR tube. A one scan $^{31}$P-NMR spectrum was recorded at pre-designated intervals for a total of 16-32 FID slices. Each slice was Fourier transformed and peaks integrated to determine the percent conversion over time.

II. Efficient Hole Extraction and High Performance Solar Cells

Materials

PVBT-SO$_3$ and C$_{60}$—N were synthesized according to literature. Pb(OAc)$_2$ was used as received from Sigma Aldrich. MAI was received from 1-Material. PC$_{61}$BM was purchased from Nano-C. All the solvents used in this work were purchased from Sigma Aldrich.

Photovoltaic Performance

Figure 56:
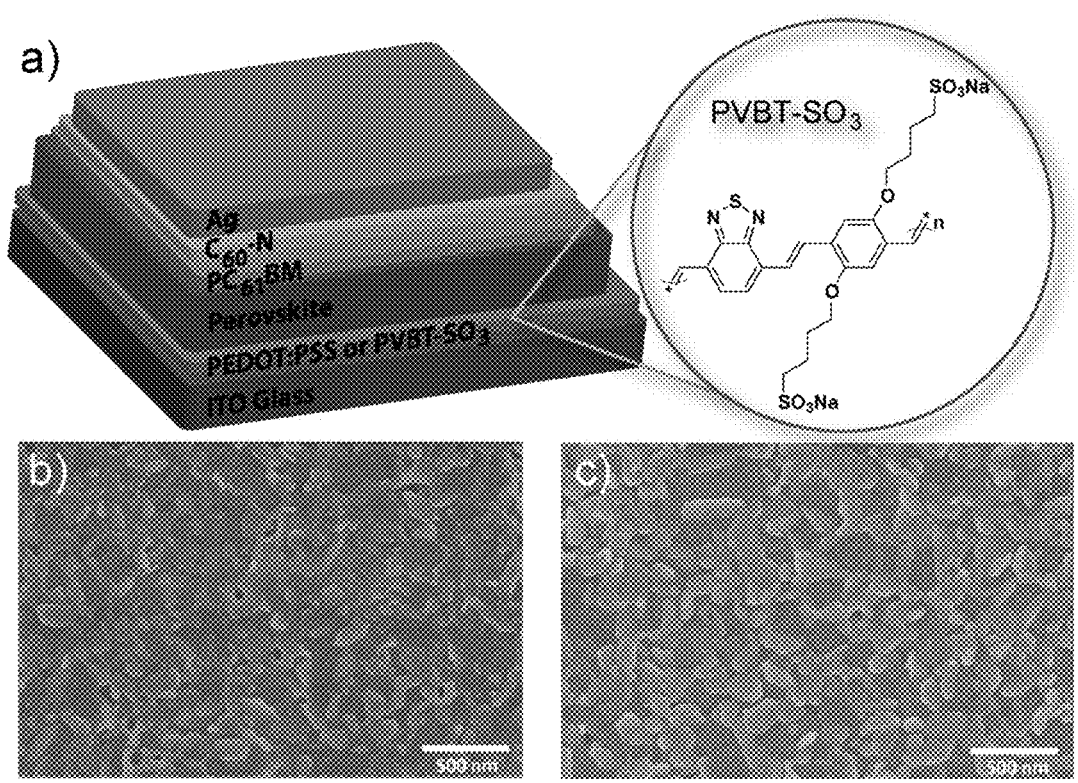
FIG. 56. (a) Device architecture and molecular structure for PVBT-SO$_3$; scanning electron microscopy (SEM) images of perovskite film on (b) ITO/PEDOT:PSS substrate and (c) ITO/PVBT-SO$_3$ substrate.
Figure 61:
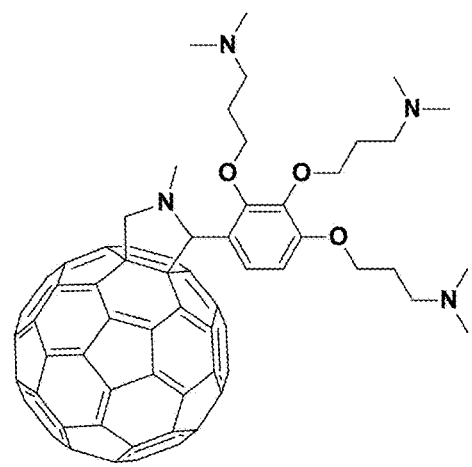
FIG. 61. Molecular structure of C$_{60}$—N.
Figure 62:
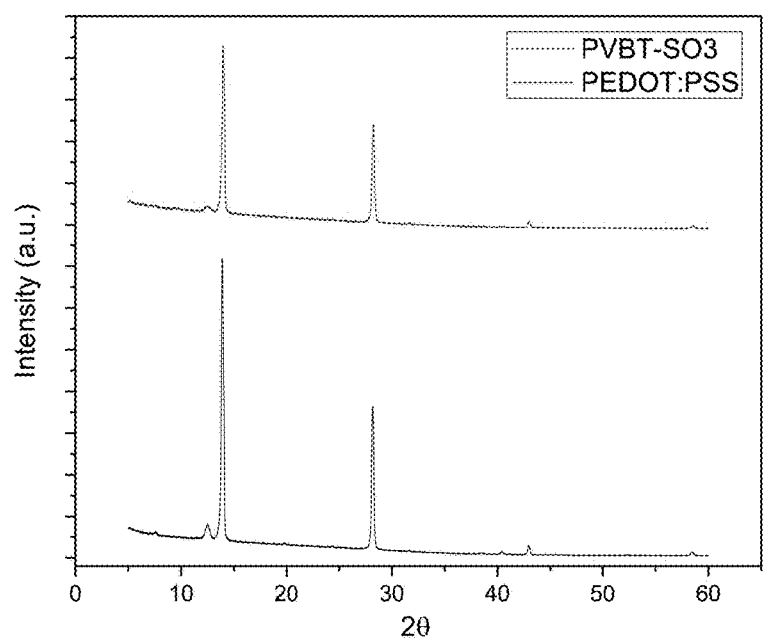
FIG. 62. X-ray diffraction of the perovskite films on PVBT-SO$_3$ and PEDOT:PSS.

Fullerene/perovskite planar heterojunction solar cells, shown in FIG. 56, were fabricated by a one-step deposition process starting from indium tin oxide (ITO) substrates (hole extracting electrode). PEDOT:PSS or PVBT-SO$_3$ (water solution) were spin-coated onto ITO to serve as HEL. The perovskite precursor (Pb(OAc)$_2$ and methylammonium iodide (MAI)) solution was spin-coated onto an ITO/HEL substrate, followed by mild thermal annealing (at 90° C. for 5 min) to form the photoactive layer. Shown in FIGS. 56b and 56c, the uniform and continuous perovskite films were formed on the ITO/HEL substrates, while ITO/PVBT-SO$_3$ substrate afforded larger (crystal size >~200 nm) and more pinhole-free polycrystalline perovskite films relative to those formed on ITO/PEDOT:PSS substrates. To facilitate selective electron extraction from perovskite, Phenyl-C$_{61}$-butyric acid methyl ester (PC$_{61}$BM) was then spin-coated onto the perovskite layer from chlorobenzene, followed by C$_{60}$—N (FIG. 61) (interface modification layer) spin-coated from 2,2,2-trifluoroethanol (TFE) and completing the devices with a thermally deposited silver (Ag) electrode (electron extracting electrode).

Figure 57:
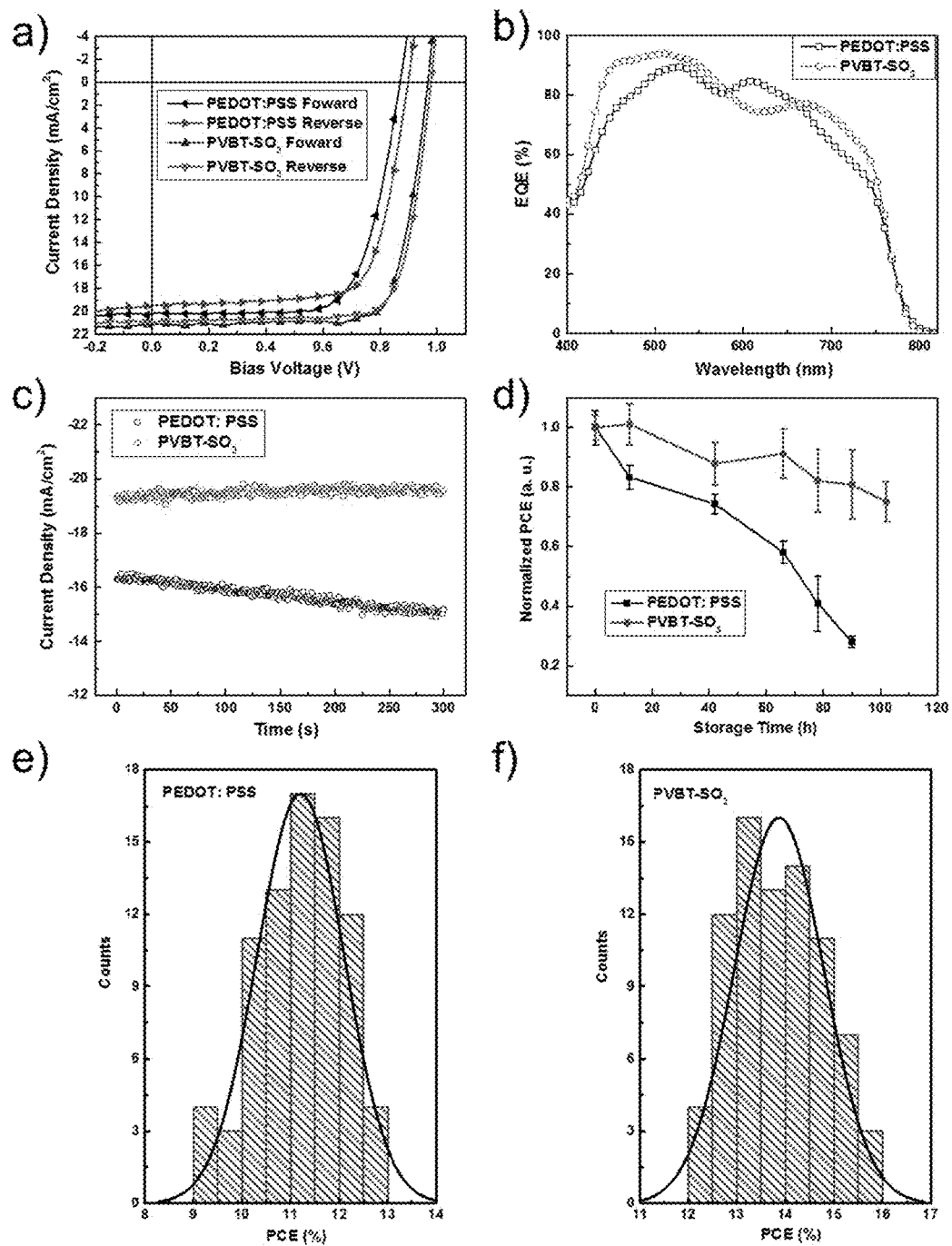
FIG. 57. (a) Current density (J)-voltage (V) curves of the devices based on PEDOT:PSS and PVBT-SO$_3$; (b) EQE profiles of the devices based on PEDOT:PSS and PVBT-SO$_3$; (c) steady-state measurement of the encapsulated devices held at the maximum power point (the PEDOT:PSS device was biased at 0.7 V and the PVBT-SO$_3$ device was biased at 0.8 V); (d) long term stability measurement of the unencapsulated devices (5 devices for each type) stored under ambient atmosphere with a relative humidity of 20%-30%; PCE histograms generated from 80 device measurements for (e) PEDOT:PSS and f) PVBT-SO$_3$ based devices.
Figure 63:
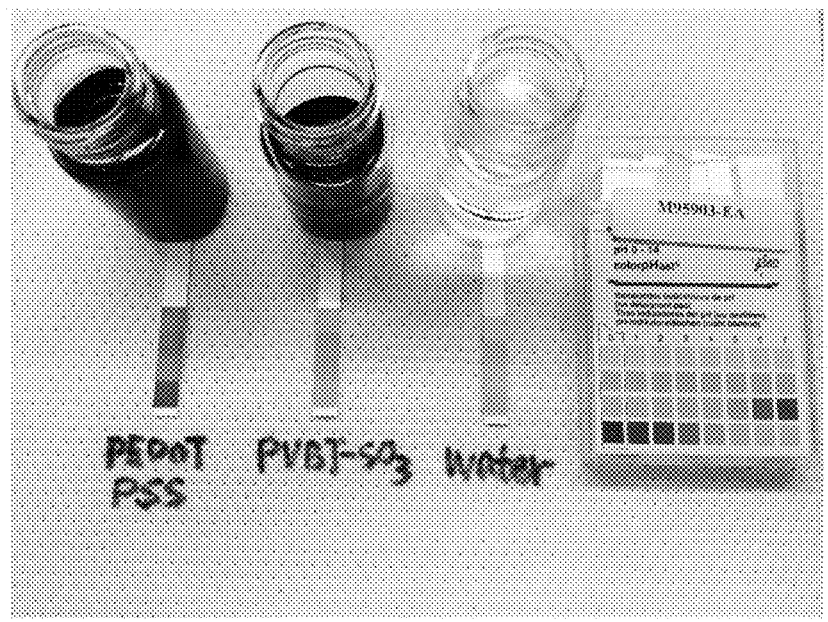
FIG. 63. A comparison of PH value between PVBT-SO$_3$ and PEDOT:PSS.
Figure 64:
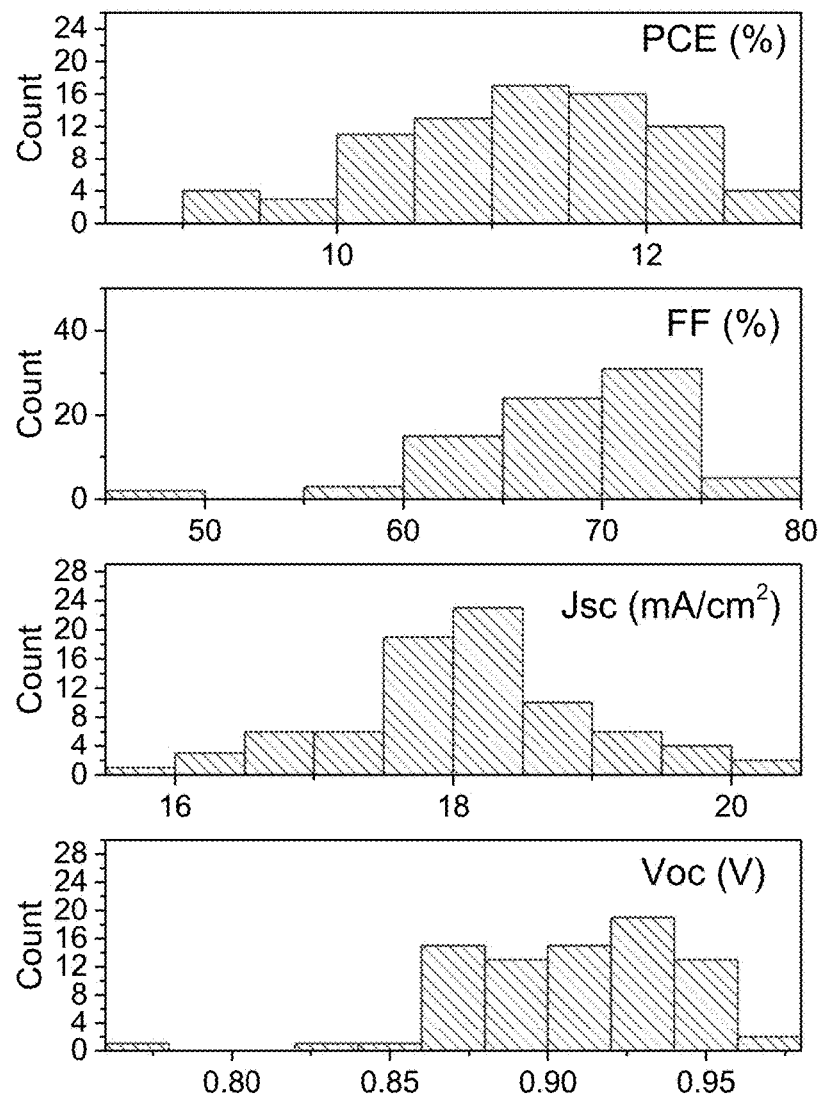
FIG. 64. Devices parameter histograms generated from 80 device measurements for PEDOT:PSS based devices.
Figure 65:
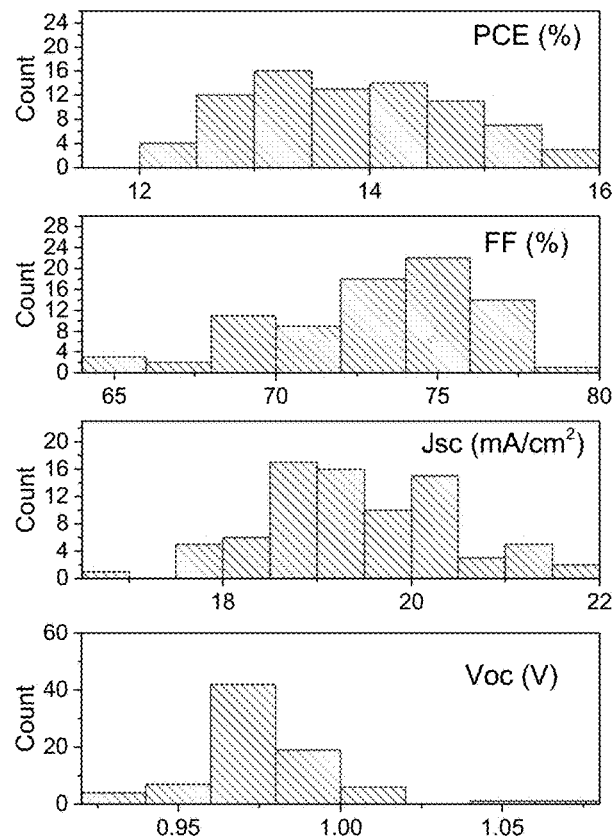
FIG. 65. Devices parameter histograms generated from 80 device measurements for PVBT-SO$_3$ based devices.

As shown in FIG. 57a, the devices based on PEDOT:PSS HEL gave a maximum PCE of 12.6% with an open circuit voltage (V$_{OC}$) of 0.89 V, a short circuit current density (J$_{SC}$) of 19.6 mA/cm$^2$, and a fill factor (FF) of 72.0%. The efficiency achieved in this work by using PEDOT:PSS is comparable to that reported by Bolink and co-workers through the same perovskite precursor (Pb(OAc)$_2$ and MAI) and mild thermal treatment (at 90° C. for 5 min). (Forgacs, et al. *Journal of Materials Chemistry A* 2015, 3, 14121) Utilizing PVBT-SO$_3$ as HEL afforded a maximum PCE of 15.9% with a V$_{OC}$ of 0.97 V, a J$_{SC}$ of 21.2 mA/cm$^2$, and a FF of 77.4%. Thus, the PCEs achieved by the as spun PVBT-SO$_3$ layer are 26% higher than that of the device based on PEDOT:PSS (where the HEL required thermal treatment at 150° C. for 30 min), which highlights the advantages of PVBT-SO$_3$ instead of PEDOT:PSS as HEL in inverted perovskite devices. Notably, the PVBT-SO$_3$ based devices show significantly less hysteresis than the PEDOT:PSS based devices. External quantum efficiency (EQE) shown in FIG. 57b confirms the improved J$_{SC}$ of the devices by using PVBT-SO$_3$ as the HEL. To investigate the light-soaking stability of the devices, steady-state measurements were performed for two champion devices containing either PEDOT:PSSS or PVBT-SO$_3$ (FIG. 57c). Under simulated AM 1.5G irradiation (100 mW/cm$^2$) and bias voltage at the maximum power point, the PVBT-SO$_3$ based device showed a more stable output current than that of the PEDOT:PSS based device, with the latter showing a diminishing current over time. Long-term air stability investigations were performed by storing 5 separate devices for each type in the absence of light (FIG. 57d). The devices were brought back into the glovebox for testing each time. During the first ~40 hours the PEDOT:PSS based devices degrade slightly faster than PVBT-SO$_3$ based devices. However, after ~40 hour, the PEDOT:PSS based devices show an increased degradation rate and the average PCE drops more than 70% after ~90 hours of storage, while the PVBT-SO$_3$ based devices only drops ~20% in the same time scale. Since the acidic nature of PEDOT:PSS is detrimental to long term device performance and stability, the pH-neutral property of PVBT-SO$_3$ may afford the improved device stability to some extent (FIG. 63). (Choi, et al. *Nat. Commun.* 2015, 6.) To express the reproducibility, 80 devices of each type were fabricated and tested, as shown in FIG. 57e and FIG. 57f. PEDOT:PSS based devices afforded an average PCE of ~11%, while PVBT-SO$_3$ based devices gave an average PCE of ~14%, which shows a reliable device performance improvement when using PVBT-SO$_3$ as HEL.

Electrochemical Impedance Spectroscopy (EIS) Measurement

Figure 58:
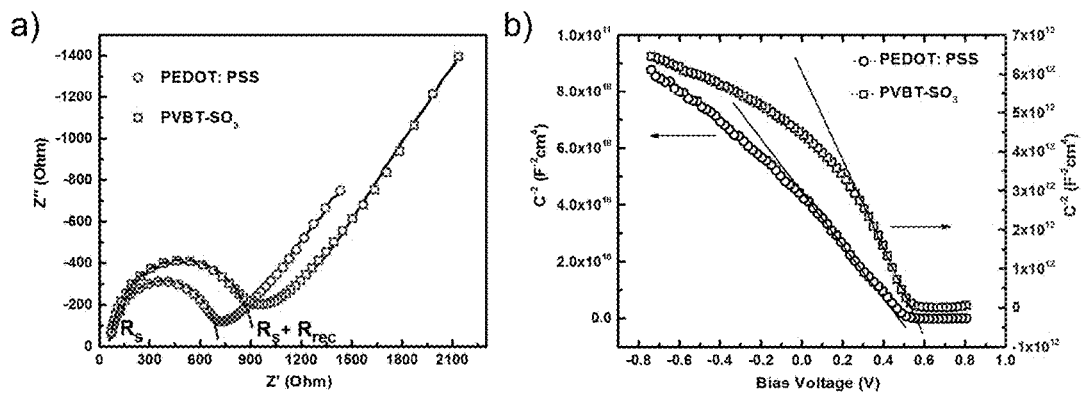
FIG. 58. (a) Nyquist plot of each type device (Dashed lines represent the recombination semicircle); (b) Mott-Schottky plot of each type device measured at 10 kHz probe frequency.

EIS measurements were performed to understand the recombination losses and charge transport properties in the devices with different HELs. In the EIS measurement, a small AC voltage (20 mV) is applied to measure device impedance as a function of frequency ($\omega$), sweeping from 100 Hz to 1 MHz under simulated AM 1.5G irradiation (100 mW/cm$^2$) inside a nitrogen filled glovebox. As shown in FIG. 58a, the Nyquist plot for each type device exhibits two semicircles associated with different time constants ($\tau$), representing two distinct charge transport regimes. The semicircle closest to the origin, associated with the higher frequency spectrum, is attributed predominantly to impedance arising from the electronic transport and recombination kinetics. The second semicircle, associated with the low frequency spectrum, is attributed to the impedance arising from the slow relaxation/diffusion of ions. (Bag, et al. *J. Am. Chem. Soc.* 2015, 137, 13130; Liu, et al. *Adv. Energy Mater.* 2015, 10.1002/aenm.201501606n/a.) At 0 V applied DC bias, the first semicircle (high frequency region) of the Nyquist plot is associated with the recombination resistance ($R_{rec}$). The PVBT-SO$_3$ based devices show higher $R_{rec}$ values compared to PEDOT:PSS based devices, as shown in FIG. 58a, which corresponds to a reduced recombination loss and correlates with the superior device performances for PVBT-SO$_3$. Shown in FIG. 58b are Mott-Schottky (MS) plots for each type of device obtained by EIS characterization. The interfacial charge density is inversely proportional to the slope of the MS plot assuming an equivalent dielectric constant for both devices. A steeper slope was found for PVBT-SO$_3$ based devices (−1.0×10$^{13}$) relative to PEDOT:PSS based devices (−9.4×10$^{10}$), indicating a lower of over two magnitude order interfacial charge density in PVBT-SO$_3$ based devices and thus more efficient charge extraction for PVBT-SO$_3$. Therefore, PVBT-SO$_3$ acts as a more efficient HEL material compared with PEDOT:PSS due to reduced recombination losses and interfacial charge density of the devices.

Kelvin Probe Force Microscopy (KPFM) Characterization

Figure 59:
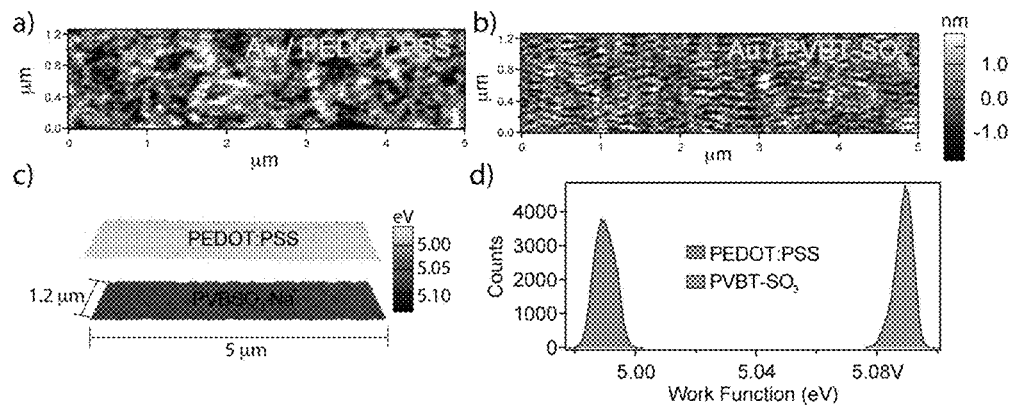
FIG. 59. Tapping mode AFM height images for a) PEDOT:PSS and b) PVBT-SO3 on Au substrates. c) Color work function maps overlaid on height AFM images, and d) counts vs work function distributions.

KPFM was used to determine the work function (W) of different architectures with PEDOT:PSS or PVBT-SO$_3$ (FIG. 59). The relationship: $q \cdot V_{CPD}=(W_{probe}-W_{sample})$ was used to calculate W from measured contact potential differences between the sample and the probe ($V_{CPD}$). HELs were spin coated onto Au coated silicon substrates and KPFM was measured. Tapping mode AFM images for PEDOT:PSS and PVBT-SO$_3$ are shown in FIGS. 59a and 59b respectively. Color maps or work function, overlaid on height images, for PEDOT:PSS and PVBT-SO$_3$ are shown in FIG. 59c. FIG. 59d shows the corresponding counts versus work function distributions for the two HELs. The measured W for PEDOT:PSS was 4.99 eV±13.28 meV, while for PVBT-SO$_3$ was 5.09 eV t 6.51 meV. This ~0.1 eV increase in W for PVBT-SO$_3$ compared to PEDOT:PSS can afford devices based on PVBT-SO$_3$ possessing larger build-in potential ($V_{bi}$), which is critical for solar cell devices showing higher $V_{oc}$, $J_{sc}$ and FF.

Photoluminescence (PL) Measurements

Figure 60:
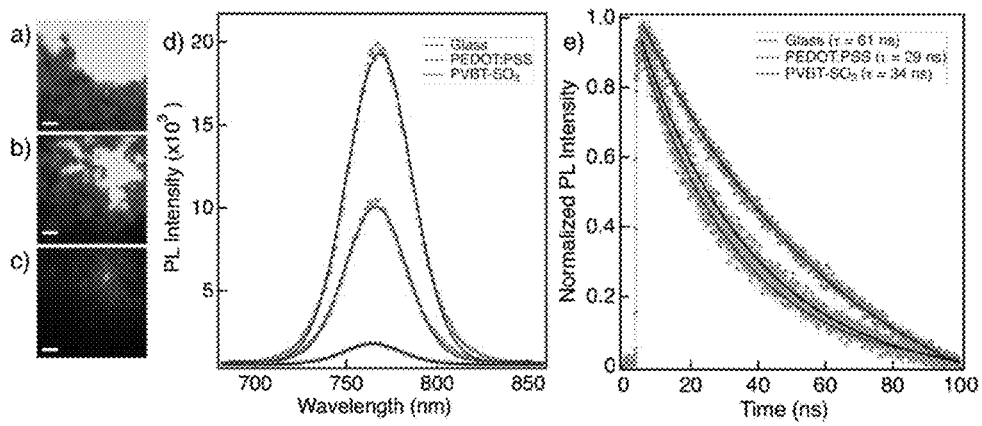
FIG. 60. Photoluminescence (PL) and time-resolved photoluminescence (TRPL) for (a) Glass/Perovskite, (b) Glass/PEDOT:PSS/Perovskite, and (c) Glass/PVBT-SO$_3$/Perovskite; scale bar represents 300 nm. (d) PL spectra showing quenching effects for the three films (e) TRPL decay lifetimes.

Time-resolved photoluminescence measurements were performed on the different perovskite/HEL samples to assess the efficiency of charge-separation in the PVBT-SO$_3$ interlayer vs. PEDOT:PSS sample. FIG. 60 a-c shows PL images obtained from (a) glass/perovksite, (b) glass/PEDOT:PSS/Perovskite, and (c) glass/PVBT-SO$_3$/Perovskite. The three images show the similar polycrystalline structure of the luminescent perovskite film, but the PL is strongly quenched in the presence of PVBT-SO$_3$ interlayer. This effect is more evident in FIG. 60d that shows that the perovskite spectra are similar for the different samples but only ~1/20 the PL intensity. Detailed analysis of the spectra show a slight blue shift of ~4 nm in the PL maximum of the PVBT-SO$_3$/Perovskite film sample relative to the glass, and PEDOT:PSS HELs (which are superimposable). FIG. 60e shows representative photoluminescence decay traces from the three different perovskite samples. Interestingly, the presence of the HEL perturbs the fluorescence decay rate only slightly; approximate single-exponential fits to the PL decay provides decay constants of 0.034 and 0.029 ns$^{-1}$ for the PEDOT:PSS and PVBT-SO$_3$ interlayers respectively. This appears as compelling evidence that the PVBT-SO$_3$ interlayer acts as an efficient charge extractor, reducing the perovskite PL intensity by efficient extraction of holes into the interlayer. This may also account for the slight blue shift in the luminescence by a small excess of negative charge carriers in the perovskite layer.

Device Fabrication

The ITO-coated glass substrates (20±5 ohms/square) were obtained from Thin Film Devices Inc., and were cleaned through ultrasonic treatment in detergent, deionized water, acetone, and isopropyl alcohol and then dried in an oven for 6 hours. PEDOT:PSS (H.C. Starck, I 4083) was spin-coated on pre-cleaned ITO substrates at 3500 rpm for 40 s and annealed at 150° C. for 30 min. PVBT-SO$_3$ water solution (2 mg/mL) was spin-coated onto pre-cleaned ITO substrates at 4000 rpm for 40 s without any posttreatment. The film thicknesses of PEDOT:PSS and PVBT-SO$_3$ are ~30 nm and ~10 nm as confirmed by the profilometer. The perovskite layer was formed by spin-coating a solution of Pb(OAc)$_2$ and MAI (1:3 molar ratio) in N,N-dimethylformamide (DMF) onto the HEL/ITO substrates at a spin-speed of 2000 rpm for 60 s inside a glove box (N$_2$ atmosphere, <1 ppm O$_2$, <1 ppm H$_2$O). As-cast films were then annealed in dark at 90° C. for 5 min in glove box. A thin layer of PC$_6$BM (60-70 nm) as electron transport layer was then spin-coated inside a glove box (N$_2$ atmosphere, <1 ppm 02, <1 ppm H$_2$O) from a solution in chlorobenzene (20 mg/mL) at 1000 rpm for 60 s. $C_{60}$—N in TFE (3 mg/mL) was spin-coated onto $PC_{61}BM$ surface with a thickness of ~10 nm. Finally, 100 nm Ag electrode was deposited (area 6 mm$^2$ defined by metal shadow mask) on the active layer under high vacuum ($1 \times 10^{-6}$ mbar) using a thermal evaporator.

Device Characterization

Current-voltage (I-V) characteristics were measured in a $N_2$ atmosphere (unless otherwise stated) using a Keithley 2400 source-meter under simulated AM 1.5G irradiation using a 300 W Xe lamp solar simulator (Newport 91160). The light intensity was adjusted with an NREL-calibrated Si reference solar cell and KG-5 filter. The illuminated area (0.055 cm$^2$) was defined by a metal photomask with an aperture and used in all reported PCE measurements. The QE-PV-SI Measurement Kit (Newport/Oriel Instruments) with 150 W Xe arc lamp, monochromator, and calibrated silicon reference cell with power meter, are used for Quantum efficiency (QE)/Incident Photon to Charge Carrier Efficiency (IPCE) measurement for solar cells over a 400-1100 nm spectral range. EIS was measured using an Agilent 4294A Precision Impedance Analyzer under 100 mWcm$^{-2}$ light intensity at 20 mV applied AC amplitude. DC bias voltage was kept at 0 V. Frequency was swept from 100 Hz to 1 MHz.

KPFM Measurement

Samples for KPFM were prepared on gold (Au) or ITO substrates. The preparation of each layer is exactly the same as that in device fabrication. KPFM measurements were made in air using an Asylum Research MFP3D-stand-alone AFM. The probes (ANSCM-PT) used were Pt/Ir coated (~25 nm) Si probes with a spring constant of 1-5 N/m as supplied from AppNano. Scans were typically 2.5 µm×0.625 µm (512 pixel×128 pixel) at a scan speed of 0.5 Hz. The nap mode lift height ($\Delta H$) was 30 nm for all scans. The Au or ITO was grounded for all measurements. Work function calibration was done using Au coated on $SiO_2$ substrates, and assuming the work function of gold is 5.1 eV. Analysis of potential maps was done in the Asylum Research MFP3D software in Igor Pro.

PL Measurements

PL spectra were obtained using 405 nm pulsed excitation and collection through a 1.4 N.A. oil objective and long pass filter (405 nm), and focusing the PL on the entrance slit of an ACTON 3160a imaging spectrograph. Time-resolved PL was taken with 405 nm pulsed excitation, and imaging onto an avalanche photodiode (ID Quantique ID 100) and routed into a PicoQuant TimeHarp 300 time-to-digital converter (~50 ps FWHM instrument response function). Samples were prepared on clean glass coverslips for optical interrogation, with careful attention to uniform film thickness between the different samples, as verified by atomic force microscopy on masked samples. The thicknesses of PVBT-$SO_3$ layer, PEDOT:PSS layer, and perovskite layer are ~10 nm, ~30 nm, and ~220 nm as measured by profile meter.

Applicant's disclosure is described herein in preferred embodiments with reference to the Figures, in which like numbers represent the same or similar elements. Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

The described features, structures, or characteristics of Applicant's disclosure may be combined in any suitable manner in one or more embodiments. In the description herein, numerous specific details are recited to provide a thorough understanding of embodiments of the invention. One skilled in the relevant art will recognize, however, that Applicant's composition and/or method may be practiced without one or more of the specific details, or with other methods, components, materials, and so forth. In other instances, well-known structures, materials, or operations are not shown or described in detail to avoid obscuring aspects of the disclosure.

In this specification and the appended claims, the singular forms "a," "an," and "the" include plural reference, unless the context clearly dictates otherwise.

Unless defined otherwise, all technical and scientific terms used herein have the same meaning as commonly understood by one of ordinary skill in the art. Although any methods and materials similar or equivalent to those described herein can also be used in the practice or testing of the present disclosure, the preferred methods and materials are now described. Methods recited herein may be carried out in any order that is logically possible, in addition to a particular order disclosed.

INCORPORATION BY REFERENCE

References and citations to other documents, such as patents, patent applications, patent publications, journals, books, papers, web contents, have been made in this disclosure. All such documents are hereby incorporated herein by reference in their entirety for all purposes. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

EQUIVALENTS

The representative examples are intended to help illustrate the invention, and are not intended to, nor should they be construed to, limit the scope of the invention. Indeed, various modifications of the invention and many further embodiments thereof, in addition to those shown and described herein, will become apparent to those skilled in the art from the full contents of this document, including the examples and the references to the scientific and patent literature included herein. The examples contain important additional information, exemplification and guidance that can be adapted to the practice of this invention in its various embodiments and equivalents thereof.

What is claimed is:
1. A polymer comprising the structural formula:

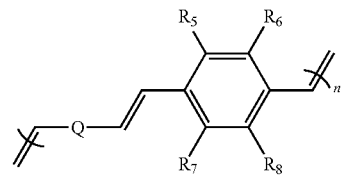

wherein Q is:

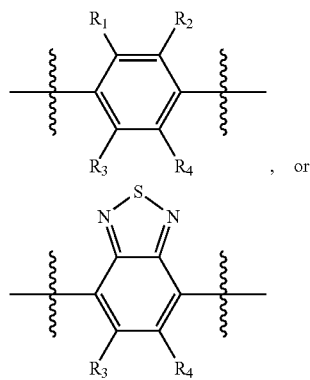

, or wherein
each $R_1$, $R_2$, $R_3$ and $R_4$ is independently H or an electron-withdrawing group; provided that at least two of $R_1$, $R_2$, $R_3$ and $R_4$ are electron-withdrawing groups;
each of $R_5$, $R_6$, $R_7$ and $R_8$ is independently selected from H, —R, —OR and —SR, provided at least two of $R_5$, $R_6$, $R_7$ and $R_8$ are selected from —R, —OR and —SR, wherein R comprises a group selected from cationic moiety, anionic moiety, zwitterionic moiety and a neutral moiety comprising a moiety selected from ethylene oxide and ethyleneglycol groups; and
n is an integer from 2 to 4,000.

2. The polymer of claim 1, wherein each electron-withdrawing group is selected from F, carboxylic acid, ester, amide, cyano (CN), trifluoromethyl ($CF_3$), and nitro ($NO_2$).

3. The polymer of claim 2, wherein each electron-withdrawing group is F.

4. The polymer of claim 1, wherein Q is:

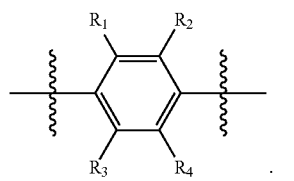

5. The polymer of claim 4, wherein each of $R_1$, $R_2$, $R_3$ and $R_4$ is F.

6. The polymer of claim 1, wherein Q is:

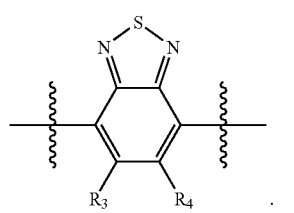

7. The polymer of claim 6, wherein each of $R_3$ and $R_4$ is F.

8. The polymer of claim 1, wherein each of $R_5$ and $R_8$ is H and each of $R_6$ and $R_7$ is selected from —R, —OR and —SR.

9. The polymer of claim 8, wherein R is selected from:

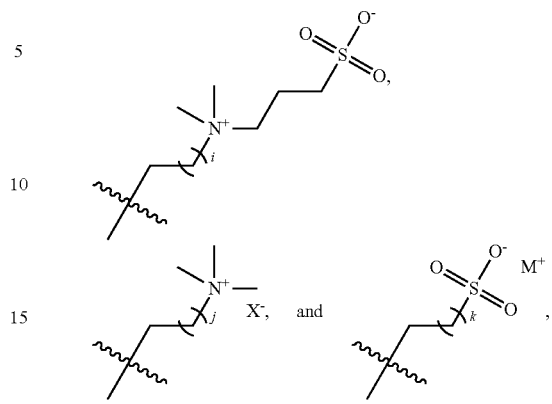

wherein each of i, j, and k is independently an integer from about 1 to about 20, $X^-$ is an anionic counter ion and $M^+$ is a cationic counter ion.

10. The polymer of claim 1, wherein the structural unit has the formula:

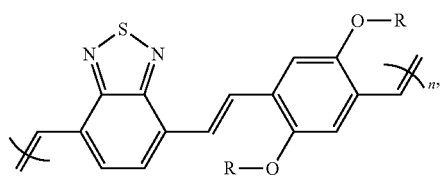

wherein R is selected from

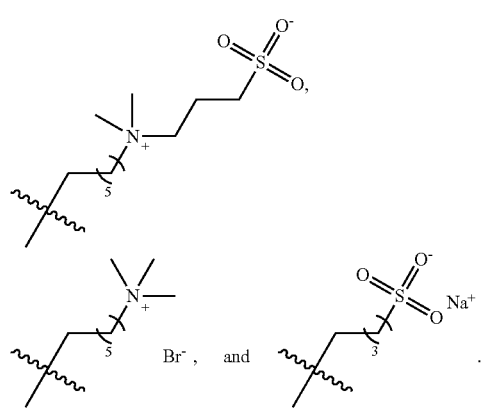

11. The polymer of claim 1, wherein the structural unit has the formula:

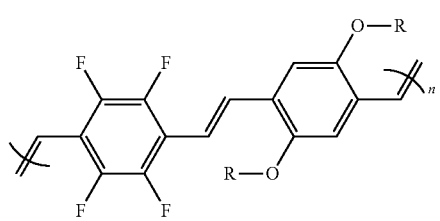

wherein R is selected from

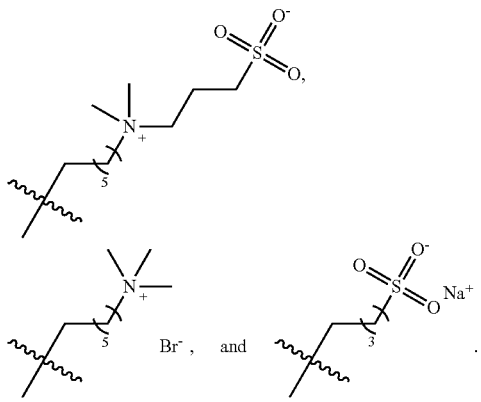

12. The polymer of claim 1, wherein the structural unit has the formula:

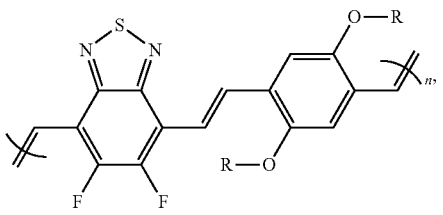

wherein R is selected from

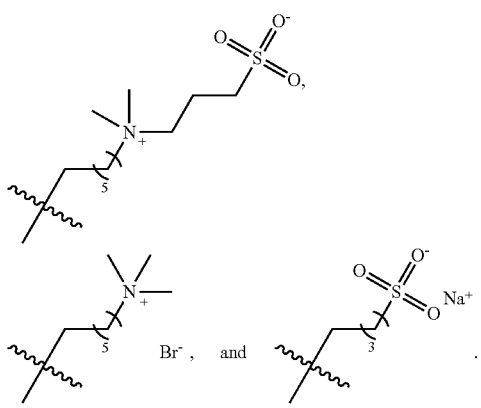

13. The polymer of claim 1, wherein R comprises a zwitterionic moiety.

14. The polymer of claim 13, wherein R further comprises one or more of a cationic moiety, an anionic moiety and a neutral moiety.

15. A polymerization method, comprising:
reacting a first monomer of the formula

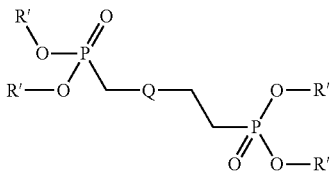

with a second monomer of the formula

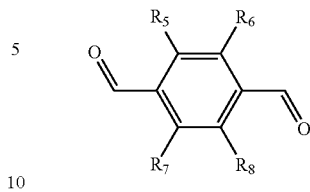

wherein
each R' is independently a $C_1$-$C_3$ alkyl group;
Q is:

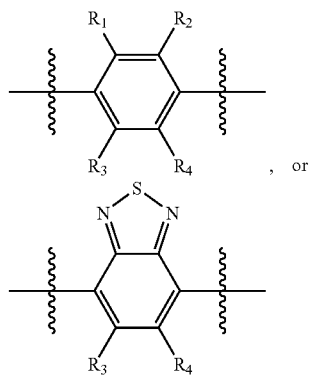

wherein
each $R_1$, $R_2$, $R_3$ and $R_4$ is independently H or an electron-withdrawing group; provided that at least two of $R_1$, $R_2$, $R_3$ and $R_4$ are electron-withdrawing groups; and
each of $R_5$, $R_6$, $R_7$ and $R_8$ is independently selected from H, —R, —OR and —SR, provided at least two of $R_5$, $R_6$, $R_7$ and $R_8$ are selected from —R, —OR and —SR, wherein R comprises a group selected from cationic moiety, anionic moiety, zwitterionic moiety and a neutral moiety comprising a moiety selected from ethylene oxide and ethyleneglycol groups.

16. The polymer of claim 1, having a molecular weight from about 1 kDa to about 2,000 kDa.

17. A material comprising a polymer of claim 1.

18. An article of manufacture comprising a polymer of claim 1, wherein the article is a solar cell.

19. The article of claim 18, wherein the solar cell is an inverted Perovskite solar cell.

20. An inverted Perovskite solar cell comprising a hole-extraction layer, wherein the hole-extraction layer comprises a polymer or is prepared from a polymer of the structural formula:

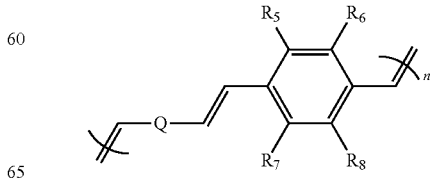

wherein Q is:

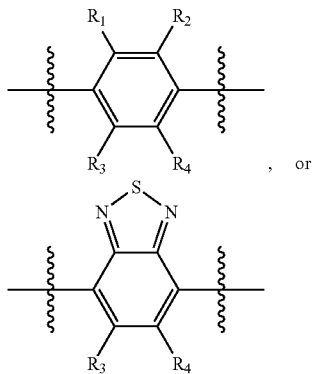, or wherein
each $R_1$, $R_2$, $R_3$ and $R_4$ is independently H or an electron-withdrawing group; provided that at least two of $R_1$, $R_2$, $R_3$ and $R_4$ are electron-withdrawing groups;
each of $R_5$, $R_6$, $R_7$ and $R_8$ is independently selected from H, —R, —OR and —SR, provided at least two of $R_5$, $R_6$, $R_7$ and $R_8$ are selected from —R, —OR and —SR, wherein R comprises a group selected from cationic moiety, anionic moiety, zwitterionic moiety and a neutral moiety comprising a moiety selected from ethylene oxide and ethyleneglycol groups; and
n is an integer from 2 to 4,000.

* * * * *